United States Patent
Kim et al.

(10) Patent No.: US 10,484,134 B2
(45) Date of Patent: Nov. 19, 2019

(54) APPARATUS AND METHOD FOR CHANNEL ENCODING/DECODING IN COMMUNICATION OR BROADCASTING SYSTEM

(71) Applicant: Samsung Electronics Co., Ltd., Suwon-si, Gyeonggi-do (KR)

(72) Inventors: Kyungjoong Kim, Suwon-si (KR); Seho Myung, Seoul (KR); Seokki Ahn, Suwon-si (KR); Hongsil Jeong, Suwon-si (KR); Min Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 7 days.

(21) Appl. No.: 15/941,559

(22) Filed: Mar. 30, 2018

(65) Prior Publication Data

US 2018/0287737 A1   Oct. 4, 2018

(30) Foreign Application Priority Data

Mar. 30, 2017 (KR) .................. 10-2017-0041138
May 4, 2017 (KR) .................. 10-2017-0057066
(Continued)

(51) Int. Cl.
*H04L 1/00* (2006.01)
*H03M 13/11* (2006.01)
(Continued)

(52) U.S. Cl.
CPC ....... *H04L 1/0058* (2013.01); *H03M 13/1102* (2013.01); *H03M 13/616* (2013.01);
(Continued)

(58) Field of Classification Search
CPC .................................................. H03M 13/11
(Continued)

(56) References Cited

U.S. PATENT DOCUMENTS

| | | | | |
|---|---|---|---|---|
| 7,230,978 B2* | 6/2007 | Bitterlich | ........... | H03M 13/6511 |
| | | | | 375/219 |
| 7,600,174 B2* | 10/2009 | Kyung | ............... | H03M 13/1134 |
| | | | | 714/758 |
| 2007/0038914 A1 | 2/2007 | Bickerstaff et al. | | |

FOREIGN PATENT DOCUMENTS

| | | |
|---|---|---|
| CN | 102185615 A | 9/2011 |
| KR | 10-2008-0035585 A | 4/2008 |

OTHER PUBLICATIONS

Sangmin Kim et al., 'Flexible LDPC decoder architecture for high-throughput applications', APCCAS 2008-2008 IEEE Asia Pacific Conference on Circuits and Systems, Macao, pp. 45-48, 2008 (https://ieeexplore.ieee.org/document/4745956/) See pp. 45-47.
Vikram Arkalgud Chandrasetty et al., 'A Highly Flexible LDPC Decoder using Hierarchical Quasi-Cyclic Matrix with Layered Permutation', Journal of Networks, vol. 7, No. 3, pp. 441-449, Mar. 2012 (https://www.semanticscholar.org/paper/A-Highly-Flexible-LDPC-Decoder-using-HierarchicalChandrasettyAziz/0e6f80b99f4de31c79459157018eb15bf710ccdd?tab=.

(Continued)

*Primary Examiner* — Fritz Alphonse
(74) *Attorney, Agent, or Firm* — Jefferson IP Law, LLP

(57) ABSTRACT

A method for channel encoding in a communication or broadcasting system is provided. The method includes determining a block size Z, and performing encoding based on the block size and a first matrix corresponding to the block size, wherein the first matrix is determined based on information and a plurality of second matrices, and wherein a part of a column index indicating a position of a non-zero element in each row of the information includes an index according to mathematical expression 22 above.

8 Claims, 85 Drawing Sheets

(30) Foreign Application Priority Data

| Jun. 5, 2017 | (KR) | ......................... 10-2017-0069480 |
| Jun. 9, 2017 | (KR) | ......................... 10-2017-0072810 |
| Jun. 10, 2017 | (KR) | ......................... 10-2017-0072821 |
| Jun. 12, 2017 | (KR) | ......................... 10-2017-0073157 |

(51) Int. Cl.
    *H03M 13/00*      (2006.01)
    *H04W 84/04*      (2009.01)

(52) U.S. Cl.
    CPC .......... *H04L 1/0041* (2013.01); *H04L 1/0045* (2013.01); *H04W 84/042* (2013.01)

(58) Field of Classification Search
    USPC ........................................ 714/758, 760, 757
    See application file for complete search history.

(56) References Cited

OTHER PUBLICATIONS

Marjan Karkooti et al., 'Configurable, High Throughput, Irregular LDPC Decoder Architecture: Tradeoff Analysis and Implementation', IEEE 17th International Conference on Application-specific Systems, Architectures and Processors (ASAP'06), Steamboat Springs, CO, pp. 360-367, 2006 (https://ieeexplore.ieee.org/document/4019541/) See section 2.

International Search Report dated Jul. 12, 2018 issued in International Application No. PCT/KR2018/003808.

\* cited by examiner

FIG. 4B

| 112 |     | 67  |     | 5   | 114 |     | 95  |     | 46  |     | 18  | 80  |     |     |     | 14  |     | 52  |     | 30  | 29  |     | 24  |
| 86  | 57  |     | 34  | 44  |     |     | 38  | 127 | 8   | 94  |     | 82  | 7   | 38  |     |     | 72  | 2   |     | 100 |     | 92  |     |
|     | 53  | 57  |     |     | 99  | 125 |     | 73  |     | 97  | 6   | 56  |     | 104 |     |     |     | 7   | 111 |     | 72  | 23  |     |
| 92  | 11  |     | 115 | 39  | 38  |     | 111 | 61  |     |     |     | 7   |     | 62  |     | 42  | 9   | 80  |     | 96  |     |     | 103 |
| 19  | 81  | 95  |     | 105 |     | 116 |     | 115 | 109 | 20  | 55  |     |     | 104 | 28  | 107 |     |     |     | 110 | 48  |     |     |
| 85  | 45  | 13  |     | 88  |     |     | 120 |     | 18  |     |     | 120 |     |     |     | 72  | 67  | 88  |     | 68  |     | 5   | 58  |
| 38  | 23  |     |     |     |     |     |     |     |     |     |     | 4   |     |     | 33  |     |     |     |     |     | 80  |     |     |
|     | 47  | 22  |     | 27  |     |     |     |     | 101 | 93  |     | 25  |     |     |     | 40  |     |     | 40  |     |     |     |     |
| 48  |     |     |     |     |     | 92  |     |     |     |     |     |     |     | 0   |     |     | 77  |     |     |     |     | 107 |     |
| 84  | 41  |     |     | 47  |     |     | 104 |     |     |     |     | 72  |     |     |     |     |     | 81  |     | 125 |     |     | 94  |
| 112 | 42  |     | 108 |     |     |     |     |     |     |     |     |     |     |     |     |     |     |     |     |     |     |     |     |
|     | 28  |     |     |     | 113 |     |     |     |     |     |     | 58  |     | 100 |     |     |     | 56  |     |     | 19  |     |     |
| 28  | 10  | 110 |     |     |     | 108 |     |     |     |     |     | 8   |     |     |     |     |     | 23  |     |     |     |     |     |
| 96  | 59  |     |     |     |     |     |     |     |     |     |     | 82  | 27  |     | 71  |     | 32  | 64  |     |     |     | 24  | 70  |

FIG. 4C

| 28 |     | 54  | 22  |     | 91  | 1   | 0   |     |     |    |    |    |    |    |    |    |
|----|-----|-----|-----|-----|-----|-----|-----|-----|-----|----|----|----|----|----|----|----|
|    | 67  |     |     | 50  |     | 0   | 0   |     |     |    |    |    |    |    |    |    |
|    | 80  |     | 8   | 26  |     | 0   |     | 0   | 0   |    |    |    |    |    |    |    |
|    | 119 | 114 |     | 111 |     |     |     | 0   | 0   |    |    |    |    |    |    |    |
| 86 |     | 117 |     | 116 |     |     |     | 0   | 0   |    |    |    |    |    |    |    |
| 77 |     |     | 114 |     | 120 | 1   |     |     | 0   |    |    |    |    |    |    |    |
|    |     |     |     |     |     |     |     |     |     | 0  |    |    |    |    |    |    |
|    | 38  |     |     |     | 27  |     |     |     |     |    | 0  |    |    |    |    |    |
|    |     |     |     | 111 |     |     |     | 30  |     |    |    | 0  |    |    |    |    |
|    |     |     |     |     |     |     |     |     |     |    |    |    | 0  |    |    |    |
|    |     |     | 92  |     |     | 11  |     |     | 40  |    |    |    |    | 0  |    |    |
| 4  |     |     |     |     |     |     |     |     |     |    |    |    |    |    | 0  |    |
|    |     | 29  |     |     | 122 |     |     |     |     |    |    |    |    |    | 0  |    |
|    |     |     |     |     |     |     |     |     |     |    |    |    |    |    |    | 0  |

| | row-6 | | | row-7 | | | | | | row-8 | | | | row-9 | | | | | row-10 | | | | | row-11 | | | | |
|---|---|---|---|---|---|---|---|---|---|---|---|---|---|---|---|---|---|---|---|---|---|---|---|---|---|---|---|---|
| processor-0 | 0 | 16 | 38 | 2 | 4 | 10 | 32 | 39 | – | 0 | 8 | 24 | 30 | 0 | 14 | 20 | 22 | – | 0 | 42 | – | – | – | 6 | 12 | 14 | 20 | 26 |
| processor-1 | 1 | 13 | 23 | 1 | 11 | 13 | 17 | 21 | 27 | 15 | 19 | 35 | 40 | 1 | 5 | 9 | 25 | 41 | 1 | 3 | 29 | 33 | 37 | 1 | 23 | 43 | – | – |

⌐ ¬
⌊ ⌋ [Process Idle]

|             | row-6 |    |    | row-7 |    |    |    | row-8 |    |    |    | row-9 |    |    |    | row-10 |    |    |    | row-11 |    |    |    |
|-------------|----|----|----|----|----|----|----|----|----|----|----|----|----|----|----|----|----|----|----|----|----|----|----|
| processor-0 | 0  | 2  | 38 | 10 | 14 | 20 | 32 | 39 | 0  | 4  | 28 | 34 | 40 | 0  | 6  | 12 | 26 | 0  | 14 | 28 | 42 | 0  | 2  | 4  | 8  | -  |
| processor-1 | 1  | 11 | 25 | 1  | 5  | 15 | 19 | 21 | 1  | 3  | 9  | 11 | 13 | 1  | 7  | 37 | 41 | 1  | 3  | 9  | 11 | 1  | 5  | 27 | 31 | 43 |

FIG. 9B

| 225 |  | 177 | 172 | 60 |  | 152 |  | 172 | 234 | 230 |  |  | 251 | 10 |  | 169 | 144 |  |
|---|---|---|---|---|---|---|---|---|---|---|---|---|---|---|---|---|---|---|
| 99 | 138 |  | 178 |  | 134 |  | 101 | 157 | 177 | 225 |  | 189 | 112 | 207 |  | 173 | 25 |  | 172 |  | 158 |
|  | 207 | 101 |  |  | 121 | 154 |  | 187 |  | 243 | 77 | 119 |  | 241 |  |  | 16 | 113 |  | 101 | 136 |
| 105 | 188 |  | 123 | 141 | 213 |  | 55 | 75 |  |  | 104 |  | 113 |  | 107 | 247 | 120 |  | 235 |
| 198 | 162 | 107 |  | 152 |  | 117 |  | 89 | 58 | 154 | 63 |  |  | 111 | 233 | 85 |  |  | 189 | 214 |
| 196 | 88 | 124 |  | 211 |  |  | 170 |  | 87 |  | 112 |  |  |  | 88 | 255 | 114 |  | 217 |  | 82 |
| 197 |  | 70 |  |  |  |  |  |  |  |  |  |  | 107 |  |  |  |  |  |  |  | 199 |
|  | 230 |  |  |  | 100 |  | 82 |  |  |  |  |  |  |  |  |  |  |  | 175 |
|  |  |  | 164 |  |  |  |  |  | 152 |  |  | 99 |  |  | 136 |  | 36 |  | 147 |
| 81 |  |  |  |  |  |  |  | 150 |  |  |  |  |  |  |  | 108 |  | 172 |  | 154 |
|  | 165 |  |  |  |  |  |  |  | 230 |  |  |  |  |  |  | 13 | 173 |
|  |  |  |  |  |  | 239 |  |  |  | 229 |  |  |  | 209 |
|  |  | 154 | 156 |  | 141 | 170 |  |  |  |  |  | 218 |
| 101 |  |  | 114 |  |  | 176 |  | 180 |  |  | 232 |
|  | 151 |  |  |  |  |  |  |  | 213 |  |  |  |  |  | 181 |  | 173 |
|  |  |  |  | 180 |  |  |  |  |  |  |  |  |  |  | 95 |  | 171 | 215 | 183 |
|  |  |  |  |  |  |  |  |  | 104 |  |  |  |  | 118 |
|  |  |  | 103 |  |  | 180 |  | 145 |  |  |  | 173 |  | 78 |

| 13B | 13C | 13D | 13E |
|---|---|---|---|
| 13F | 13G | 13H | 13I |

| 14B | 14C | 14D | 14E |
|---|---|---|---|
| 14F | 14G | 14H | 14I |

FIG. 14B

| 194 |  | 25 | 92 | 160 | 98 | 244 | 9 |  | 248 |  | 178 |  | 107 |  |  | 40 | 245 |  |
|---|---|---|---|---|---|---|---|---|---|---|---|---|---|---|---|---|---|---|
| 0 | 192 |  | 118 |  | 229 |  |  | 142 | 157 |  | 164 |  |  | 29 | 235 | 83 | 11 | 129 | 240 |
| 39 | 140 |  | 178 |  |  | 22 | 76 |  | 33 | 124 | 230 | 73 | 179 | 57 | 126 |  | 161 |  | 45 |
|  | 185 | 186 | 118 |  | 171 | 240 |  | 203 | 251 | 148 |  | 205 | 162 | 233 | 187 |  | 255 | 10 |  | 146 | 104 |
| 149 | 222 | 1 | 69 |  | 177 |  | 16 | 117 | 222 |  | 147 |  |  | 247 |  | 214 | 115 | 134 |
| 106 | 29 |
| 195 | 219 |  |  | 101 |  |  |  |  | 126 |  |  |  |  |  |  |  |  |  | 122 |
|  | 61 |  |  |  |  | 185 |  |  |  |  |  | 146 | 248 |  | 148 |  | 40 | 235 |
| 233 | 133 | 220 | 174 |  | 15 |  |  | 126 | 173 |
| 82 | 208 |  |  | 57 |  |  |  |  |  | 148 | 211 |  |  | 149 |
| 42 | 19 |  |  |  |  | 216 | 75 |  |  |  |  |  |  | 79 |  |  |  | 47 | 41 |
| 5 | 74 | 4 |  |  | 54 |  |  |  |  |  |  |  |  |  | 76 |  | 64 |
| 42 |  |  |  | 203 |  | 53 |  | 28 |  | 103 |
|  | 8 |  |  |  |  | 3 |  |  |  |  |  |  | 137 |  | 35 |  |  | 119 |  | 78 |
| 235 | 251 | 120 | 121 |
| 86 |  |  | 199 | 4 |  |  | 89 |  | 183 |
| 50 | 254 |  |  |  | 126 |  |  |  |  |  | 250 |  | 188 |
|  | 232 | 123 |  |  |  |  |  |  |  |  |  |  |  |  |  | 74 | 172 |
| 70 |  |  | 187 | 249 |  |  |  |  | 145 |
| 185 | 20 |  |  |  |  | 200 | 172 |  |  |  |  |  |  |  |  |  |  |  | 28 |
| 60 | 125 |  |  |  | 236 |  |  |  |  |  | 255 |
|  | 154 |  | 95 |  |  |  |  |  |  |  |  |  |  | 29 |  |  | 15 |
| 135 | 198 | 228 |  | 156 |  |  |  |  |  |  |  |  |  | 199 |
| 14 |  |  | 162 |  |  |  | 171 |  | 76 |  | 13 |
|  | 96 |  |  |  |  | 54 |  | 44 |  |  |  | 112 |
| 84 |  |  |  |  |  |  |  |  | 98 |  |  |  |  |  |  | 164 |
| 24 | 80 |  |  |  |  |  |  |  |  |  |  |  |  | 249 |  |  | 74 |
| 57 |  |  |  |  | 245 |  |  |  | 163 |  |  |  |  |  | 90 |
| 68 |  | 77 |  |  |  | 209 |  | 203 |
| 55 | 43 |  |  |  |  |  |  |  |  |  | 205 |  |  |  |  | 141 |
| 153 | 127 |  |  |  |  |  |  | 230 |  | 250 |
|  | 236 |  |  | 82 |
| 140 |  |  |  |  | 129 |  |  |  |  |  |  |  |  |  | 25 | 168 |
| 87 | 29 |  |  |  |  | 123 |
| 67 | 170 |  |  |  |  |  | 77 |  |  |  |  |  |  | 161 |
| 228 | 233 |  |  |  |  |  |  |  | 123 |  |  |  |  |  |  | 217 |
| 95 | 155 |  |  |  |  |  | 233 |  |  |  |  | 158 |
| 80 |  |  |  | 233 |  |  |  |  |  |  |  |  | 121 |
|  | 198 |  |  |  |  | 240 |  |  |  | 227 |
| 175 | 104 |  |  |  | 233 |
| 28 |  |  | 19 |  |  |  |  |  |  |  |  | 113 |  |  |  | 218 |
| 75 |  |  |  |  |  |  |  |  | 124 |
| 69 | 72 |  |  |  |  |  |  |  |  |  |  |  |  |  |  |  |  | 53 | 125 |
| 18 |  |  |  |  |  |  | 61 |  |  |  |  |  | 92 |
|  | 183 |  |  |  |  |  |  | 218 |  | 231 |

| 1 | 1 | 1 | 1 |   | 1 | 1 |   | 1 | 1 | 1 | 1 | 1 |   | 1 | 1 |   | 1 | 1 | 1 | 1 | 1 |   |   |
|---|---|---|---|---|---|---|---|---|---|---|---|---|---|---|---|---|---|---|---|---|---|---|---|
| 1 |   | 1 | 1 | 1 | 1 |   | 1 | 1 | 1 |   | 1 | 1 |   | 1 | 1 | 1 | 1 |   | 1 | 1 | 1 | 1 |   |
| 1 | 1 | 1 |   | 1 | 1 | 1 | 1 | 1 | 1 |   |   | 1 | 1 | 1 |   | 1 | 1 | 1 | 1 |   |   | 1 | 1 |
| 1 | 1 |   | 1 | 1 |   | 1 | 1 | 1 |   | 1 | 1 | 1 | 1 |   | 1 | 1 | 1 |   | 1 | 1 | 1 |   | 1 |
| 1 | 1 |   |   |   |   |   |   |   |   |   |   |   |   |   |   |   |   |   |   |   |   |   | 1 |

| 17B | 17C | 17F |
|-----|-----|-----|
| 17D | 17E | 17G |
| 17H | 17I | 17J |

FIG. 17B

| 1 | 1 | 1 | 1 |   | 1 | 1 |   | 1 | 1 | 1 | 1 | 1 |   | 1 | 1 |   | 1 | 1 | 1 | 1 | 1 | 1 |   |   |   |
|---|---|---|---|---|---|---|---|---|---|---|---|---|---|---|---|---|---|---|---|---|---|---|---|---|---|
| 1 |   | 1 | 1 | 1 | 1 |   | 1 | 1 | 1 |   | 1 | 1 |   | 1 | 1 | 1 | 1 |   | 1 |   | 1 | 1 | 1 | 1 |   |
| 1 | 1 | 1 |   | 1 | 1 | 1 | 1 | 1 | 1 | 1 |   | 1 | 1 | 1 |   | 1 | 1 | 1 | 1 |   |   |   | 1 | 1 |   |
| 1 | 1 |   | 1 | 1 |   | 1 | 1 | 1 |   | 1 | 1 | 1 | 1 | 1 |   | 1 | 1 | 1 |   | 1 | 1 | 1 |   | 1 |   |
| 1 | 1 |   |   |   |   |   |   |   |   |   |   |   |   |   |   |   |   |   |   |   |   |   |   |   | 1 |

| 1 | 1 | 1 | 1 |   | 1 | 1 |   | 1 | 1 | 1 | 1 | 1 |   | 1 | 1 |   | 1 | 1 | 1 | 1 | 1 |   |   |
|---|---|---|---|---|---|---|---|---|---|---|---|---|---|---|---|---|---|---|---|---|---|---|---|
| 1 |   | 1 | 1 | 1 | 1 |   | 1 | 1 | 1 |   | 1 | 1 |   | 1 | 1 | 1 | 1 |   | 1 | 1 | 1 | 1 |   |
| 1 | 1 | 1 |   | 1 | 1 | 1 | 1 | 1 | 1 |   |   | 1 | 1 | 1 |   | 1 | 1 | 1 | 1 |   |   | 1 | 1 |
| 1 | 1 |   | 1 | 1 |   | 1 | 1 | 1 |   | 1 | 1 | 1 | 1 |   | 1 | 1 | 1 |   | 1 | 1 |   |   | 1 |
| 1 | 1 |   |   |   |   |   |   |   |   |   |   |   |   |   |   |   |   |   |   |   |   |   | 1 |

| 169 | 118 | 114 | 114 |   | 190 | 105 |   |   | 53 | 89 | 180 | 169 | 132 |   | 165 | 36 |   | 28 | 30 | 127 | 103 | 1 | 0 |   |   |
|---|---|---|---|---|---|---|---|---|---|---|---|---|---|---|---|---|---|---|---|---|---|---|---|---|---|
| 125 |   | 159 | 191 | 60 | 143 |   | 82 | 121 | 69 |   | 106 | 33 |   | 94 | 127 | 49 | 176 |   | 48 |   | 106 | 0 | 0 | 0 |   |
| 124 | 87 | 71 |   | 31 | 2 | 185 | 88 | 5 | 95 | 48 |   | 109 | 160 | 137 |   | 159 | 116 | 44 | 64 |   |   |   | 0 | 0 |   |
| 87 | 145 |   | 107 | 80 |   | 33 | 20 | 38 |   | 163 | 169 | 116 | 90 | 15 |   | 142 | 6 | 57 |   | 30 | 131 | 1 |   |   | 0 |
| 48 | 49 |   |   |   |   |   |   |   |   |   |   |   |   |   |   |   |   |   |   |   |   |   |   |   | 0 |

FIG. 19D

| 58 | 99 |    | 87 |    |    |    |     |     | 21  |     |     | 190 |     |    |    | 152 | 71  |    |    |     |
|----|----|----|----|----|----|----|-----|-----|-----|-----|-----|-----|-----|----|----|-----|-----|----|----|-----|
| 6  |    |    |    |    | 191|    |     | 90  | 9   |     | 166 |     |     | 131| 22 |     | 57  |    |    |     |
|126 |145 |    |    | 159|    | 46 | 176 |     |     |     | 181 |     |     |    |    |     |     |    |    |     |
| 85 |117 |    | 32 |    |    |    |     |     |     | 75  |     |     | 24  |    |    | 139 | 64  | 80 |    | 144 |
| 57 |149 |    |    |    | 106|    |     | 28  | 44  |     | 63  |     |     | 54 | 46 |     |     |    |    |     |
|    |168 |153|    | 132|    |    | 191 | 148 |     |     |     | 100 |     |    |    |     |     |    |    |     |
|125 |153 |    |    |    |    |    |     |     |     | 37  |     |     | 164 |    |    |     | 22  | 25 | 177|     |
| 30 | 86 |    |    |    |    |    |     | 28  | 138 |     | 5   |     |     |    | 160|     |     |    |    |     |
|177 |    |    |129 |    | 23 | 21 |     |     |     |     |     |     |     |    |    |     |     | 19 |    |     |
| 62 |    |    |    |    |    |    |     |     |     | 12  |     | 149 | 123 | 40 |    |     | 84  |    |    |     |
|136 | 32 |    |    |    |    |    |     | 36  |     |     | 91  |     |     |    | 57 |     |     |    |    | 122 |
|    | 15 |    | 68 |    | 147|    |     |     | 76  |     |     |     |     |    |    |     | 62  |    |    |     |
|169 |    |    |    |    |    |    |     |     |     |     |     | 71  | 120 | 132|    |     | 116 |    |    |     |
|    | 12 |    |    |    |    |    |     |     |     | 178 | 91  |     |     |    | 72 | 33  |     |    |    |     |
|160 | 73 |    |    |    |    | 78 | 106 |     | 70  |     |     |     |     |    |    |     |     |    |    |     |
|155 |    |    | 13 |    |    |    |     | 25  |     | 4   |     |     |     |    |    |     | 179 |    |    |     |
|    | 79 |    |    | 37 | 51 |    |     |     |     |     |     |     | 118 |    |    |     | 153 |    |    |     |
|137 |    |    |    |    |    |    |     | 81  | 43  |     |     |     | 35  |    |    |     |     |    |    |     |
|    | 38 |149 |    |    |    |    | 135 |     |     |     |     |     |     | 20 |    |     |     |    |    |     |
| 83 |    |    | 39 | 51 |    |    |     |     | 178 |     |     |     |     |    |    | 134 |     |    |    |     |

FIG. 20B

| 168 | 99 | 146 | 33 |     | 89  | 80  |     |     | 165 | 113 | 51 | 28 | 80 |    | 33  | 0   |     | 11  | 52  | 137 | 74  | 1 | 0 |   |   |
| --- | -- | --- | -- | --- | --- | --- | --- | --- | --- | --- | -- | -- | -- | -- | --- | --- | --- | --- | --- | --- | --- | - | - | - | - |
| 122 |    | 120 | 43 | 52  | 57  |     | 32  | 114 | 168 |     | 0  | 11 |    | 3  | 79  | 129 | 9   |     | 135 |     | 131 | 0 | 0 | 0 |   |
| 64  | 80 | 163 |    | 79  | 97  | 47  | 122 | 80  | 172 | 57  |    |    | 74 | 158| 170 |     | 125 | 114 | 0   | 70  |     |   |   | 0 | 0 |
| 128 | 54 |     | 168| 22  |     | 11  | 57  | 174 |     | 59  | 174| 82 | 69 | 148|     | 141 | 173 | 77  |     | 11  | 142 | 1 |   | 0 |   |
| 23  | 51 |     |    |     |     |     |     |     |     |     |    |    |    |    |     |     |     |     |     |     |     |   |   |   | 0 |

FIG. 20D

| 26 | 27 |  | 24 |  |  |  |  |  |  | 157 |  |  | 92 |  |  |  | 7 | 19 |  |  |  |
|---|---|---|---|---|---|---|---|---|---|---|---|---|---|---|---|---|---|---|---|---|---|
| 162 |  |  |  |  | 18 |  |  | 170 | 35 |  | 78 |  |  | 146 | 82 |  | 55 |  |  |  |  |
| 39 | 134 |  |  | 83 |  | 6 | 22 |  |  |  |  | 112 |  |  |  |  |  |  |  |  |  |
| 29 | 146 |  | 158 |  |  |  |  |  | 69 |  |  | 152 |  |  | 124 |  | 108 | 61 |  | 46 |  |
| 17 | 60 |  |  |  | 86 |  |  | 24 | 61 |  | 140 |  |  | 97 | 51 |  |  |  |  |  |  |
|  | 79 | 68 |  | 130 |  |  | 32 | 96 |  |  |  | 78 |  |  |  |  |  |  |  |  |  |
| 98 | 144 |  |  |  |  |  |  |  | 4 |  |  | 138 |  |  |  | 159 | 12 | 167 |  |  |  |
| 171 | 145 |  |  |  |  |  |  | 154 | 2 |  | 63 |  |  |  | 97 |  |  |  |  |  |  |
| 106 |  |  | 174 |  |  | 7 | 161 |  |  |  |  |  |  |  |  |  | 71 |  |  |  |  |
| 4 |  |  |  |  |  |  |  |  | 154 |  |  | 118 | 78 | 46 |  |  | 151 |  |  |  |  |
| 103 | 97 |  |  |  |  |  |  | 82 |  |  | 37 |  |  |  | 0 |  |  |  |  | 152 |  |
|  | 146 |  | 141 |  |  | 156 |  |  |  | 172 |  |  |  |  |  |  | 63 |  |  |  |  |
| 8 |  |  |  |  |  |  |  |  |  | 68 |  | 100 | 128 |  |  | 94 |  |  |  |  |  |
|  | 132 |  |  |  |  |  |  |  |  | 19 | 87 |  |  |  | 125 | 75 |  |  |  |  |  |
| 98 | 57 |  |  |  | 133 | 20 |  | 166 |  |  |  |  |  |  |  |  |  |  |  |  |  |
| 120 |  |  | 154 |  |  |  |  | 83 |  | 33 |  |  |  |  |  |  | 64 |  |  |  |  |
|  | 36 |  |  |  | 126 | 78 |  |  |  |  |  |  |  | 35 |  |  | 136 |  |  |  |  |
| 63 |  |  |  |  |  |  |  |  | 32 | 38 |  |  |  | 92 |  |  |  |  |  |  |  |
|  | 76 | 78 |  |  |  |  |  | 132 |  |  |  |  |  | 133 |  |  |  |  |  |  |  |
| 66 |  |  | 35 | 124 |  |  |  | 156 |  |  |  |  |  |  |  | 40 |  |  |  |  |  |

FIG. 21A

| 21B | 21E | 21H |
|-----|-----|-----|
| 21C | 21F | 21I |
| 21D | 21G | 21J |

FIG. 21B

| 1 | 1 | 1 | 1 |   | 1 | 1 |   |   | 1 | 1 | 1 | 1 |   | 1 | 1 |   | 1 | 1 | 1 | 1 | 1 |   |   |
|---|---|---|---|---|---|---|---|---|---|---|---|---|---|---|---|---|---|---|---|---|---|---|---|
| 1 |   | 1 | 1 | 1 | 1 |   | 1 | 1 | 1 |   | 1 | 1 |   | 1 | 1 | 1 | 1 |   | 1 |   | 1 | 1 | 1 |
| 1 | 1 | 1 |   | 1 | 1 | 1 | 1 | 1 | 1 |   |   | 1 | 1 | 1 |   | 1 | 1 | 1 | 1 |   |   | 1 | 1 |
| 1 | 1 |   | 1 | 1 |   | 1 | 1 | 1 |   | 1 | 1 | 1 | 1 |   | 1 | 1 | 1 |   | 1 | 1 | 1 |   | 1 |
| 1 | 1 |   |   |   |   |   |   |   |   |   |   |   |   |   |   |   |   |   |   |   |   |   | 1 |

FIG. 21C

| 1 | 1 |   | 1 |   |   |   |   |   |   | 1 |   |   | 1 |   |   |   | 1 | 1 |   |   |   |   |   |
|---|---|---|---|---|---|---|---|---|---|---|---|---|---|---|---|---|---|---|---|---|---|---|---|
| 1 |   |   |   |   | 1 |   |   | 1 | 1 |   | 1 |   |   | 1 | 1 |   | 1 |   |   |   |   |   |   |
| 1 | 1 |   |   | 1 |   | 1 | 1 |   |   |   |   | 1 |   |   |   |   |   |   |   |   |   |   |   |
| 1 | 1 |   | 1 |   |   |   |   |   | 1 |   |   |   | 1 |   | 1 | 1 | 1 |   | 1 |   |   |   |   |
| 1 | 1 |   |   |   | 1 |   |   | 1 | 1 |   | 1 |   |   | 1 | 1 |   |   |   |   |   |   |   |   |
|   | 1 | 1 |   | 1 |   |   | 1 | 1 |   |   |   | 1 |   |   |   |   |   |   |   |   |   |   |   |
| 1 | 1 |   |   |   |   |   |   |   | 1 |   |   | 1 |   |   |   |   | 1 | 1 | 1 |   |   |   |   |
| 1 | 1 |   |   |   |   |   |   | 1 | 1 |   | 1 |   |   |   | 1 |   |   |   |   |   |   |   |   |
| 1 |   |   | 1 |   |   | 1 | 1 |   |   |   |   |   |   |   |   |   |   |   | 1 |   |   |   |   |
| 1 |   |   |   |   |   |   |   |   | 1 |   |   | 1 | 1 | 1 |   |   | 1 |   |   |   |   |   |   |
| 1 | 1 |   |   |   |   |   |   | 1 |   |   | 1 |   |   |   | 1 |   |   |   |   |   |   | 1 |   |
|   | 1 |   | 1 |   |   | 1 |   |   |   | 1 |   |   |   |   |   |   |   | 1 |   |   |   |   |   |
| 1 |   |   |   |   |   |   |   |   |   |   | 1 |   | 1 | 1 |   |   | 1 |   |   |   |   |   |   |
|   | 1 |   |   |   |   |   |   |   | 1 | 1 |   |   |   |   | 1 | 1 |   |   |   |   |   |   |   |
| 1 | 1 |   |   |   | 1 | 1 |   | 1 |   |   |   |   |   |   |   |   |   |   |   |   |   |   |   |
| 1 |   | 1 |   |   |   | 1 |   | 1 |   |   |   |   |   |   |   |   | 1 |   |   |   |   |   |   |
|   | 1 |   | 1 | 1 |   |   |   |   |   |   |   |   | 1 |   |   | 1 |   |   |   |   |   |   |   |
| 1 |   |   |   |   |   |   |   | 1 | 1 |   |   | 1 |   |   |   |   |   |   |   |   |   |   |   |
|   | 1 | 1 |   |   |   |   | 1 |   |   |   |   |   | 1 |   |   |   |   |   |   |   |   |   |   |
| 1 |   | 1 | 1 |   |   |   |   | 1 |   |   |   |   |   |   |   |   | 1 |   |   |   |   |   |   |

| 22B | 22E | 22H |
|-----|-----|-----|
| 22C | 22F | 22I |
| 22D | 22G | 22J |

FIG. 22B

| 132 | 186 | 219 | 253 |     | 42  | 43  |     |     | 10  | 128 | 51  | 135 | 40  |     | 112 | 246 |     | 8   | 75  | 235 | 222 | 1   | 0   |     |     |     |
|-----|-----|-----|-----|-----|-----|-----|-----|-----|-----|-----|-----|-----|-----|-----|-----|-----|-----|-----|-----|-----|-----|-----|-----|-----|-----|-----|
| 37  |     | 245 | 63  | 19  | 179 |     | 188 | 179 | 209 |     | 184 | 123 |     | 6   | 3   | 101 | 99  |     | 70  |     | 168 | 0   | 0   | 0   |     |     |
| 235 | 243 | 80  |     | 124 | 23  | 61  | 107 | 12  | 88  | 24  |     |     | 63  | 203 | 225 |     | 160 | 84  | 103 | 81  |     |     |     | 0   | 0   |     |
| 1   | 238 |     | 181 | 250 |     | 87  | 148 | 27  |     | 27  | 109 | 165 | 9   | 189 |     | 248 | 5   | 16  |     | 174 | 167 | 1   |     |     | 0   |     |
| 69  | 222 |     |     |     |     |     |     |     |     |     |     |     |     |     |     |     |     |     |     |     |     |     |     |     |     | 0   |

FIG. 22C

| 201 | 167 |     | 59  |     |     |     |     |     |     | 118 |     |     | 88  |     |     |     | 101 | 182 |     |     |
|-----|-----|-----|-----|-----|-----|-----|-----|-----|-----|-----|-----|-----|-----|-----|-----|-----|-----|-----|-----|-----|
| 232 |     |     |     |     | 252 |     |     | 148 | 37  |     | 199 |     |     | 17  | 31  |     | 145 |     |     |     |
| 217 | 148 |     |     | 4   |     |     | 0   | 98  |     |     |     | 254 |     |     |     |     |     |     |     |     |
| 209 | 97  |     | 55  |     |     |     |     |     |     | 129 |     |     | 223 |     |     | 182 | 239 | 77  |     | 225 |
| 67  | 40  |     |     |     | 136 |     |     | 66  | 79  |     | 156 |     |     | 73  | 112 |     |     |     |     |     |
|     | 109 | 3   |     | 184 |     |     | 177 | 254 |     |     |     | 118 |     |     |     |     |     |     |     |     |
| 175 | 92  |     |     |     |     |     |     |     | 113 |     |     |     | 229 |     |     |     | 217 | 68  | 165 |     |
| 36  | 254 |     |     |     |     |     |     | 220 | 150 |     | 105 |     |     |     | 214 |     |     |     |     |     |
| 108 |     |     | 178 |     | 24  | 208 |     |     |     |     |     |     |     |     |     |     |     |     | 17  |     |
| 69  |     |     |     |     |     |     |     | 228 |     |     | 238 | 39  | 25  |     |     | 78  |     |     |     |     |
| 229 | 133 |     |     |     |     |     |     | 67  |     | 176 |     |     |     |     | 68  |     |     |     |     | 70  |
|     | 229 | 156 |     |     | 7   |     |     |     | 83  |     |     |     |     |     |     |     | 126 |     |     |     |
| 133 |     |     |     |     |     |     |     |     |     | 41  |     | 169 | 29  |     |     | 132 |     |     |     |     |
|     | 148 |     |     |     |     |     |     |     | 113 | 112 |     |     |     | 162 | 79  |     |     |     |     |     |
| 123 | 97  |     |     |     | 224 | 160 |     | 249 |     |     |     |     |     |     |     |     |     |     |     |     |
| 184 |     |     | 128 |     |     |     | 87  |     | 177 |     |     |     |     |     |     |     | 52  |     |     |     |
|     | 157 |     |     | 76  | 179 |     |     |     |     |     |     |     | 178 |     |     | 244 |     |     |     |     |
| 169 |     |     |     |     |     |     |     |     | 10  | 32  |     |     | 240 |     |     |     |     |     |     |     |
|     | 190 | 177 |     |     |     |     |     | 237 |     |     |     |     |     | 162 |     |     |     |     |     |     |
| 63  |     |     | 3   | 65  |     |     |     |     | 245 |     |     |     |     |     |     | 214 |     |     |     |     |

| 23B | 23E | 23H |
|---|---|---|
| 23C | 23F | 23I |
| 23D | 23G | 23J |

FIG. 23B

| 107 | 79 | 220 | 200 |     | 231 | 46  |     |     | 104 | 16  | 164 | 62  | 20  |     | 66  | 149 |     | 13  | 127 | 116 | 160 | 1 | 0 |   |   |   |
| --- | -- | --- | --- | --- | --- | --- | --- | --- | --- | --- | --- | --- | --- | --- | --- | --- | --- | --- | --- | --- | --- | - | - | - | - | - |
| 33  |    | 104 | 208 | 64  | 83  |     | 132 | 116 | 94  |     | 75  | 101 |     | 23  | 167 | 227 | 51  |     | 192 |     | 151 | 0 | 0 | 0 |   |   |
| 152 | 140| 69  |     | 172 | 182 | 73  | 6   | 100 | 200 | 72  |     |     | 23  | 25  | 239 |     | 119 | 41  | 197 | 18  |     |   |   | 0 | 0 |   |
| 133 | 148|     | 124 | 114 |     | 35  | 16  | 174 |     | 36  | 206 | 10  | 180 | 136 |     | 222 | 86  | 230 |     | 163 | 88  | 1 |   |   | 0 |   |
| 185 | 57 |     |     |     |     |     |     |     |     |     |     |     |     |     |     |     |     |     |     |     |     |   |   |   |   | 0 |

FIG. 23C

| 7 | 158 |  | 41 |  |  |  |  |  | 229 |  |  | 213 |  |  | 195 | 238 |  |  |  |
|---|---|---|---|---|---|---|---|---|---|---|---|---|---|---|---|---|---|---|---|
| 127 |  |  |  |  | 23 |  |  | 221 | 207 |  | 146 |  | 128 | 147 |  | 135 |  |  |  |
| 217 | 132 |  |  | 99 |  |  | 14 | 107 |  |  |  | 193 |  |  |  |  |  |  |  |
| 65 | 148 |  | 63 |  |  |  |  |  |  | 136 |  |  | 79 |  | 138 |  | 28 | 3 |  | 94 |  |  |
| 231 | 183 |  |  |  | 126 |  |  |  | 76 | 89 |  | 199 |  |  | 173 | 96 |  |  |  |
|  | 156 | 233 |  | 226 |  |  | 88 | 205 |  |  |  | 74 |  |  |  |  |  |  |  |
| 94 | 190 |  |  |  |  |  |  |  |  | 137 |  |  | 127 |  |  |  | 168 | 215 | 189 |  |
| 158 | 132 |  |  |  |  |  |  | 111 | 15 |  | 136 |  |  |  | 171 |  |  |  |  |
| 141 |  |  | 8 |  | 229 | 146 |  |  |  |  |  |  |  |  |  |  |  | 68 |  |  |
| 38 |  |  |  |  |  |  |  |  |  | 39 |  |  | 29 | 206 | 208 |  |  | 199 |  |  |
| 85 | 2 |  |  |  |  |  |  | 212 |  |  | 80 |  |  |  | 117 |  |  |  |  | 219 |
|  | 73 |  | 77 |  | 60 |  |  |  | 230 |  |  |  |  |  |  |  |  | 9 |  |  |
| 191 |  |  |  |  |  |  |  |  |  |  |  | 171 |  | 87 | 198 |  |  | 181 |  |  |
|  | 149 |  |  |  |  |  |  |  | 47 | 69 |  |  |  |  | 132 | 42 |  |  |  |  |
| 44 | 106 |  |  |  |  |  | 179 | 179 |  | 220 |  |  |  |  |  |  |  |  |  |  |
| 213 |  |  | 76 |  |  |  |  | 69 |  | 207 |  |  |  |  |  |  |  | 127 |  |  |
|  | 156 |  |  |  | 112 | 127 |  |  |  |  |  |  |  | 213 |  |  | 163 |  |  |  |
| 3 |  |  |  |  |  |  |  |  |  | 16 | 123 |  |  | 216 |  |  |  |  |  |  |
|  | 164 | 32 |  |  |  |  |  | 43 |  |  |  |  |  |  | 69 |  |  |  |  |  |
| 227 |  |  | 233 | 165 |  |  |  |  | 97 |  |  |  |  |  |  |  | 153 |  |  |  |

| | | |
|---|---|---|
| 24B | 24E | 24H |
| 24C | 24F | 24I |
| 24D | 24G | 24J |

FIG. 24B

| 1 | 1 | 1 | 0 | 1 | 1 | 0 | 0 | 1 | 1 | 1 | 1 | 0 | 1 | 1 | 0 | 1 | 1 | 1 | 1 | 1 | 0 | 0 | 0 |
|---|---|---|---|---|---|---|---|---|---|---|---|---|---|---|---|---|---|---|---|---|---|---|---|
| 1 | 0 | 1 | 1 | 1 | 1 | 0 | 1 | 1 | 1 | 0 | 1 | 1 | 0 | 1 | 1 | 1 | 1 | 0 | 1 | 0 | 1 | 1 | 1 | 0 | 0 |
| 1 | 1 | 1 | 0 | 1 | 1 | 1 | 1 | 1 | 1 | 0 | 0 | 1 | 1 | 1 | 0 | 1 | 1 | 1 | 1 | 0 | 0 | 0 | 1 | 1 | 0 |
| 1 | 1 | 0 | 1 | 1 | 0 | 1 | 1 | 1 | 0 | 1 | 1 | 1 | 1 | 1 | 0 | 1 | 1 | 1 | 0 | 1 | 1 | 1 | 0 | 0 | 1 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |

FIG. 24C

| 1 | 1 | 0 | 1 | 0 | 0 | 0 | 0 | 0 | 0 | 0 | 1 | 0 | 0 | 0 | 1 | 0 | 0 | 0 | 1 | 1 | 0 | 0 | 0 |
|---|---|---|---|---|---|---|---|---|---|---|---|---|---|---|---|---|---|---|---|---|---|---|---|
| 1 | 0 | 0 | 0 | 0 | 0 | 1 | 0 | 0 | 0 | 1 | 1 | 0 | 1 | 0 | 0 | 0 | 1 | 1 | 0 | 1 | 0 | 0 | 0 |
| 1 | 1 | 0 | 0 | 1 | 0 | 0 | 1 | 1 | 0 | 0 | 0 | 0 | 1 | 0 | 0 | 0 | 0 | 0 | 0 | 0 | 0 | 0 | 0 |
| 1 | 1 | 0 | 1 | 0 | 0 | 0 | 0 | 0 | 0 | 0 | 1 | 0 | 0 | 0 | 1 | 0 | 0 | 1 | 0 | 1 | 1 | 0 | 1 |
| 1 | 1 | 0 | 0 | 0 | 0 | 0 | 0 | 0 | 1 | 1 | 0 | 1 | 0 | 0 | 0 | 1 | 1 | 0 | 1 | 0 | 0 | 0 | 0 |
| 0 | 1 | 1 | 0 | 1 | 0 | 0 | 1 | 1 | 0 | 0 | 0 | 0 | 1 | 0 | 0 | 0 | 0 | 0 | 0 | 0 | 0 | 0 | 0 |
| 1 | 1 | 0 | 0 | 0 | 0 | 0 | 0 | 0 | 0 | 1 | 0 | 0 | 0 | 1 | 0 | 0 | 0 | 1 | 1 | 1 | 0 | 0 | 0 |
| 1 | 1 | 0 | 0 | 0 | 0 | 0 | 0 | 1 | 1 | 0 | 1 | 0 | 0 | 0 | 0 | 1 | 0 | 0 | 0 | 0 | 0 | 0 | 0 |
| 1 | 0 | 0 | 1 | 0 | 0 | 0 | 1 | 0 | 0 | 0 | 0 | 0 | 0 | 0 | 0 | 0 | 1 | 0 | 0 | 1 | 0 | 0 | 0 |
| 1 | 0 | 0 | 0 | 0 | 0 | 0 | 0 | 0 | 0 | 1 | 0 | 0 | 1 | 1 | 1 | 0 | 0 | 0 | 1 | 0 | 0 | 0 | 0 |
| 1 | 1 | 0 | 0 | 0 | 0 | 0 | 0 | 0 | 1 | 0 | 0 | 1 | 0 | 0 | 0 | 0 | 1 | 0 | 0 | 0 | 0 | 1 | 0 |
| 0 | 1 | 0 | 1 | 0 | 0 | 0 | 0 | 0 | 0 | 1 | 0 | 0 | 0 | 0 | 0 | 0 | 0 | 1 | 0 | 1 | 0 | 0 | 0 |
| 1 | 0 | 0 | 0 | 0 | 0 | 0 | 0 | 0 | 0 | 0 | 0 | 1 | 0 | 1 | 1 | 0 | 0 | 0 | 1 | 0 | 0 | 0 | 0 |
| 0 | 1 | 0 | 0 | 0 | 0 | 0 | 0 | 0 | 0 | 1 | 1 | 0 | 0 | 0 | 1 | 1 | 0 | 0 | 0 | 0 | 0 | 0 | 0 |
| 1 | 1 | 0 | 0 | 0 | 0 | 0 | 1 | 1 | 0 | 1 | 0 | 0 | 0 | 0 | 0 | 0 | 0 | 0 | 0 | 0 | 0 | 0 | 0 |
| 1 | 0 | 0 | 1 | 0 | 0 | 0 | 0 | 1 | 0 | 1 | 0 | 0 | 0 | 0 | 0 | 0 | 0 | 0 | 1 | 0 | 0 | 0 | 0 |
| 0 | 1 | 0 | 0 | 0 | 1 | 0 | 0 | 0 | 0 | 0 | 0 | 0 | 0 | 1 | 0 | 0 | 0 | 1 | 1 | 0 | 0 | 0 | 0 |
| 1 | 0 | 0 | 0 | 0 | 0 | 0 | 0 | 0 | 0 | 0 | 1 | 1 | 0 | 0 | 0 | 1 | 0 | 0 | 0 | 0 | 0 | 0 | 0 |
| 0 | 1 | 1 | 0 | 0 | 0 | 0 | 0 | 0 | 1 | 0 | 0 | 0 | 0 | 0 | 0 | 1 | 0 | 0 | 0 | 0 | 0 | 0 | 0 |
| 1 | 0 | 0 | 1 | 1 | 0 | 0 | 0 | 0 | 0 | 1 | 0 | 0 | 0 | 0 | 0 | 0 | 0 | 0 | 0 | 1 | 0 | 0 | 0 |

FIG. 24D

| 0 | 1 | 0 | 0 | 0 | 1 | 1 | 0 | 0 | 0 | 0 | 0 | 1 | 0 | 0 | 0 | 0 | 0 | 0 | 0 | 0 | 0 | 0 | 0 |
|---|---|---|---|---|---|---|---|---|---|---|---|---|---|---|---|---|---|---|---|---|---|---|---|
| 1 | 0 | 1 | 0 | 1 | 0 | 0 | 0 | 0 | 0 | 0 | 0 | 0 | 1 | 0 | 0 | 0 | 0 | 0 | 0 | 0 | 0 | 0 | 0 |
| 0 | 1 | 0 | 0 | 0 | 1 | 0 | 1 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 1 | 0 | 1 | 0 | 0 | 0 | 0 | 0 |
| 0 | 1 | 0 | 0 | 0 | 0 | 0 | 0 | 0 | 0 | 0 | 0 | 1 | 0 | 0 | 1 | 0 | 0 | 0 | 0 | 0 | 0 | 1 | 0 |
| 1 | 0 | 0 | 0 | 0 | 0 | 0 | 0 | 0 | 1 | 0 | 0 | 1 | 0 | 0 | 0 | 0 | 0 | 0 | 0 | 0 | 1 | 0 | 0 |
| 0 | 1 | 0 | 0 | 0 | 0 | 0 | 1 | 0 | 0 | 0 | 0 | 0 | 0 | 0 | 0 | 0 | 0 | 0 | 1 | 0 | 0 | 1 | 0 |
| 1 | 0 | 0 | 0 | 0 | 0 | 0 | 0 | 0 | 0 | 0 | 1 | 0 | 1 | 0 | 0 | 0 | 0 | 0 | 0 | 0 | 1 | 0 | 0 |
| 0 | 1 | 1 | 0 | 0 | 0 | 0 | 0 | 0 | 0 | 1 | 0 | 0 | 0 | 0 | 0 | 0 | 0 | 1 | 0 | 0 | 0 | 0 | 0 |
| 1 | 0 | 0 | 0 | 0 | 0 | 1 | 0 | 0 | 0 | 0 | 0 | 0 | 1 | 0 | 1 | 0 | 0 | 0 | 0 | 0 | 0 | 0 | 0 |
| 0 | 1 | 0 | 0 | 0 | 1 | 0 | 0 | 0 | 0 | 1 | 0 | 0 | 0 | 0 | 0 | 0 | 0 | 1 | 0 | 0 | 0 | 0 | 0 |
| 1 | 0 | 0 | 0 | 0 | 0 | 0 | 0 | 0 | 0 | 0 | 0 | 1 | 1 | 0 | 0 | 1 | 0 | 0 | 0 | 0 | 0 | 0 | 0 |
| 0 | 1 | 0 | 0 | 0 | 0 | 0 | 0 | 0 | 0 | 0 | 1 | 0 | 0 | 0 | 0 | 0 | 0 | 0 | 1 | 0 | 0 | 0 | 0 |
| 1 | 0 | 0 | 0 | 0 | 0 | 0 | 0 | 1 | 1 | 0 | 1 | 0 | 0 | 0 | 0 | 0 | 0 | 0 | 0 | 0 | 0 | 0 | 0 |
| 0 | 1 | 0 | 1 | 0 | 0 | 1 | 0 | 0 | 0 | 0 | 0 | 0 | 0 | 0 | 1 | 0 | 0 | 0 | 0 | 0 | 0 | 0 | 0 |
| 1 | 0 | 0 | 0 | 0 | 0 | 0 | 1 | 0 | 0 | 0 | 0 | 0 | 0 | 1 | 0 | 0 | 0 | 0 | 0 | 0 | 0 | 0 | 0 |
| 0 | 1 | 0 | 1 | 0 | 0 | 0 | 0 | 1 | 0 | 0 | 0 | 0 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 1 | 0 | 0 |
| 0 | 1 | 0 | 0 | 0 | 0 | 0 | 0 | 0 | 0 | 0 | 0 | 0 | 1 | 0 | 1 | 0 | 0 | 0 | 0 | 0 | 0 | 1 | 0 |
| 1 | 0 | 0 | 0 | 0 | 0 | 1 | 0 | 1 | 0 | 0 | 0 | 0 | 0 | 0 | 0 | 0 | 0 | 1 | 0 | 0 | 0 | 0 | 0 |
| 0 | 1 | 0 | 0 | 0 | 1 | 0 | 0 | 0 | 1 | 0 | 0 | 0 | 0 | 0 | 0 | 0 | 0 | 0 | 0 | 0 | 0 | 0 | 0 |

APPARATUS AND METHOD FOR CHANNEL ENCODING/DECODING IN COMMUNICATION OR BROADCASTING SYSTEM

CROSS-REFERENCE TO RELATED APPLICATION(S)

This application is based on and claims priority under 35 U.S.C. § 119(a) of a Korean patent application number 10-2017-0041138, filed on Mar. 30, 2017, in the Korean Intellectual Property Office, and of a Korean patent application number 10-2017-0057066, filed on May 4, 2017, in the Korean Intellectual Property Office, and of a Korean patent application number 10-2017-0069480, filed on Jun. 5, 2017, in the Korean Intellectual Property Office, and of a Korean patent application number 10-2017-0072810, filed on Jun. 9, 2017, in the Korean Intellectual Property Office, and of a Korean patent application number 10-2017-0072821, filed on Jun. 10, 2017, in the Korean Intellectual Property Office, and of a Korean patent application number 10-2017-0073157, filed on Jun. 12, 2017, in the Korean Intellectual Property Office, the disclosure of each of which is incorporated by reference herein in its entirety.

TECHNICAL FIELD

The disclosure relates to an apparatus and a method for channel encoding/decoding in a communication or broadcasting system. More particularly, the disclosure relates to an apparatus and a method for a low density parity check (LDPC) encoding/decoding capable of supporting various input lengths and coding rates.

BACKGROUND

To meet the demand for wireless data traffic having increased since deployment of fourth generation (4G) communication systems, efforts have been made to develop an improved fifth generation (5G) or pre-5G communication system. Therefore, the 5G or pre-5G communication system is also called a 'Beyond 4G Network' or a 'Post long term evolution (LTE) System'.

The 5G communication system is considered to be implemented in higher frequency millimeter wave (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beamforming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed. In a communication or broadcasting system, link performance may be considerably deteriorated due to various kinds of channel noise, fading phenomenon, and inter-symbol interference (ISI). Accordingly, in order to implement high-speed digital communication or broadcasting systems requiring high data throughput and reliability, such as next-generation mobile communication, digital broadcasting, and portable Internet, it is required to develop a technology capable of overcoming the noise, fading, and inter-symbol interference. Recently, as a part of studies to overcome the noise and the like, researches for an error-correcting code have been actively made as a method for heightening communication reliability through efficient restoration of information distortion.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and a method for a low density parity check (LDPC) encoding/decoding capable of supporting various input lengths and coding rates.

Another aspect of the disclosure is to provide a method for designing an elementary matrix of a parity check matrix of an LDPC code supporting very high decoder throughput.

Another aspect of the disclosure is to provide a method for designing a parity check matrix from an elementary matrix of a designed parity check matrix.

Another aspect of the disclosure is to provide an apparatus and a method for LDPC encoding/decoding supporting various codeword lengths from a designed parity check matrix.

In accordance with an aspect of the disclosure, a method for channel encoding in a communication or broadcasting system is provided. The method includes determining a block size Z, and performing encoding based on the block size and a first matrix corresponding to the block size, wherein the first matrix is determined based on information and a plurality of second matrices, and wherein a part of a column index indicating a position of a non-zero element in each row of the information includes an index according to mathematical expression 22 below.

In accordance with another aspect of the disclosure, a method for channel decoding in a communication or broadcasting system is provided. The method includes determining a block size Z, and performing decoding based on the block size and a first matrix corresponding to the block size, wherein the first matrix is determined based on information and a plurality of second matrices, and wherein a part of a column index indicating a position of a non-zero element in each row of the information includes an index according to mathematical expression 22 below.

In accordance with another aspect of the disclosure, an apparatus for channel encoding in a communication or broadcasting system is provided. The apparatus includes a transceiver, and at least one processor configured to determine a block size Z and to perform encoding based on the block size and a first matrix corresponding to the block size, wherein the first matrix is determined based on information and a plurality of second matrices, and wherein a part of a column index indicating a position of a non-zero element in each row of the information includes an index according to mathematical expression 22 below.

In accordance with another aspect of the disclosure, an apparatus for channel decoding in a communication or broadcasting system is provided. The apparatus includes a transceiver, and at least one processor configured to determine a block size Z and to perform decoding based on the block size and a first matrix corresponding to the block size, wherein the first matrix is determined based on information and a plurality of second matrices, and a part of a column index indicating a position of a non-zero element in each row of the information includes an index according to mathematical expression 22 below.

In accordance with another aspect of the disclosure, a method for generating an LDPC code in a communication or broadcasting system is provided. The method includes a weight distribution of an elementary matrix satisfying a balancing condition.

In accordance with another aspect of the disclosure, a method for generating an LDPC code in a communication or broadcasting system is provided. The method includes a weight distribution of an elementary matrix satisfying a partial windowing-orthogonal condition.

In accordance with another aspect of the disclosure, a method for channel decoding in a communication or broadcasting system is provided. The method includes determining a block size of a parity check matrix, and reading out a sequence for generating the parity check matrix in which a weight distribution is strongly balanced. The method further includes converting the sequence by applying an operation to the sequence.

According to an aspect of the disclosure, the LDPC code can be supported with respect to a variable length and a variable rate.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A, 4B, and 4C are diagrams of an exponential matrix according to various embodiments of the disclosure;

FIG. 5 is a diagram of an elementary matrix according to an embodiment of the disclosure;

FIG. 6 is a diagram of scheduling to perform LDPC decoding using two block parallel processors with respect to a parity check matrix having the elementary matrix of FIG. 5 according to an embodiment of the disclosure;

FIG. 7 is a diagram of an elementary matrix according to an embodiment of the disclosure;

FIG. 8 is a diagram of scheduling to perform LDPC decoding using two block parallel processors with respect to a parity check matrix having the elementary matrix of FIG. 7 according to an embodiment of the disclosure;

FIGS. 9A, 9B, and 9C are diagrams of an exponential matrix according to various embodiments of the disclosure;

FIGS. 13A, 13B, 13C, 13D, 13E, 13F, 13G, 13H and 13I are diagrams of other elementary matrices according to various embodiments of the disclosure;

FIGS. 14A, 14B, 14C, 14D, 14E, 14F, 14G, 14H, and 14I are diagrams of other exponential matrices according to various embodiments of the disclosure;

FIGS. 15A, 15B, and 15C are diagrams of other elementary matrices according to various embodiments of the disclosure;

FIGS. 16A, 16B, 16C, 16D, and 16E are diagrams of other elementary matrices according to various embodiments of the disclosure;

FIGS. 17A, 17B, 17C, 17D, and 17E are diagrams of other elementary matrices according to various embodiments of the disclosure;

FIGS. 18A, 18B, 18C, 18D, and 18E are diagrams of other elementary matrices according to various embodiments of the disclosure;

FIGS. 19A, 19B, 19C, 19D, and 19E are diagrams of other exponential matrices according to various embodiments of the disclosure;

FIGS. 20A, 20B, 20C, 20D, and 20E are diagrams of other exponential matrices according to various embodiments of the disclosure;

FIGS. 21A, 21B, 21C, 21D, 21E, 21F, 21G, 21H, 21I, and 21J are diagrams of other elementary matrices according to various embodiments of the disclosure;

FIGS. 22A, 22B, 22C, and 22D are diagrams of other exponential matrices according to various embodiments of the disclosure;

FIGS. 23A, 23B, 23C, and 23D are diagrams of other exponential matrices according to various embodiments of the disclosure; and FIGS. 24A, 24B, 24C, and 24D are diagrams of other elementary matrices according to various embodiments of the disclosure.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

A low density parity check (LDPC) code first introduced by Gallager in the 1960's was forgotten for a long time due to its complexity that causes the implementation thereof to be difficult in view of the technical level at that time. However, in the year 1993, as a turbo code proposed by Berrou, Glavieux, and Thitimaj shima showed the performance approaching the channel capacity of Shannon, many researches for channel encoding based on a graph and iterative decoding were made with a lot of analysis made for the performance and the characteristic of the turbo code. Taking this opportunity, the LDPC code was restudied in the latter half of the 1990s, and it became clear that the LDPC code also had the performance approaching the channel capacity of Shannon by performing decoding through application of the iterative decoding based on a sum-product algorithm on a Tanner graph corresponding to the LDPC code.

In general, the LDPC code is defined as a parity check matrix, and may be expressed using a bipartite graph commonly called a Tanner graph.

Figure 1:
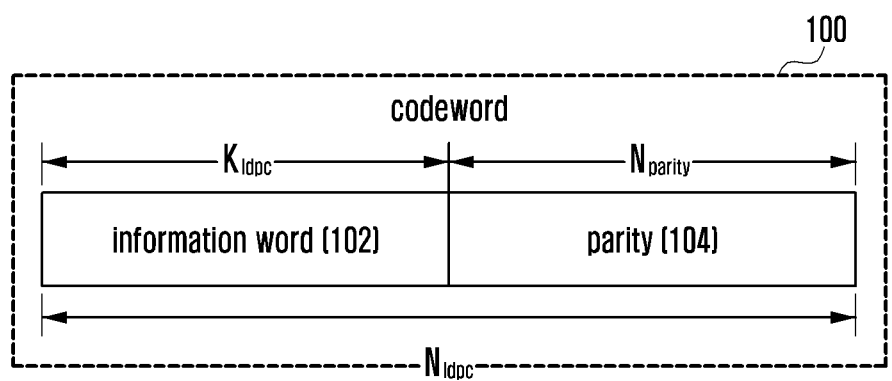
FIG. 1 is a diagram illustrating a structure of a systematic low density parity check (LDPC) codeword according to an embodiment of the disclosure.

FIG. 1 is a diagram illustrating a structure of a systematic LDPC codeword according to an embodiment of the disclosure.

Hereinafter, referring to FIG. 1, a systematic LDPC codeword will be described.

Referring to FIG. 1, an LDPC code receives an input of an information word 102 composed of $K_{ldpc}$ bits or symbols, and generates a codeword 100 composed of $N_{ldpc}$ bits or symbols. Hereinafter, for convenience in explanation, it is assumed that an information word 102 including $K_{ldpc}$ bits is input, and a codeword 100 composed of $N_{ldpc}$ bits is generated. For example, if an information word $I=[i_0, i_1, i_2, \ldots, i_{K_{ldpc}-1}]$ 102 composed of $K_{ldpc}$ input bits is LDPC-encoded, a codeword $c=[c_0, c_1, c_2, c_3, \ldots, c_{N_{ldpc}-1}]$ 100 is generated. For example, the information word and the codeword are bit strings composed of a plurality of bits, and an information word bit and a codeword bit mean respective bits constituting the information word and the codeword. If a codeword includes an information word, such as: $C=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$, it is called a systematic code. Here, $P=[p_0, p_1, p_2, \ldots, p_{N_{ldpc}-K_{ldpc}-1}]$ is a parity bit 104, and the number of parity bits $N_{parity}$, may be expressed as $N_{parity}=N_{ldpc}-K_{ldpc}$.

The LDPC code is a kind of linear block code, and includes a process of determining a codeword that satisfies a condition as expressed in mathematical expression 1 below.

$$H \cdot c^T = [h_1 \ h_2 \ h_3 \ \ldots \ h_{N_{ldpc}-1}] \cdot c^T \quad \text{Mathematical expression 1}$$
$$= \sum_{i=0}^{N_{ldpc}} c_i \cdot h_i$$
$$= 0$$

Here, C is.
$$c = [c_0, c_1, c_2, \ldots, c_{N_{ldpc}-1}]$$

In the mathematical expression 1, H denotes a parity check matrix, C denotes a codeword, $c_i$ denotes the i-th bit, and $N_{ldpc}$ denotes a length of an LDPC codeword. Here, $h_i$ denotes the i-th column of the parity check matrix H.

The parity check matrix H is composed of $N_{ldpc}$ columns the number of which is equal to the number of bits of the LDPC codeword. Since the mathematical expression 1 means that the sum of multiplication of the i-th column $h_i$ of the parity check matrix and the i-th codeword bit $c_i$ is 0, the i-th column $h_i$ is related to the i-th codeword bit $c_i$.

Figure 2:
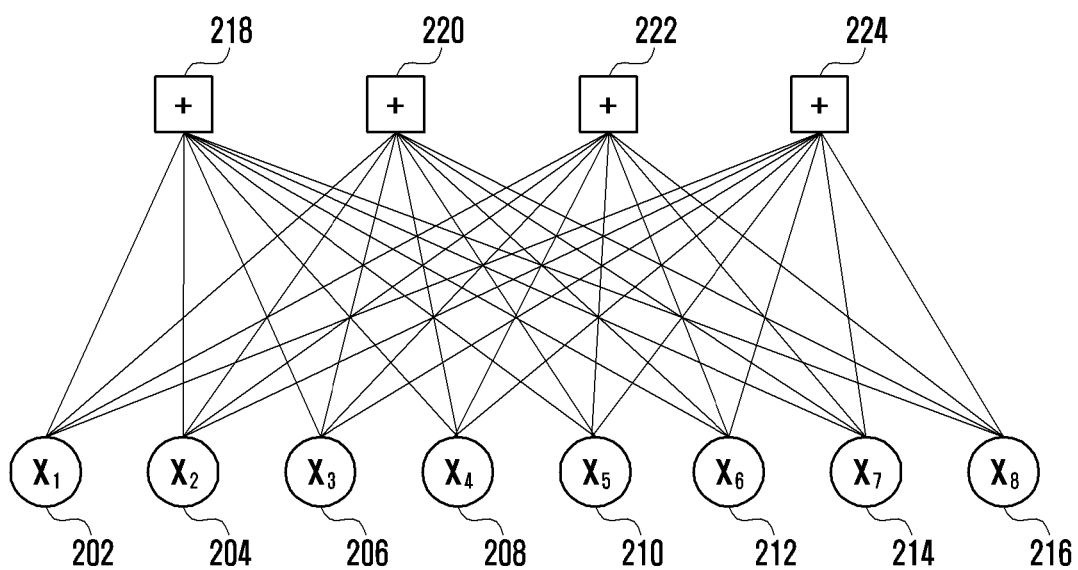
FIG. 2 is a diagram illustrating a graph expression method of an LDPC code according to an embodiment of the disclosure.

FIG. 2 is a diagram illustrating a graph expression method of an LDPC code according to an embodiment of the disclosure.

Referring to FIG. 2, a graph expression method of an LDPC code will be described.

FIG. 2 illustrates an example of a parity check matrix $H_1$ of an LDPC code composed of 4 rows and 8 columns and a Tanner graph illustrating the same. Referring to FIG. 2, since the parity check matrix $H_1$ has 8 columns, it generates a codeword having a length of 8. A code generated through $H_1$ means an LDPC code, and each column corresponds to encoded 8 bits.

Referring to FIG. 2, the Tanner graph of the LDPC code that performs encoding and decoding based on the parity check matrix $H_1$ is composed of 8 variable nodes $x_1$(202), $x_2$(204), $x_3$(206), $x_4$(208), $x_5$(210), $x_6$(212), $x_7$(214), and $x_8$(216) and 4 check nodes 218, 220, 222, and 224. Here, the i-th column and the j-th row of the parity check matrix $H_1$ of the LDPC code respectively correspond to the variable node $x_i$ and the j-th check node. Further, the value of 1, that is, non-zero value, at a point where the j-th column and the j-th row of the parity check matrix $H_1$ of the LDPC code cross each other means existence of an edge connecting the variable node $x_i$ and the j-th check node with each other on the Tanner graph as shown in FIG. 2.

In the Tanner graph of the LDPC code, the degree of the variable node and the check node means the number of edges connected to the respective nodes, and this number is equal to the number of non-zero entries in the column or the row corresponding to the corresponding node in the parity check matrix of the LDPC code. For example, the degrees of the variable nodes $x_1$(202), $x_2$(204), $x_3$(206), $x_4$(208), $x_5$(210), $x_6$(212), $x_7$(214), and $x_8$(216) in FIG. 2 respectively become 4, 3, 3, 3, 2, 2, 2, and 2 in order, and the degrees of the check nodes 218, 220, 222, and 224 become 6, 5, 5, and 5 in order. Further, in the respective columns of the parity check matrix $H_1$ of FIG. 2 corresponding to the variable nodes of FIG. 2, the number of non-zero entries coincides with the above-described degrees 4, 3, 3, 3, 2, 2, 2, and 2 in order, and in the respective rows of the parity check matrix $H_1$ of FIG. 2 corresponding to the check nodes of FIG. 2, the number of non-zero entries coincides with the above-described degrees 6, 5, 5, and 5 in order.

The LDPC code can be decoded using an iterative decoding algorithm based on the sum-product algorithm on the bipartite graph enumerated in FIG. 2. Here, the sum-product algorithm is a kind of message passing algorithm, and such a message passing algorithm is an algorithm in which messages are exchanged through edges on the bipartite graph, and an output message is calculated and updated from the messages input to the variable nodes or the check nodes.

Here, the i-th encoding bit value can be determined based on the message of the i-th variable node. Both hard decision and soft decision are possible for the i-th encoding bit value. Accordingly, the performance of ci that is the i-th bit of the LDPC codeword corresponds to the performance of the i-th variable node of the Tanner graph, and this may be determined in accordance with the position and the number of 1 in the i-th column of the parity check matrix. In other words, the performance of $N_{ldpc}$ codeword bits of the codeword may be dominated by the position and the number of 1 of the parity check matrix, and this means that the performance of the LDPC code is greatly affected by the parity check matrix. Accordingly, in order to design the LDPC code having superior performance, there is a need for a method for designing a good parity check matrix.

For implementation of the parity check matrix used in the communication or broadcasting system, a quasi-cycle LDPC (QC-LDPC) code generally using a quasi-cyclic type parity check matrix is widely used.

The QC-LDPC code is featured to have a parity check matrix composed of zero matrices in the form of square matrices or circulant permutation matrices. In this case, the permutation matrix indicates a matrix in which all entries of the square matrix are 0 or 1 and each row or column includes only one 1. Further, the circulant permutation matrix means a matrix in which respective entries of an identity matrix are circularly shifted to the right.

Hereinafter, the QC-LDPC code will be described below.

First, a circulant permutation matrix $P=(P_{i,j})$ with L×L size is defined as in mathematical expression 2. Here, $P_{i,j}$ means an entry in the i-th row and in the j-th column of the matrix P (here, 0≤i, and j<L).

$$P_{i,j} = \begin{cases} 1 & \text{if } i+1 \equiv j \bmod L \\ 0 & \text{otherwise} \end{cases}$$

Mathematical expression 2

With respect to the permutation matrix P as defined above, $P^i$ (0≤i<L) is a circulant permutation matrix in the form in which respective entries of an identity matrix with L×L size are circularly shifted in the right direction as many as i-times.

The parity check matrix H of the simplest QC-LDPC code may be expressed in the form of mathematical expression 3 below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix}$$

Mathematical expression 3

If $P^{-1}$ is defined as a zero matrix with L×L size, each exponent $a_{i,j}$ of the circulant permutation matrix or the zero matrix in the mathematical expression 3 has one of {−1, 0, 1, 2, . . . , L−1} values. Further, since the parity check matrix H in the mathematical expression 3 has n column blocks and m row blocks, it has an mL×nL size.

If the parity check matrix in the mathematical expression 3 has a full rank, it is apparent that the size of information word bits of the QC-LDPC code corresponding to the parity check matrix becomes (n−m)L. For convenience, (n−m) column blocks corresponding to the information word bits are called column blocks, and m column blocks corresponding to the remaining parity bits are called parity column blocks.

In general, a binary matrix with m×n size obtained by respectively replacing each circulant permutation matrix and zero matrix by 1 and 0 in the parity check matrix of the mathematical expression 3 is called a mother matrix or a base matrix M(H), and an integer matrix with m×n size obtained by selecting exponents of each circulant permutation matrix and zero matrix as in mathematical expression 4 is called an exponential matrix E(H) of the parity check matrix.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix}$$

Mathematical expression 4

As a result, one integer included in the exponential matrix corresponds to the circulant permutation matrix in the parity check matrix, and thus for convenience, the exponential matrix may be expressed as sequences composed of integers (the above-described sequence may also be called an LDPC sequence or an LDPC code sequence in order to discriminate from other sequences). In general, the parity check matrix can be expressed as not only the exponential matrix but also a sequence having algebraically the same characteristics. In an embodiment of the disclosure, for convenience, the parity check matrix is expressed as the exponential matrix or the sequence indicating the position of 1 existing in the parity check matrix. However, there are various sequence notation methods capable of discriminating the position of 1 or 0 included in the parity check matrix, and thus the parity check matrix is not limited to methods expressed in the description, but may be expressed in various sequence forms representing algebraically the same effects.

Further, a transceiver on a device may perform LDPC encoding and decoding by directly generating the parity check matrix, or may perform the LDPC encoding and decoding using the exponential matrix or the sequence having algebraically the same effect as that of the parity check matrix in accordance with the features on implementation. Accordingly, although in an embodiment of the disclosure, the encoding/decoding using the parity check matrix has been described for convenience, it should be considered that the encoding/decoding can be implemented using various methods capable of obtaining the same effect as that of the parity check matrix.

For reference, algebraically the same effect means that it is possible to explain that two or more different expressions are completely equal to each other or are convertible with each other in logics or mathematics.

In an embodiment of the disclosure, it is described that, for convenience, one circulant permutation matrix corresponds to one block, but the disclosure can be applied to even a case where several circulant permutation matrices are included in one block. For example, if a sum of two circulant permutation matrices $P^{a_{ij}^{(1)}}, P^{a_{ij}^{(2)}}$ is included in one position of the i-th row block and the j-th column block, the exponential matrix may be expressed as in mathematical expression 6. In the matrix as in the mathematical expression 6, it can be known that two integers correspond to the i-th row and the j-th column corresponding to the row block and the column block including the sum of the plurality of circulant permutation matrices.

$$H = \begin{bmatrix} \ddots & \square & \square & \cdot{}^{\cdot{}^{\cdot}} \\ \square & P^{a_{ij}^{(1)}} + P^{a_{ij}^{(2)}} & \square & \square \\ \square & & \square & \square \\ \cdot{}^{\cdot{}^{\cdot}} & \square & \square & \ddots \end{bmatrix}$$ Mathematical expression 5

$$E(H) = \begin{bmatrix} \ddots & \square & \square & \cdot{}^{\cdot{}^{\cdot}} \\ \square & (a_{ij}^{(1)} + a_{ij}^{(2)}) & \square & \square \\ \square & & \square & \square \\ \cdot{}^{\cdot{}^{\cdot}} & \square & \square & \ddots \end{bmatrix}$$ Mathematical expression 6

As in the embodiment as described above, it is general that the QC-LDPC code is featured so that a plurality of circulant permutation matrices may correspond to one row block and one column block in the parity check matrix. In the disclosure, for convenience, only a case where one circulant permutation matrix corresponds to one block will be described, but the subject matter of the disclosure is not limited thereto. For reference, a matrix with L×L size in which a plurality of circulant permutation matrices are duplicate in one row block and one column block is referred to as a circulant matrix or circulant.

On the other hand, a mother matrix or a base matrix for the parity check matrix and the exponential matrix in the mathematical expressions 5 and 6 means a binary matrix obtained by respectively replacing each circulant permutation matrix and zero matrix by 1 and 0 in a similar manner to that of the definition used in the mathematical expression 3, and the sum of the plurality of circulant permutation matrices (i.e., a circulant matrix) included in one block is simply replaced by 1.

Since the performance of the LDPC code is determined in accordance with the parity check matrix, it is necessary to design the parity check matrix for the LDPC code having superior performance. Further, in order to various services in the system, an LDPC encoding or decoding method capable of supporting flexible input length and coding rate is necessary. In designing the LDPC code, not only the encoding performance and flexibility but also decoding efficiency becomes an important factor. In general, it is well known that the QC-LDPC code has structure advantageous to parallel decoding, and the parallel decoding is suitable to reduce latency due to the decoding by increasing decoding throughput. The parallel decoding of the QC-LDPC code can further maximize the decoding efficiency in accordance with the base matrix of the parity check matrix. In an embodiment of the disclosure, a base matrix structure capable of maximizing the decoding efficiency is proposed, and in addition, a method for designing the base matrix is proposed.

Figure 3:
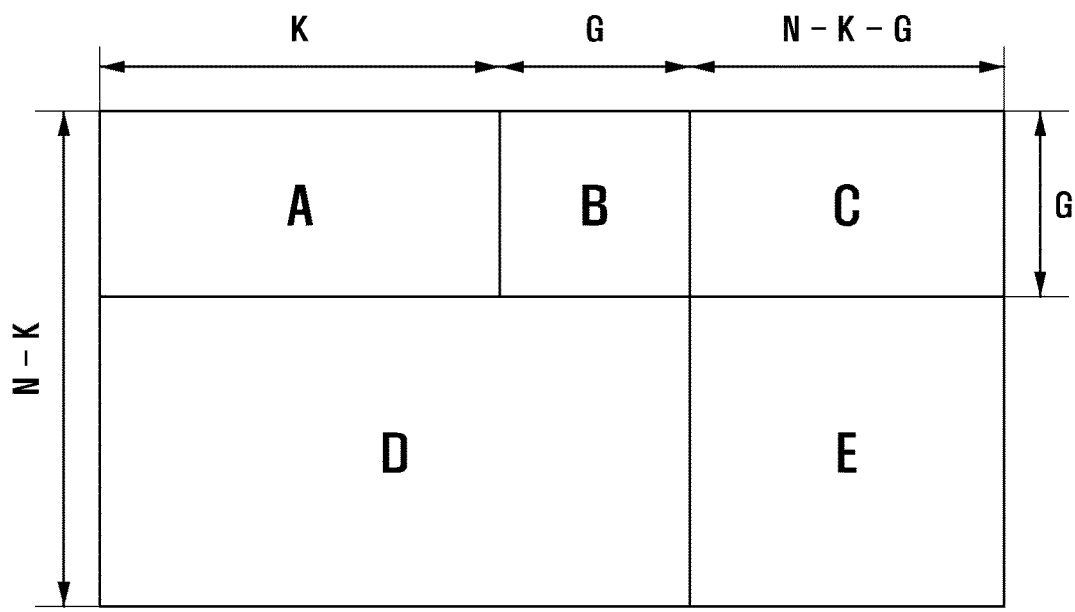
FIG. 3 is a diagram of a structure of a parity check matrix of an LDPC code according to an embodiment of the disclosure.

FIG. 3 is a diagram of a structure of a parity check matrix of an LDPC code according to an embodiment of the disclosure.

Referring to FIG. 3, a structure of a parity check matrix as shown in FIG. 3 will be described. In FIG. 3, parts of partial matrices A and D correspond to K information word bits, and remaining parts of partial matrices B and D correspond to G first parity bits. Partial matrices C and E correspond to (N-K-G) second parity bits. Generally, in an LDPC encoding/decoding system based on the parity check matrix having the structure of FIG. 3, C may be configured to a zero matrix, and E may be limited to an identity matrix or a lower triangular matrix. In an embodiment of the disclosure in order to support various multi-rates or a technology requiring high flexibility, such as incremental redundancy (IR) HARQ. In an embodiment of the disclosure, for convenience in explanation, only a case where E is an identity matrix will be described below, but the subject matter of the disclosure is not limited to the case where E is an identity matrix.

Figure 4A:
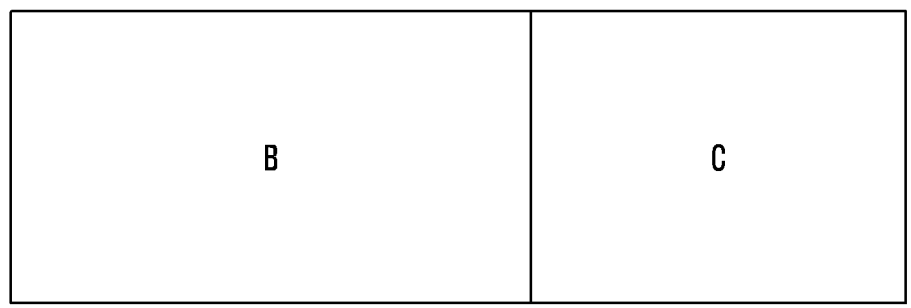

FIGS. 4A to 4C are diagrams of an exponential matrix according to various embodiments of the disclosure.

Referring to FIGS. 4A to 4C, an exponential matrix of FIG. 4A will be described below. For reference, FIGS. 4B and 4C are enlarged diagrams illustrating respective parts of the exponential matrix of FIG. 4A. Each part of FIG. 4A corresponds to a matrix in which matrices corresponding to drawing reference numerals described on the respective parts are combined. Accordingly, one exponential matrix as shown in FIG. 4A can be configured through combination of the parts of FIGS. 4B and 4C.

Figure 5:
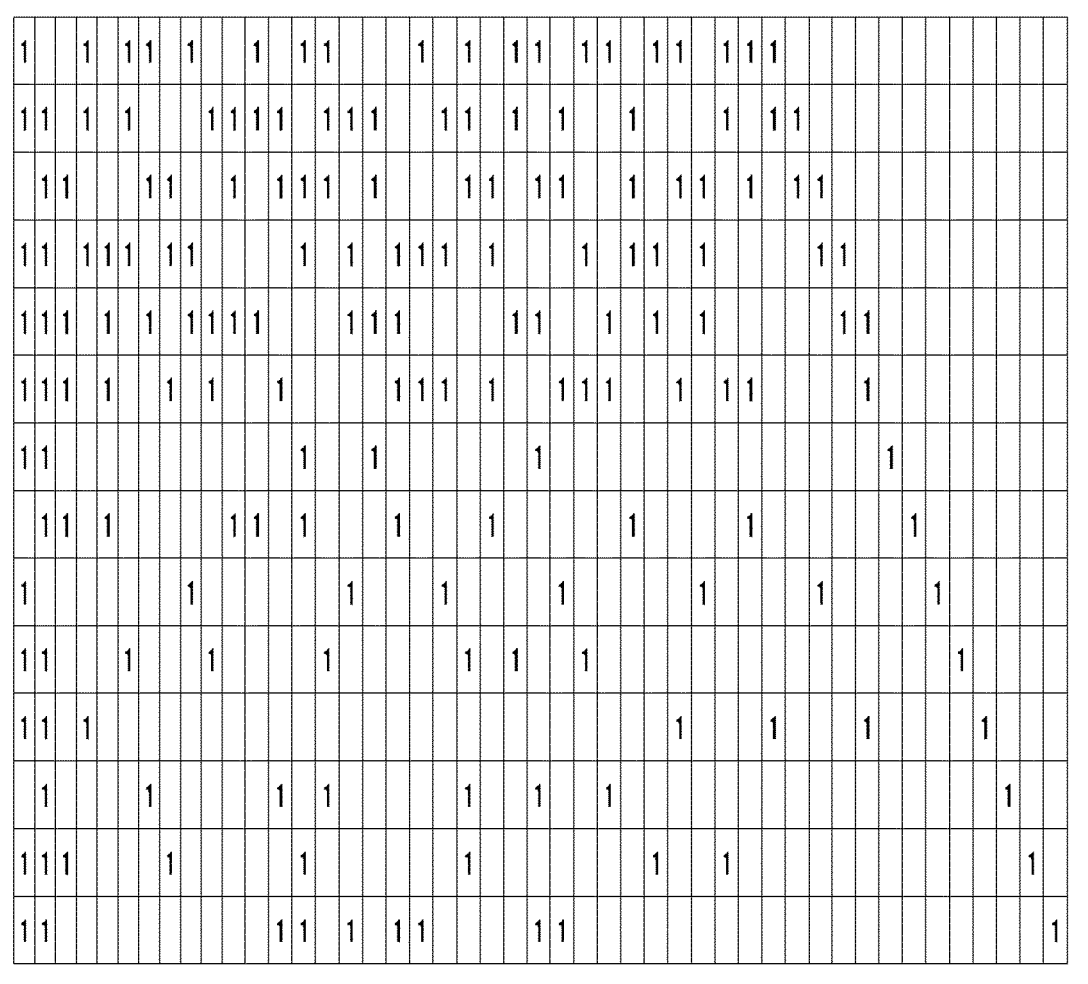

A base matrix for the exponential matrix of FIG. 4A is as shown in FIG. 5. In the exponential matrix of FIG. 4A, an empty subblock means a zero matrix having a size of Z×Z, and entry 0 means an identity matrix. Further, in the base matrix of FIG. 5, an empty block means that the entry is 0.

FIG. 5 is a diagram of an elementary matrix according to an embodiment of the disclosure.

Referring to FIG. 5, the position of the circulant matrix in each row block of FIG. 4A, that is, the position of 1 in each row of FIG. 5, may be summarized based on the column block to be exemplarily expressed as follows (first row starts as zeroth row).

...

Row-6: {0, 1, 13, 16, 23, 38}

Row-7: {1, 2, 4, 10, 11, 13, 17, 21, 27, 32, 39}

Row-8: {0, 8, 15, 19, 24, 30, 35, 40}

Row-9: {0, 1, 5, 9, 14, 20, 22, 25, 41}

Row-10: {0, 1, 3, 29, 33, 37, 42}

Row-11: {1, 6, 12, 14, 20, 23, 26, 43}

...

In general, in case where the LDPC decoder performs decoding of the LDPC code using one block parallel processor, the decoding is successively performed in the unit of blocks corresponding to the above-described positions in the respective row blocks. In case of using two or more block parallel processors, each processor performs successive decoding in the unit of a block properly divided from the respective row blocks. In this case, the blocks divided from the respective row blocks should be divided in a rule determined with respect to all the row blocks in accordance with the hardware implementation characteristics. For example, it may be considered that the LDPC decoder processes scheduling through two block parallel processors, as shown in FIG. 6, by dividing the circulant permutation matrices included in the respective row blocks into circulant permutation matrices corresponding to even column blocks and circulant permutation matrices corresponding to odd column blocks.

FIG. 6 is a diagram of scheduling to perform LDPC decoding using two block parallel processors with respect to a parity check matrix having the elementary matrix of FIG. 5 according to an embodiment of the disclosure FIG. 6 illustrates an example of scheduling enumerating positions of blocks corresponding to one circulant permutation matrix processed by the respective processors in the flow order. For example, processor 0 processes row-6 in the order of zeroth, $16^{th}$, and $38^{th}$ blocks, and then processes row-7 in the order of second, fourth, $10^{th}$, $32^{nd}$, and $39^{th}$ blocks.

Referring to FIG. 6, in accordance with a determined rule, the first processor processes only the circulant permutation matrices positioned in the even column blocks, and the second processor processes only the circulant permutation matrices positioned in the odd column blocks. Here, it is assumed that the column blocks having the degree of 1 does not follow the above-described rule, and in order to minimize an idle time of the respective processors, a proper processor can selectively process the corresponding column blocks.

Even if the LDPC decoder designed in the above-described rule using two block parallel processors can properly arrange the blocks corresponding to the column block having the degree of 1, the idle time of a specific processor may become long like a case of row-10 in FIG. 6. Since inefficiency of such a process finally increases the overall processing time, decoding throughput per hour is reduced, and thus this may cause decoding delay as a result. In other words, in case of normally performing decoding using two or more block parallel processors, it is required for the respective processors to divide blocks included in the respective row blocks (i.e., circulant permutation matrices) into sets as many as the number of processors through a proper rule so as to well allocate the blocks to be processed by the respective processors.

However, it is generally difficult to divide the blocks as many as the number of processors through the proper rule as described above after designing a base matrix for the parity check matrix of the LDPC code without considering the use of two or more block parallel processors. In particular, it is much more difficult to do so in a situation where it is not known whether the LDPC decoder is to use two, three, or four block parallel processors.

The disclosure proposes a method for designing a base matrix capable of maximizing the decoding efficiency based on the use of two or more block parallel processors by limiting the position of the circulant permutation matrix in the exponential matrix, that is, by limiting the position of entry 1 in the base matrix, based on the use of a plurality of block parallel processors.

First, if it is assumed that a base matrix to be designed is given as a matrix of FIG. 3, it may be considered that the size of A is g×k, the size of B is g×g, the size of D is (n−k−g)×(k+g), and the size of E is (n−k−g)×(n−k−g). For convenience in explanation, in the following embodiment of the disclosure, a case where C is a zero matrix and E is an identity matrix will be described, but basically, the method proposed in an embodiment of the disclosure is not necessary to be limited thereto.

The main subject of the disclosure is to propose a method for designing a base matrix so that position indexes for each entry 1 of each row in the base matrix is divided into sets in which the numbers of entries are similar to each other in accordance with a predetermined rule based on the use of a plurality of block parallel processors. For convenience, such division of the position indexes for each entry 1 of each row in the base matrix into sets in which the numbers of entries are similar to each other in accordance with the predetermined rule is called balancing. In other words, the balancing means maximally uniform allocation in allocating each entry 1 for each row to two or more sets in accordance with the predetermined rule.

In this case, if a difference between the numbers of entries 1 of the row allocated to the two or more sets is equal to or smaller than 1, it is called perfect balancing, whereas if a difference between the numbers of entries 1 of the row allocated to the two or more sets is equal to or smaller than 2, it is called weakly balancing.

In other words, the balancing means maximally uniform classification of entries 1 of the respective rows into two or more groups in accordance with the predetermined rule. In this case, if the difference between the numbers of entries 1 included in the two or more groups is equal to or smaller than 1, it is referred to as perfect balancing achieved, whereas if the difference between the numbers of entries 1 of the row allocated to the two or more sets is equal to or smaller than 2, it is referred to as weakly balancing achieved.

Further, in other words, in expressing the balancing, the base matrix balancing may mean that entries 1 of the respective rows may be classified into two or more groups or sets in accordance with the predetermined rule, and a case where the difference between the numbers of entries 1 included in the respective groups or sets or the difference between the numbers of their indexes is equal to or smaller than 1 may be expressed as a base matrix satisfying the perfect balancing, whereas a case where the difference is equal to or smaller than 2 may be expressed as a base matrix satisfying the weakly balancing.

On the other hand, in an embodiment of the disclosure, the balancing having different characteristics, such as perfect balancing, weakly balancing, and strongly balancing, may be expressed using terms of first balancing, second balancing, and third balancing. The base matrix designed as above serves to reduce the idle time when the LDPC decoding is performed based on the position indexes corresponding to the respect sets using the block parallel processors the number of which corresponds to the number of sets. Here, it is apparent that the position indexes can have the numbers 0 to (n−1).

Prior to the design of the base matrix, it is assumed that the possible number of block parallel processors to be used when the LDPC decoding is performed using the parity check matrix of the LDPC code having the corresponding base matrix corresponds to $q_1, q_2, \ldots, q_P$. In other words, it is assumed that the base matrix is designed based on all cases where $q_1, q_2, \ldots, q_P$ block parallel processors are used. If it is assumed that the LDPC decoding is performed using $q_i$ (i=1, 2, . . . , P) block processors, in order to minimize the idle time, position indexes $j_1, j_2, \ldots, j_d$ of each 1 with respect to the row having the degree of d in the base matrix should be divided into $q_i$ partial matrices having maximally the same number of entries. This should be established in the same manner with respect to all rows.

Embodiments satisfying such characteristics are as follows.

First, as described in mathematical expression 7, $q_l$ sets are defined with respect to l=1, 2, . . . , P.

$$S_i = \{x | x \equiv i (\bmod\ q_l), x = 0, 1, \ldots n-1\},$$

$i = 0, 1, 2, \ldots, q_l - 1$      Mathematical expression 7

To help understanding, a simple example of the mathematical expression 7 is expressed in mathematical expression 8 below.

i) when defined as $q_1 = 2$ $$S_0 = \{x | x \equiv 0 (\bmod\ 2), x = 0, 1, \ldots 45\} = \{0, 2, 4, 8, \ldots, 42, 44\}$$

$$S_1 = \{x | x \equiv 1 (\bmod\ 2), x = 0, 1, \ldots 45\} = \{1, 3, 5, 7, \ldots, 43, 45\}$$

ii) when defined as $q_2 = 3$ $$S_0 = \{x | x \equiv 0 (\bmod\ 3), x = 0, 1, \ldots 45\} = \{0, 3, 6, \ldots, 42, 45\}$$

$$S_1 = \{x | x \equiv 1 (\bmod\ 3), x = 0, 1, \ldots 45\} = \{1, 4, 7, \ldots, 40, 43\}$$

$$S_2 = \{x | x \equiv 2 (\bmod\ 3), x = 0, 1, \ldots 45\} = \{2, 5, 8, \ldots, 41, 44\}$$

iii) when defined as $q_3 = 4$ $$S_0 = \{x | x \equiv 0 (\bmod\ 4), x = 0, 1, \ldots 45\} = \{0, 4, 8, \ldots, 40, 44\}$$

$$S_1 = \{x | x \equiv 1 (\bmod\ 4), x = 0, 1, \ldots 45\} = \{1, 5, 9, \ldots, 41, 45\}$$

$$S_2 = \{x | x \equiv 2 (\bmod\ 4), x = 0, 1, \ldots 45\} = \{2, 6, 10, \ldots, 38, 42\}$$

$$S_3 = \{x | x \equiv 3 (\bmod\ 4), x = 0, 1, \ldots 45\} = \{3, 7, 11, \ldots, 39, 43\}$$      Mathematical expression 8

($q_1$=In case of definition as 2 sets, $q_2$=In case of definition as 3 sets, $q_3$=In case of definition as 4 sets)

In the mathematical expressions 7 and 8, there may be various methods for defining $q_1$ sets. In an embodiment of the disclosure, for convenience in explanation, examples expressed in the mathematical expressions 7 and 8 will be described. However, the scope of the disclosure is not limited thereto, and in case of generally defining $q_1$ sets, it is not necessary for the respective sets to have the same number of entries, but may be properly defined as needed. However, the respective sets $S_i$ should always have different entries.

In the base matrix, information on the position of 1 in each row may be expressed as an index set as expressed in mathematical expression 9.

$Ind(i) = \{w(i,j) | j = 0, 1, \ldots, d_i - 1\}, i = 0, 1, \ldots$      Mathematical expression 9

Here, w(i, j) means a position of a column in which the j-th 1 of the i-th row exists, and $d_i$ means the degree of the i-th row.

To help understanding, a simple example of the mathematical expression 9 is expressed in mathematical expression 10 below with reference to FIG. 5.

$Ind(6) =$      Mathematical expression 10

$\{w(6, 0) = 0, w(6, 1) = 1, w(6, 2) = 13,$ $w(6, 3) = 16, w(6, 4) = 23, w(6, 5) = 38\}$ $Ind(10) = \{w(10, 0) = 0,$ $w(10, 1) = 1, w(10, 2) = 3,$ $w(10, 3) = 29, w(10, 4) = 33,$ $w(10, 5) = 37, , w(10, 6) = 42\}$

Index sets expressed in the mathematical expression 9 may be divided into $q_1$ partial sets satisfying mathematical expression 11 below without having common entries (l=1, 2, . . . , P).

$R(i,j) = \{x | x \in Ind(i) \cap S_j\},$ $i = 0, 1, \ldots, N-K-1, j = 0, 1, \ldots, q_l - 1$      Mathematical expression 11

Here, $S_j$ and Ind(i) are sets respectively defined in the mathematical expressions 7 and 9.

It is to be noted that in the mathematical expression 7, for convenience in explanation, respective sets $S_j$ have almost the same number of entries, and are simply divided based on a modulo operation. However, in general, it does not matter if the numbers of entries are greatly different from each other and if the entries are divided on more complicated conditions. However, the different sets $S_j$ should be disjoint without having common entries.

In an embodiment of the disclosure, if the set R(i, j) defined in the mathematical expression 11 satisfies conditions of mathematical expression 12 below, it is called that the weight distribution of the base matrix as expressed in the mathematical expression 9 is perfectly balanced.

Index sets defined in mathematical expression 9 always satisfy the followings with respect to $j_1 \neq j_2, (0 \leq j_1, j_2 < q_l)$.

$||R(i,j_1)| - |R(i,j_2)|| \leq 1, i = 0, 1, \ldots, N-K-1$      Mathematical expression 12

In the base matrix satisfying the conditions expressed in the mathematical expression 12, it can be known that the idle time is minimized in case where the j-th processors among $q_1$ block parallel processors successively perform the LDPC decoding with respect to the circulant permutation matrix in a position included in R(i, j).

However, it is difficult to design a base matrix satisfying the condition expressed in the mathematical expression 12. This is because in designing a good base matrix, distribution of the number of 1 in each row and column of the base matrix or the parity check matrix and the cyclic characteristics on the Tanner graph exert influences as important factors. For example, it is very difficult to design a base matrix satisfying god weight distribution, good cyclic characteristics, and conditions expressed in the mathematical expression 12 at the same time.

Due to the above-described reason, with respect to the conditions on the index sets defined in the mathematical expression 12, it is called that the weight distribution of the base matrix satisfying somewhat eased conditions as expressed in mathematical expression 13 below is weakly balanced.

Index sets defined in mathematical expression 9 always satisfy the followings with respect to $j_1 \neq j_2, (0 \leq j_1, j_2 < q_l)$.

$||R(i,j_1)| - |R(i,j_2)|| \leq 2, i = 0, 1, \ldots, N-K-1$.      Mathematical expression 13

Even in case where the weight distribution of the base matrix satisfying the conditions in the mathematical expression 13 is weakly balanced, the idle time is greatly reduced when the LDPC decoding is performed using a plurality of processors. However, it is apparent that this case is inefficient as compared with the perfectly balanced case. In this case, however, due to the eased conditions, it becomes easy to design the base matrix for god parity check matrix based on the encoding performance of the LDPC code.

A method is proposed, in which it is somewhat simple to design a good base matrix in simultaneous consideration of the perfectly balanced case and the weakly balanced case, and the idle time can be greatly reduced during the LDPC decoding using a plurality of processors.

First, index sets defined in the mathematical expression 9 will be newly defined as in mathematical expression 13 below.

$$Ind(i)=\{w(i,j)|j=0,1,\ldots,d_i-1\}, i=0,1,\ldots \quad \text{Mathematical expression 14}$$

Here, w(i, j) means a position of a column, in which the j-th 1 of the i-th row exists, excluding a column having the degree of 1, and $d_i$ means the degree of the i-th row, excluding entries in the column having the degree of 1.

In an embodiment of the disclosure, if the set R(i, j) defined in the mathematical expression 11 from the index sets defined in the mathematical expression 14 satisfies conditions of mathematical expression 15 below, it is called that the weight distribution of the base matrix as expressed in the mathematical expression 9 is strongly balanced.

Index sets defined in mathematical expression 14 always satisfy the followings with respect to $j_1 \neq j_2, (0 \leq j_1, j_2 < q_l)$.

$$||R(i,j_1)|-|R(i,j_2)|| \leq 2, i=0,1,\ldots,N-K-1 \quad \text{Mathematical expression 15}$$

In the mathematical expression 15, it is considered that the columns having the degree of 1 are excluded from the mathematical expression 14. This is because it is easy to freely allocate the columns having the degree of 1 to block parallel processors as compared with other columns. The feature of the strongly balancing expressed in the mathematical expression 15 will now be described below.

Basically, the strongly balancing expressed in the mathematical expression 15 has the similar characteristic to the weakly balancing that can be expressed as in the mathematical expression 13. However, the strongly balancing is greatly different from the weakly balancing on the point that entry 1 corresponding to a column having the degree of 1 is excluded in classifying entries 1 of respective rows of the base matrix into two or more sets or groups. In other words, the strongly balancing means maximally uniform allocation of remaining entries 1 excluding entry 1 corresponding to a column having the degree of 1 from each row to two or more sets in accordance with a predetermined rule. In this case, if the difference between the numbers of entries 1 to be allocated to the two or more sets is equal to or smaller than 2, it is referred to as strongly balancing achieved. Further, in other words, in expressing the strongly balancing, it means maximally uniform classification of remaining entries 1 excluding entry 1 corresponding to a column having the degree of 1 from each row into two or more groups in accordance with a predetermined rule. In this case, if the difference between the numbers of entries 1 to be included in the two or more groups is equal to or smaller than 2, it is referred to as strongly balancing achieved. In other words, the strongly balancing of the base matrix means that remaining entries 1 excluding entry 1 corresponding to a column having the degree of 1 from each row can be classified into two or more groups or sets in accordance with a predetermined rule. In this case, if the difference between the numbers of entries 1 to be included in the respective groups or sets or the difference between the numbers of their indexes is equal to or smaller than 2, it is referred to as the base matrix satisfying the strongly balancing condition as expressed in the mathematical expression 15. Accordingly, in case where the strongly balancing condition as expressed in the mathematical expression 15 is satisfied, the strongly balancing has the characteristic that is very close to the characteristic of the perfect balancing as defined in the mathematical expression 12 through proper allocation of circulant permutation matrices corresponding to columns having the degree of 1 to processors, and thus the idle time of the processors can be greatly reduced.

Figure 7:
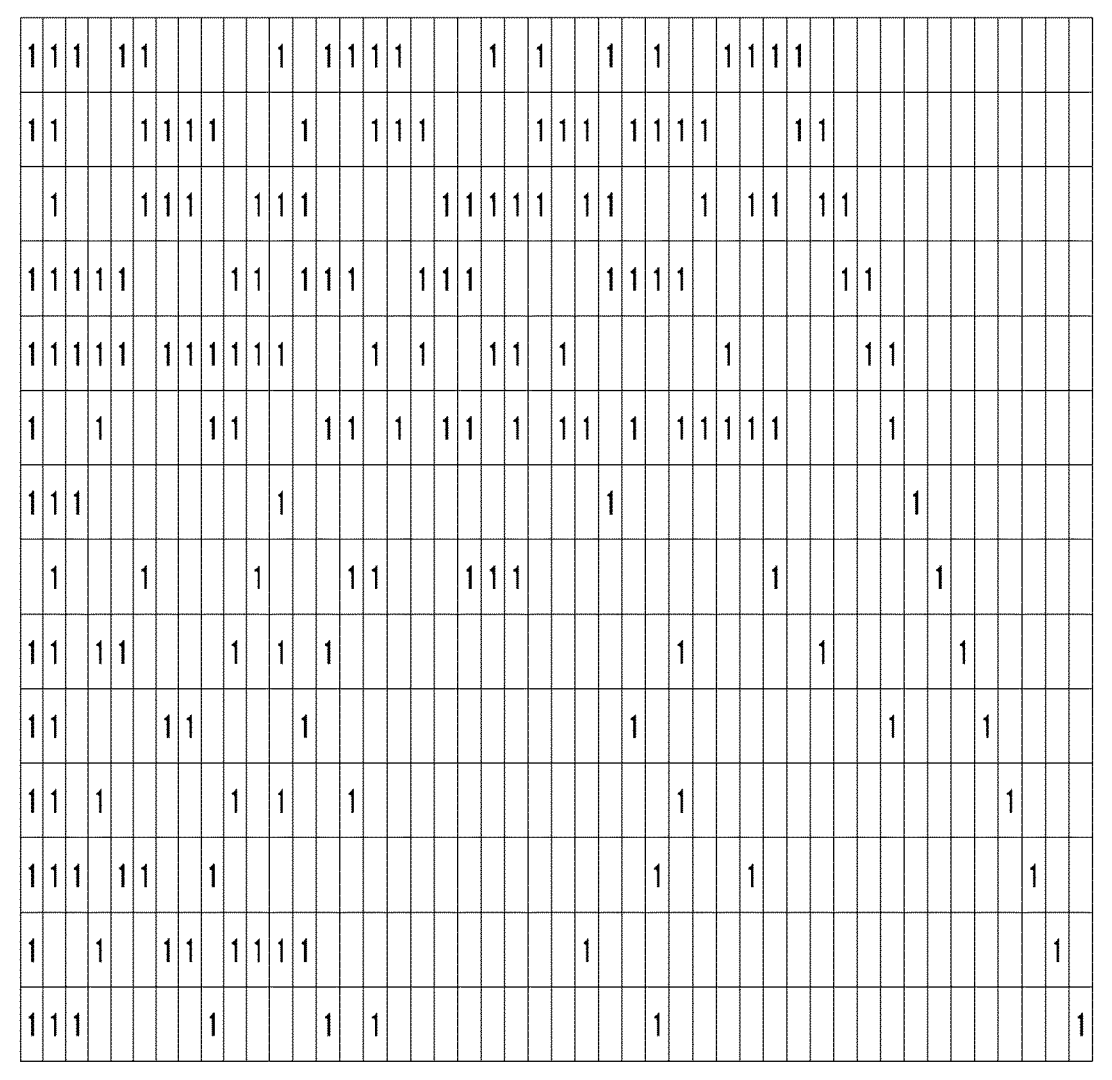

FIG. 7 is a diagram of an elementary matrix according to an embodiment of the disclosure.

Referring to FIG. 7, to help understanding, as a detailed embodiment of the disclosure, a base matrix illustrated in FIG. 7 will be described. In the base matrix of FIG. 7, it is to be noted that an empty block means that an entry is 0.

The position (i.e., a position of a column block in which the circulant permutation matrix is positioned in an actual parity check matrix) in which 1 exists in each row of FIG. 7 may be summarized based on the column block to be exemplarily expressed as follows (first row starts as zeroth row).

...

Row-6: {0, 1, 2, 11, 25, 38}

Row-7: {1, 5, 10, 14, 15, 19, 20, 21, 32, 39}

Row-8: {0, 1, 3, 4, 9, 11, 13, 28, 34, 40}

Row-9: {0, 1, 6, 7, 12, 26, 37, 41}

Row-10: {0, 1, 3, 9, 11, 14, 28, 42}

Row-11: {0, 1, 2, 4, 5, 8, 27, 31, 43}

...

Based on a case where an LDPC decoding is performed with respect to a parity check matrix having the base matrix of FIG. 7 using two block parallel processors, sets defined in the mathematical expressions 7, 11, and 14 may be summarized to be expressed as in mathematical expression 16 below.

$$S_0 = \{x \mid x \equiv 0 (\mathrm{mod} 2), x = 0, 1, \ldots 45\},$$
$$S_1 = \{x \mid x \equiv 1 (\mathrm{mod} 2), x = 0, 1, \ldots 45\},$$
$$\ldots$$
$$Ind(6) = \{0, 1, 2, 11, 25\},$$

Mathematical expression 16

-continued $Ind(7) = \{1, 5, 10, 14, 15, 19, 20, 21, 32\}$, $Ind(8) = \{0, 1, 3, 4, 9, 11, 13, 28, 34\}$, $Ind(9) = \{0, 1, 6, 7, 12, 26, 37\}$, $Ind(10) = \{0, 1, 3, 9, 11, 14, 28\}$, $Ind(11) = \{0, 1, 2, 4, 5, 8, 27, 31\}$,

...

$R(6, 0) = \{0, 2, 38\}$, $R(6, 1) = \{1, 11, 25\}$ $R(7, 0) = \{10, 14, 20, 32\}$, $R(7, 1) = \{1, 5, 15, 19, 21\}$ $R(8, 0) = \{0, 4, 28, 34\}$, $R(8, 1) = \{1, 3, 9, 11, 13\}$ $R(9, 0) = \{0, 6, 12, 26\}$, $R(9, 1) = \{1, 7, 37\}$

...

Referring to FIG. 7 and the mathematical expression 16, it can be identified that the base matrix of FIG. 7 satisfies the mathematical expression 15, and thus it is the strongly balanced base matrix. Accordingly, it may be considered that the LDPC decoder processes scheduling through two block parallel processors, as shown in FIG. 8, by dividing the circulant permutation matrices included in the respective row blocks into circulant permutation matrices corresponding to even column blocks and circulant permutation matrices corresponding to odd column blocks.

FIG. 8 is a diagram of scheduling to perform LDPC decoding using two block parallel processors with respect to a parity check matrix having the elementary matrix of FIG. 7 according to an embodiment of the disclosure.

FIG. 8 illustrates an example of scheduling enumerating positions of blocks corresponding to one circulant permutation matrix processed by the respective processors in the flow order. For example, processor 0 processes row-6 in the order of zeroth, second, and $38^{th}$ blocks, and then processes row-7 in the order of $10^{th}$, $14^{th}$, $20^{th}$, and $32^{nd}$ blocks. In this case, it can be identified that the circulant permutation matrices corresponding to column blocks having the degree of 1 are properly arranged in the respective processors. For example, it corresponds to a case where when the processor-0 processes row-7, the circulant permutation matrix of the $39^{th}$ column block is processed.

Referring to FIG. 8, it can be known that the idle time of each processor has been minimized. In case of actually designing the base matrix to satisfy the strongly balancing condition of the mathematical expression 15, it becomes easy to design the base matrix almost close to the perfect balancing condition of the mathematical expression 12.

In case of FIG. 8, a case where the number of block parallel processors of the LDPC decoder is 2 and a case where the number of the processors is 4 are simultaneously considered in designing the base matrix. For example, on the assumption of 4 processors with respect to the base matrix of FIG. 8, sets defined in the mathematical expressions 7 and 11 are summarized again as follows.

$S_0 = \{x \mid x \equiv 0 \pmod 4, x = 0, 1, \ldots 45\}$, $S_1 = \{x \mid x \equiv 1 \pmod 4, x = 0, 1, \ldots , 45\}$, $S_2 = \{x \mid x \equiv 2 \pmod 4, x = 0, 1, \ldots , 45\}$, $S_3 = \{x \mid x \equiv 3 \pmod 4, x = 0, 1, \ldots , 45\}$, -continued

...

$R(6, 0) = \{0\}$, $R(6, 1) = \{1, 25\}$, $R(6, 2) = \{2\}$, $R(6, 3) = \{11\}$ $R(7, 0) = \{20, 32\}$, $R(7, 1) = \{1, 5, 21\}$, $R(7, 2) = \{10, 14\}$, $R(7, 3) = \{15, 19\}$ $R(8, 0) = \{0, 4, 28\}$, $R(8, 1) = \{1, 9, 13\}$, $R(8, 2) = \{34\}$, $R(8, 3) = \{3, 11\}$ $R(9, 0) = \{0, 12\}$, $R(9, 1) = \{1, 37\}$, $R(9, 2) = \{6, 26\}$, $R(9, 3) = \{7\}$

...

As described above, in designing the base matrix having the perfect balanced, weakly balanced, or strongly balanced weight distribution, it can be known that the design basis of the base matrix is changed in accordance with the number of block parallel processors being considered. In the embodiment of FIG. 8, the strongly balancing condition is satisfied simultaneously with respect to a case where two block processors are used and a case where four block processors are used.

If $q_1$ sets are defined in the mathematical expression 7, the base matrices satisfying the balancing condition presented in the mathematical expressions 12, 13, and 15 express, for convenience, to satisfy perfect $q_1$-balancing, weakly $q_1$-balancing, and strongly $q_1$-balancing, respectively. For example, the base matrix of FIG. 8 may simultaneously satisfy weakly 2-balancing and weakly 4-balancing, or may simultaneously satisfy 2-balancing and 4-balancing.

If the number of block parallel processors to be used in the LDPC decoder is unclear, and respective balancing conditions are satisfied in simultaneous consideration of cases where $(q_1, q_2, \ldots, q_P)$ processors are used, they are expressed as, for convenience, perfect $(q_1, q_2, \ldots, q_P)$-balancing, weakly $(q_1, q_2, \ldots, q_P)$-balancing, and strongly $(q_1, q_2, \ldots, q_P)$-balancing.

In an embodiment of the disclosure as described above, the sets Si are divided based on a specific rule, for convenience, using modulo, but are not limited thereto. The division of Si may be properly irregularly defined in accordance with the requirements of the system, and the number of entries of each set may differ. However, the respective sets Si should have different entries to maintain the disjoint characteristics.

In an embodiment of the disclosure, as a method for designing a base matrix of another LDPC code to minimize an idle time in case of using two or more block parallel processors, partial windowing-orthogonal conditions will be described.

Figure 9A:
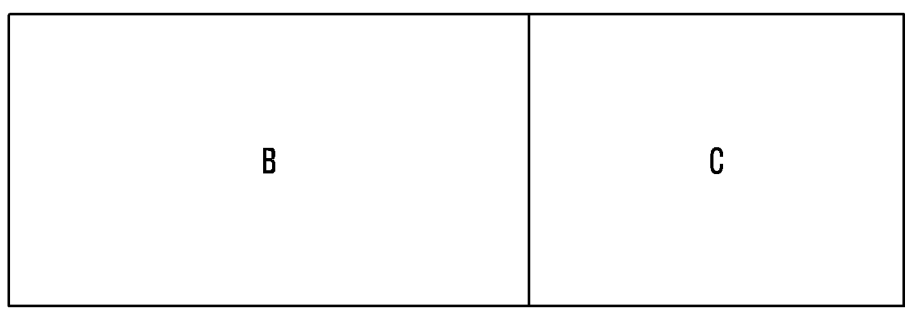
Figure 9C:
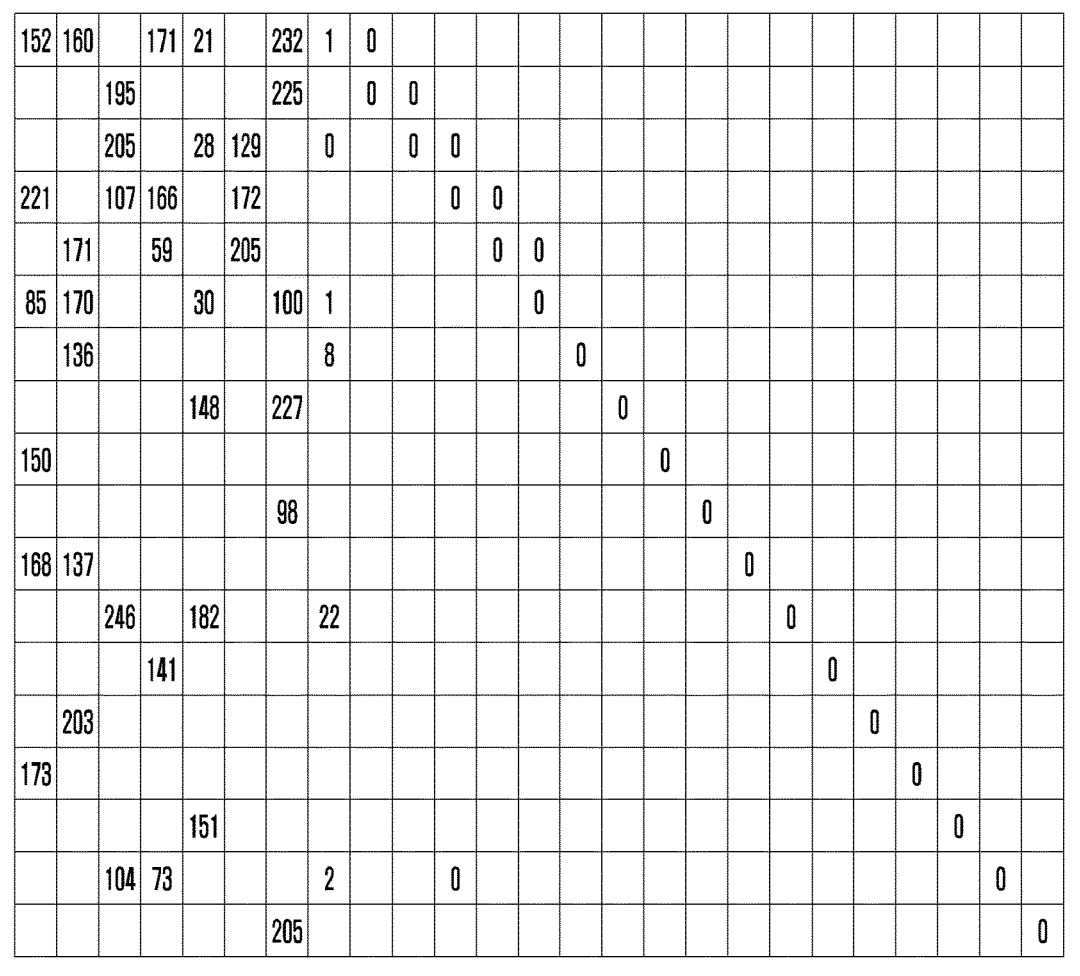

First, the structure of a base matrix or an exponential matrix suitable to the existing well-known layered decoding will be briefly described based on FIGS. 9A to 9C. For reference, FIGS. 9B and 9C are enlarged diagrams of respective parts divided from the exponential matrix of FIG. 9A. Respective parts of FIG. 9A correspond to matrices in which matrices corresponding to drawing reference numerals described for the respective parts are combined. Accordingly, one exponential matrix as shown in FIG. 9A may be configured through combination of parts as illustrated in FIGS. 9B and 9C.

FIGS. 9A to 9C are diagrams of an exponential matrix according to various embodiments of the disclosure.

Referring to FIGS. 9A to 9C, it can be known that the $6^{th}$, $7^{th}$, and $8^{th}$ rows are orthogonal to each other. Here, the orthogonality means that a circulant permutation matrix does not exist in the same column block position in each row. For example, maximally 1 circulant permutation matrix exists in each column block of the selected $6^{th}$, $7^{th}$, and $8^{th}$ rows. In the same manner, the $9^{th}$, $10^{th}$, $11^{th}$, and $12^{th}$ rows are orthogonal to each other, and the $13^{th}$, $14^{th}$, $15^{th}$, $16^{th}$, and $17^{th}$ rows are also orthogonal to each other. However, the $12^{th}$ and $13^{th}$ rows are not orthogonal to each other (refer to the $3^{rd}$ row block).

The orthogonal structure as described above is a structure suitable to the layered decoding, that is, the decoding based on row parallel processors. The row parallel processor generally corresponds to a method for performing decoding with respect to the whole row block, and generally has a larger size and higher complexity than those of the block parallel processor, but can perform quick decoding as compared with the block parallel processor. In the decoding based on row parallel processors, decoding can be performed considering rows having the orthogonal structure as one row, and thus very quick decoding becomes possible. For example, the row parallel processors can perform decoding of the $6^{th}$, $7^{th}$, and $8^{th}$ row blocks having the orthogonal structure as one row block. The row blocks having the orthogonal structure may be considered as one row block which is called an effective row block. The layered decoding is featured so that a plurality of row blocks included in such an effective row block are orthogonal to each other, but the row blocks between the effective row blocks are not orthogonal to each other. For example, the $12^{th}$ and $13^{th}$ row blocks are included in different effective row blocks, and thus are not orthogonal to each other.

When the LDPC decoder based on the block parallel processors performs decoding using two or more processors, a structure that is somewhat different from the above-described orthogonal structure is suitable to increase the decoding efficiency.

In an embodiment of the disclosure, a partial windowing-orthogonal structure is proposed. First, a windowing-orthogonal structure will be briefly described.

If there is a base matrix satisfying p windowing-orthogonal structures, this means that if p row blocks are successively selected, they always satisfy the orthogonal structure. In other words, when selecting the i-th, (i+1)-th, . . . , (i+p−1)-th row blocks, the p row blocks are always orthogonal to each other. The base matrix having the p windowing-orthogonal structures as described above provides very high decoding efficiency during the LDPC decoding based on not only the block parallel processor but also the row parallel processor. However, this is a very strong limit condition with respect to the base matrix, and thus deterioration of the encoding performance of the LDPC code may be easily caused. Accordingly, in the LDPC encoding/decoding system using the parity check matrix structure as shown in FIG. 3, an orthogonal structure for a plurality of row blocks is not considered normally with respect to the partial matrix [A B] part, but the orthogonal structure is considered only with respect to the partial matrix of the base matrix corresponding to the partial matrix [D E] or a part of the [D E] in the parity check matrix of FIG. 3. It can be easily known that the exponential matrix suitable to the layered decoding presented in FIG. 9 has the orthogonal structure only with respect to the part corresponding to the partial matrix [D E] of FIG. 3.

However, the orthogonal structure corresponding to the partial matrix [D E] or the part thereof may also greatly restrict the degree distribution of the LDPC code to deteriorate the LDPC encoding performance. In order to address this issue, the orthogonal structure is not limited with respect to specific predetermined row blocks. For example, referring to the base matrix of FIG. 7, no orthogonality is considered for the partial matrix [D E] with respect to two front column blocks. This may somewhat lower the decoding efficiency, but greatly improve the encoding performance. As described above, the orthogonality is considered with respect to the remaining part excluding specific row blocks (or rows) and column blocks (or columns) in the whole parity check matrix or its base matrix, and if the p row blocks are always orthogonal to each other when the i-th, (i+1)-th, . . . , (i+p−1)-th row blocks are selected with respect to the remaining part, it is called a parity check matrix or base matrix satisfying the p partial windowing-orthogonal structures.

Referring to FIG. 7, as for the remaining part matrices excluding 6 upper rows and two front columns in the base matrix of FIG. 7, two adjacent rows always have orthogonality. Accordingly, FIG. 7 means the basic matrix satisfying 2 partial windowing-orthogonal structures.

In summary, if the remaining partial matrix excluding specific rows and columns with respect to a given base matrix satisfies the p windowing-orthogonal structures, it is called that the base matrix satisfies the p partial windowing-orthogonal structure.

In designing the base matrix satisfying the p partial windowing-orthogonal structure, in many cases, as shown in FIG. 7, the orthogonality is not considered with respect to the structure corresponding to [A B] in FIG. 3, and the partial window orthogonality is considered only with respect to a case corresponding to [D E] and excluding specific column blocks, but is not limited thereto.

As a result, the apparatus and the method for LDPC encoding and decoding using the parity check matrix having the base matrix satisfying the balancing characteristics and the partial windowing-orthogonal structure proposed in an embodiment of the disclosure are featured to improve the encoding performance and to maximize the decoding efficiency based on the LDPC decoding using two or more block parallel processors.

Figure 10:
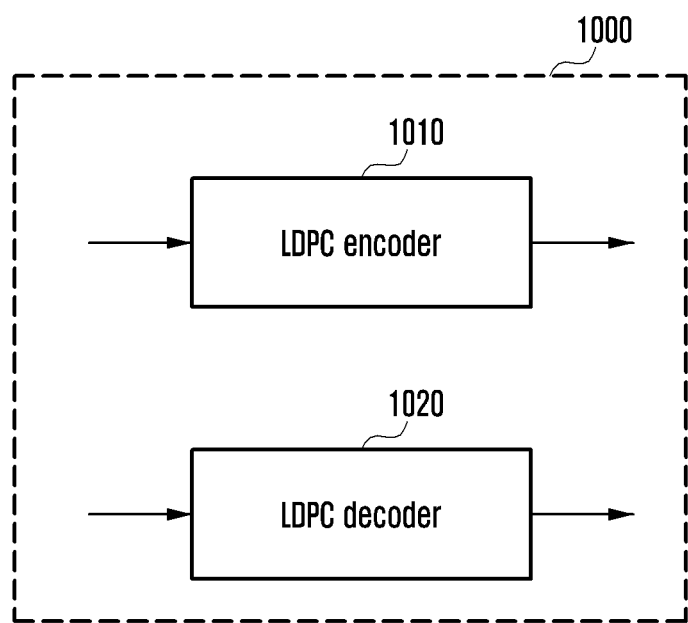
FIG. 10 is a block diagram illustrating a configuration of a transmitting/receiving device according to an embodiment of the disclosure.

FIG. 10 is a block diagram illustrating a configuration of transmitting/receiving device according to an embodiment of the disclosure.

Referring to FIG. 7, $K_{ldpc}$ bits may configure $K_{ldpc}$ LDPC information word bits $$I = (i_0, i_1, \ldots, i_{K_{ldpc}-1})$$

for an LDPC encoder 1010 of a decoding device 1000. The LDPC encoder 1010 may perform systematic LDPC encoding of $K_{ldpc}$ LDPC information word bits, and may generate an LDPC codeword composed of $N_{ldpc}$ bits $\Lambda =$ (c0, c1, . . . , $c_{Nldpc-1}$)=($i_0$, $i_1$, . . . , $i_{Kldpc-1}$, $p_0$, $p_1$, . . . , $p_{Nldpc-Kldpc-1}$).

As described above in the mathematical expression 1, the method for LDPC encoding includes determining a codeword so that a multiplication of the LDPC codeword and the parity check matrix becomes a zero vector.

Referring to FIG. 10, an encoding device includes the LDPC encoder 1010, and the LDPC encoder 1010 may generate an LDPC codeword by performing LDPC encoding with respect to input bits based on the parity check matrix or the corresponding exponential matrix or sequence. In this case, the LDPC encoder 1010 may perform the LDPC encoding using the parity check matrices differently defined in accordance with the code rate (i.e., a code rate of the LDPC code).

A normal QC LDPC code includes identifying a size of input bits to be encoded, determining a block size Z suitable to the corresponding input bits, and performing LDPC encoding based on the LDPC matrix and the determined block size. A decoding process includes a similar process corresponding to that as described above.

On the other hand, the encoding device may further include a memory (not illustrated) for storing therein information on a coding rate of an LDPC code, codeword length, and a parity check matrix, and the LDPC encoder 1010 may perform the LDPC encoding using such information. The information on the parity check matrix may be stored as information on exponential values of a circulant matrix in case of using a parity matrix proposed in an embodiment of the disclosure.

The decoding device 1000 may include an LDPC decoder 1020. The LDPC decoder 1020 performs LDPC decoding with respect to an LDPC codework based on the parity check matrix or the corresponding exponential matrix or sequence.

For example, the LDPC decoder 1020 may generate information word bits by performing the LDPC decoding through passing of a log likelihood ratio (LLR) value corresponding to the LDPC codeword bits through an iterative decoding algorithm.

Here, the LLR value is a channel value corresponding to the LDPC codeword bits, and may be expressed in various ways.

For example, the LLR value may represent a value obtained by taking logarithm of a ratio of probabilities that the bit transmitted from a transmitting side through a channel is 0 and 1. Further, the LLR value may be a bit value itself determined by hard decision, or may be a representative value determined in accordance with a section to which the probability that the bit transmitted from the transmitting side is 0 or 1.

In this case, the transmitting side may generate the LDPC codeword using the LDPC encoder 1010.

In this case, the LDPC decoder 1020 may perform LDPC decoding using parity check matrices differently defined in accordance with the coding rate (i.e., a coding rate of the LDPC code).

Figure 11A:
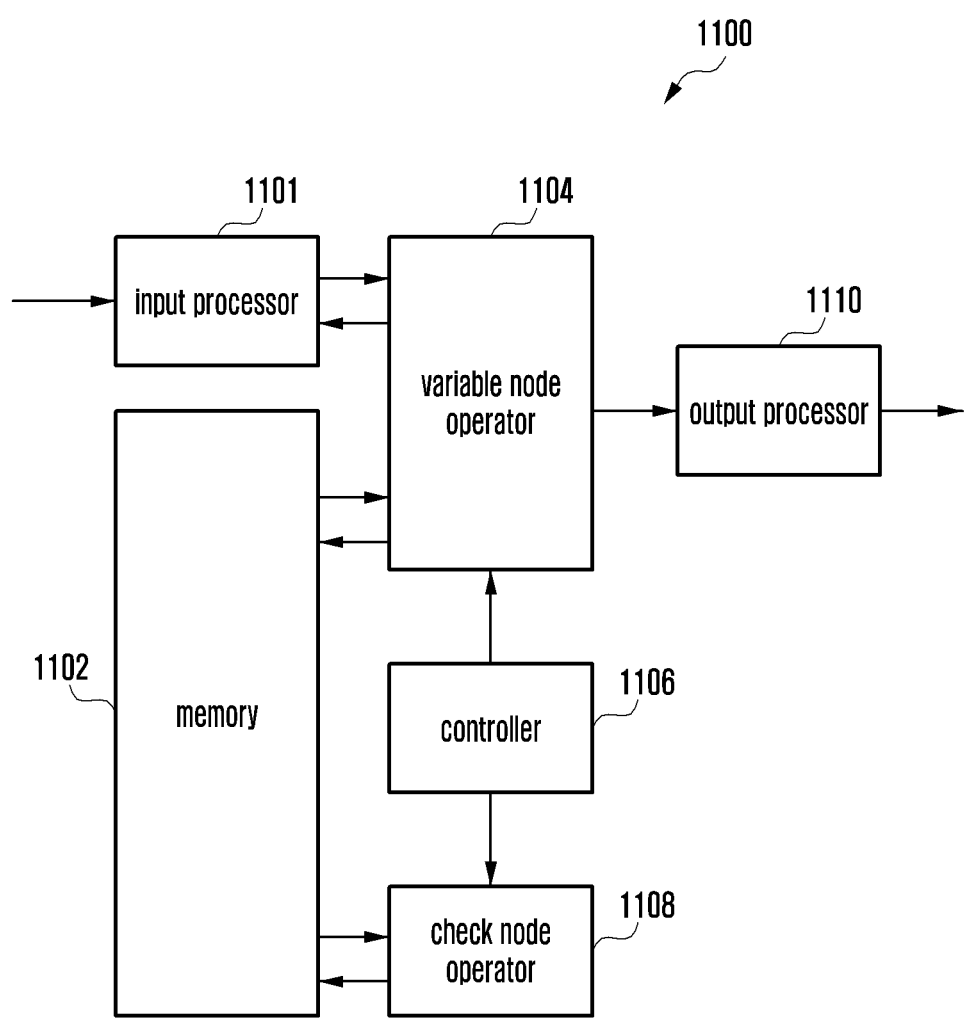
FIG. 11A is a diagram illustrating a structure of a decoding device according to an embodiment of the disclosure.

FIG. 11A is a diagram illustrating a structure of a decoding device according to an embodiment of the disclosure.

On the other hand, as described above, the LDPC decoder 1020 may perform the LDPC decoding using the iterative decoding algorithm, and in this case, the LDPC decoder 1020 may be configured as the structure of FIG. 11A. However, since the iterative decoding algorithm has already been known, the configuration illustrated in FIG. 11A is also.

Referring to FIG. 11A, a decoding device 1100 includes an input processor 1101, a memory 1102, a variable node operator 1104, a controller 1106, a check node operator 1108, and an output processor 1110.

The input processor 1101 stores input values therein. Specifically, the input processor 1101 may store an LLR value of a received signal received through a radio channel.

The controller 1104 determines the number of values input to the variable node operator 1104, address values of the memory 1102, the number of values input to the check node operator 1108, and address values of the memory 1102 based on the block size (i.e., a codeword length) of the received signal received through the radio channel and the parity check matrix corresponding to the coding rate.

The memory 1102 stores input data and output data of the variable node operator 1104 and the check node operator 1108.

The variable node operator 1104 receives an input of data from the memory and perform variable node operation in accordance with address information of the input data input from the controller 1106 and information on the number of pieces of input data. Thereafter, the variable node operator 1104 stores the variable node operation results in the memory 1102 based on address information of the output data input from the controller 1106 and information on the number of pieces of output data. Further, the variable node operator 1104 inputs the variable node operation results to the output processor 1110 based on the data input from the input processor 1101 and the memory 1102.

The check node operator 1108 receives an input of data from the memory 1102 and performs check node operation based on the address information of the input data input from the controller 1106 and the information on the number of pieces of input data. Thereafter, the check node operator 1108 stores the variable node operation results in the memory 1102 based on address information of the output data input from the controller 1106 and information on the number of pieces of output data.

The output processor 1110 performs hard decision on whether the information word bits of the codeword on the transmitting side is 0 or 1 based on the data input from the variable node operator 1104, and then outputs the hard-decision result, so that the output value of the output processor 1110 becomes a finally decoded value.

On the other hand, the decoding device 1100 may further include a memory (not illustrated) for pre-storing information on the coding rate of the LDPC code, codeword length, and parity check matrix, and the LDPC decoder 1020 may perform the LDPC decoding using such information. However, this is merely various, and the corresponding information may be provided from the transmitting side.

On the other hand, parts of the configurations included in the decoding device 1100 may be omitted, or a partial configuration may be added thereto. Further, the configurations of the input processor, memory, variable node operator, check node operator, and output processor included in the decoding device 1100 may be controlled by the controller 1106.

Figure 11B:
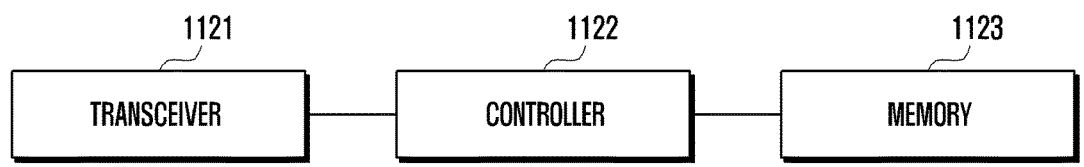
FIG. 11B is a diagram illustrating a structure of an encoding device according to an embodiment of the disclosure.

FIG. 11B is a diagram illustrating a structure of an encoding device according to an embodiment of the disclosure.

The LDPC encoder 1010 may be configured to have a structure as illustrated in FIG. 11B.

Referring to FIG. 11B, the encoding device may be composed of a transceiver 1121, a controller 1122, and a memory 1123. In an embodiment of the disclosure, the controller may be defined as a circuit or application-specific integrated circuit or at least one processor.

The transceiver 1121 may transmit and receive signals. The controller 1122 may control the operation of the decoding device according to an embodiment of the disclosure. The memory 1122 may store at least one of information transmitted/received through the transceiver 1121 and information generated through the controller 1122.

Figure 12:
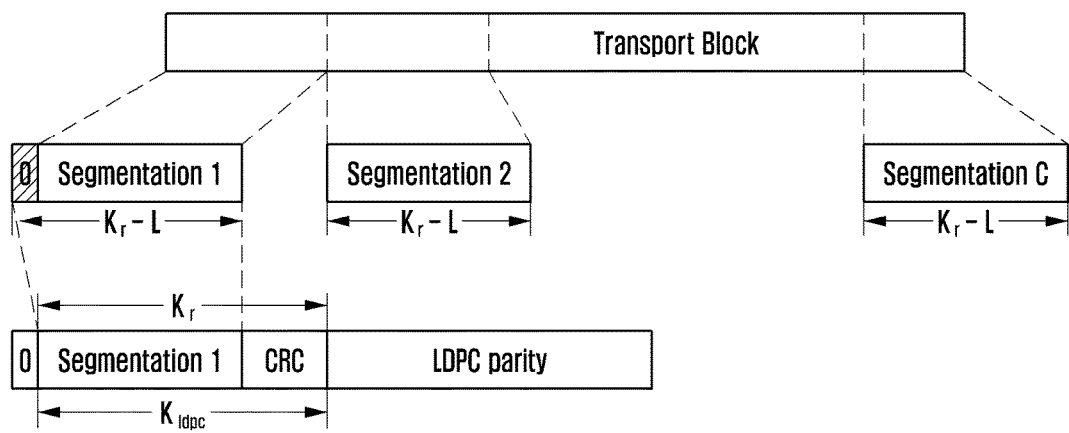
FIG. 12 is a diagram illustrating a structure of a transmission block according to an embodiment of the disclosure.

FIG. 12 is a diagram illustrating a structure of a transmission block according to an embodiment of the disclosure.

Referring to FIG. 12, <Null> bits may be added to match an information length of an LDPC code.

From the foregoing, in the communication and broadcasting system supporting the LDPC code having various lengths, the method for applying various block sizes based on a QC-LDPC code has been described.

FIGS. 13A to 13I are diagrams of base matrices satisfying balancing and partial windowing-orthogonal characteristics proposed according to various embodiments of the disclosure. In particular, the base matrix of FIG. 13A satisfies strongly 2-balancing, and also satisfies 2 partial windowing-orthogonal characteristics.

Figure 13A:
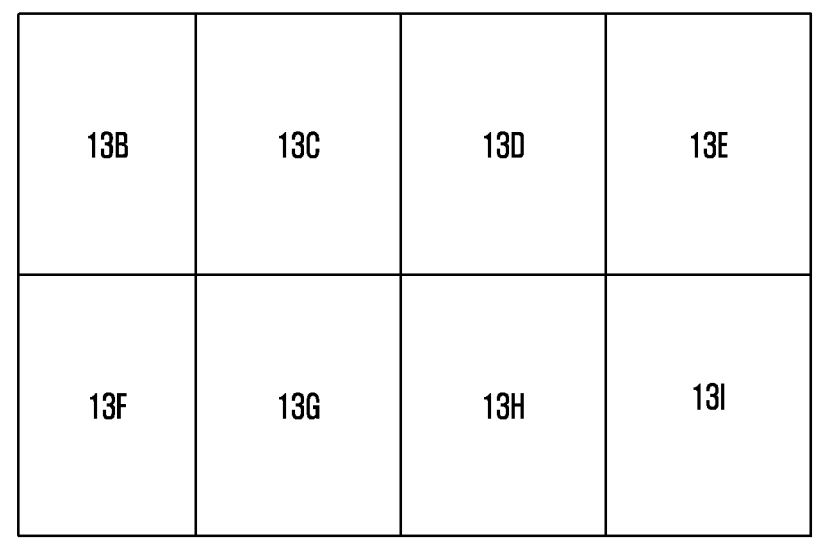
Figure 13B:
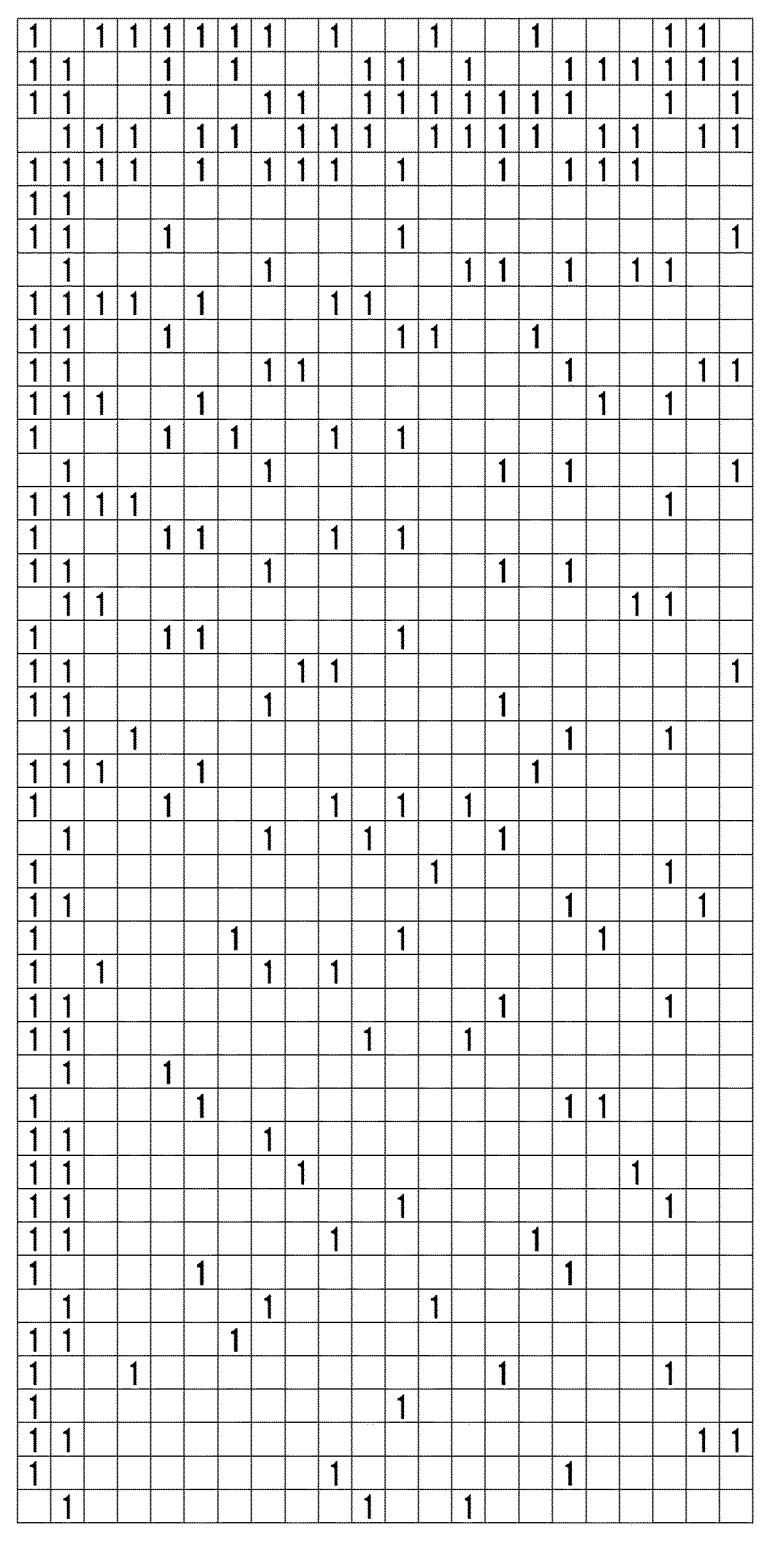
Figure 13C:
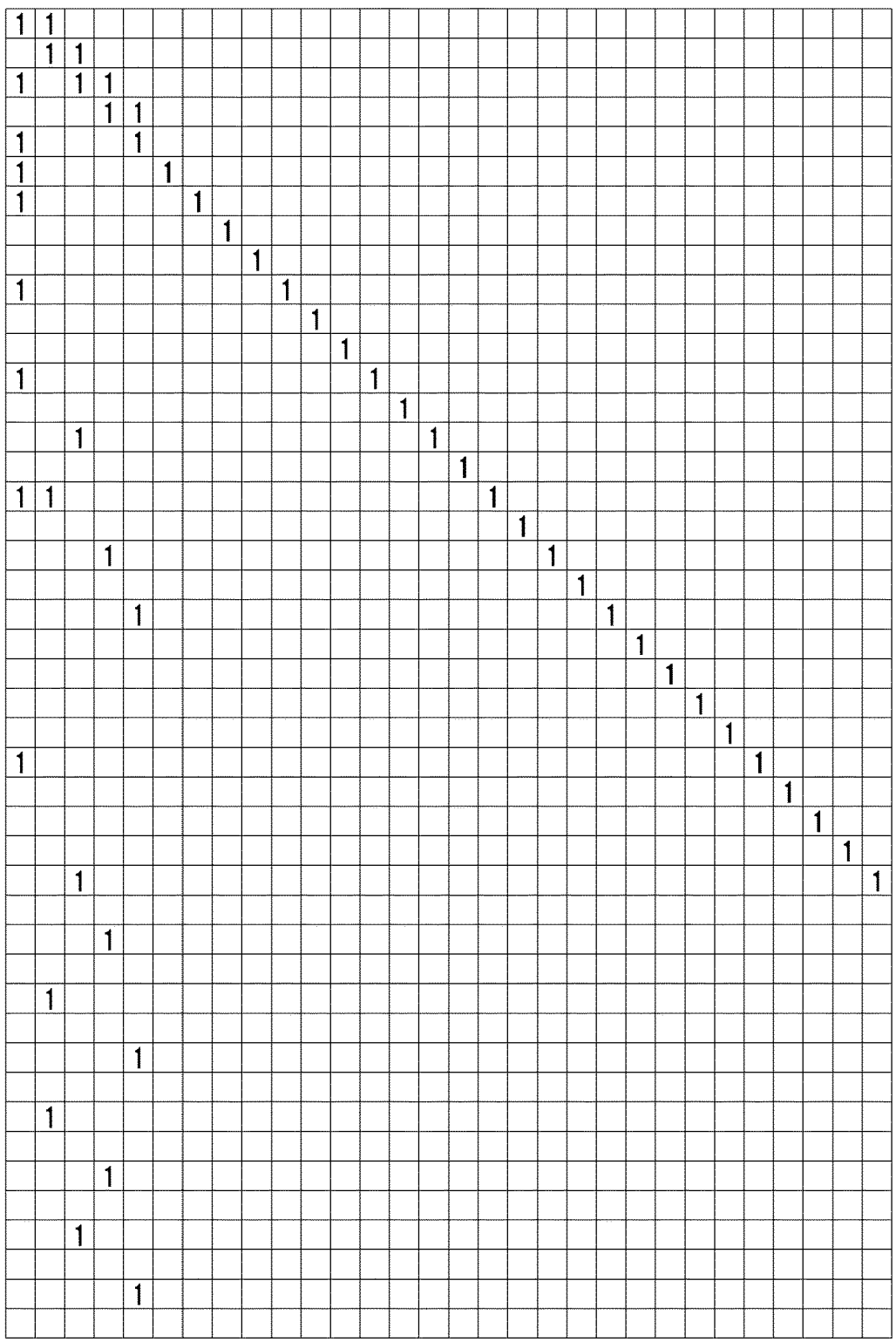
Figure 13D:
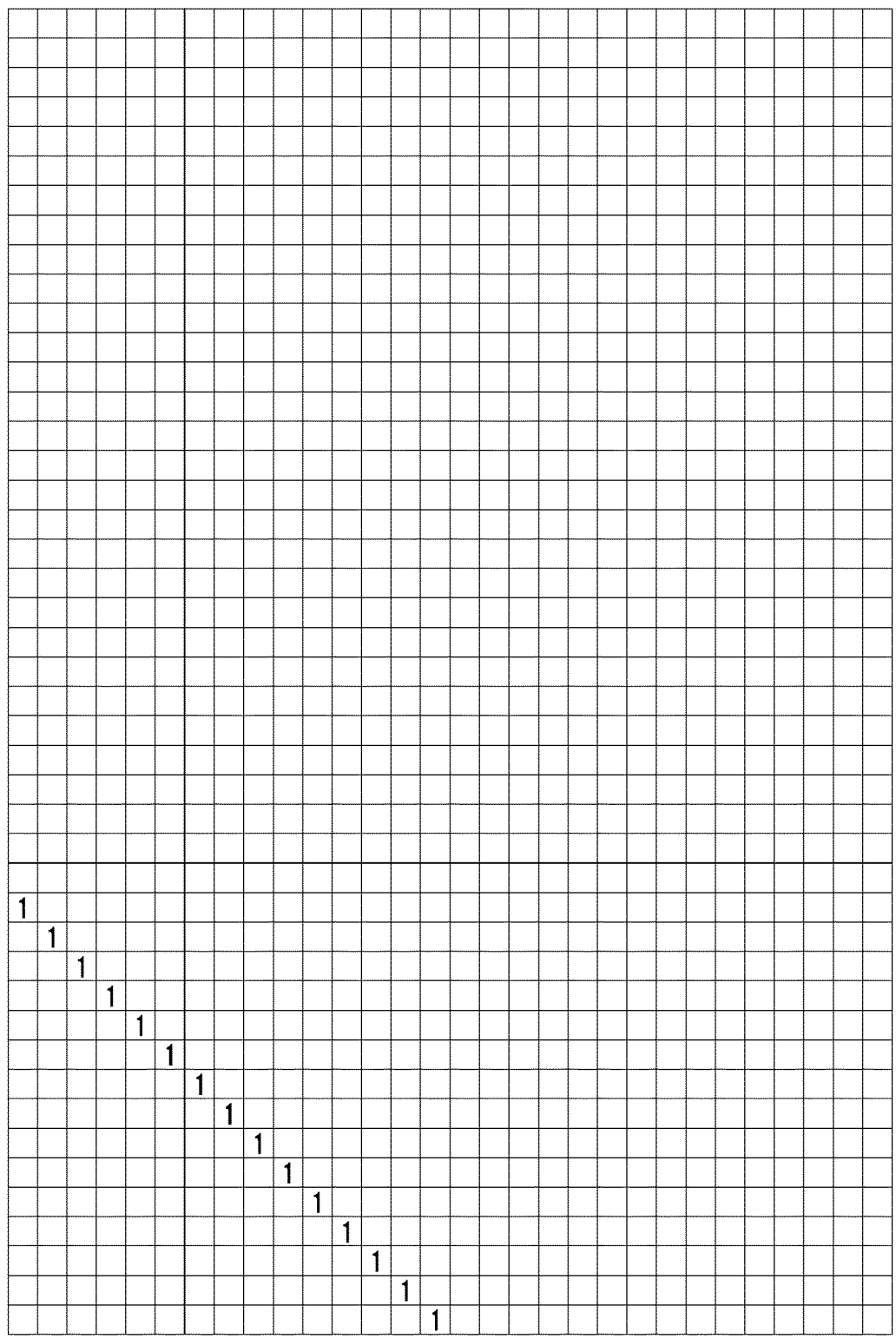
Figure 13E:
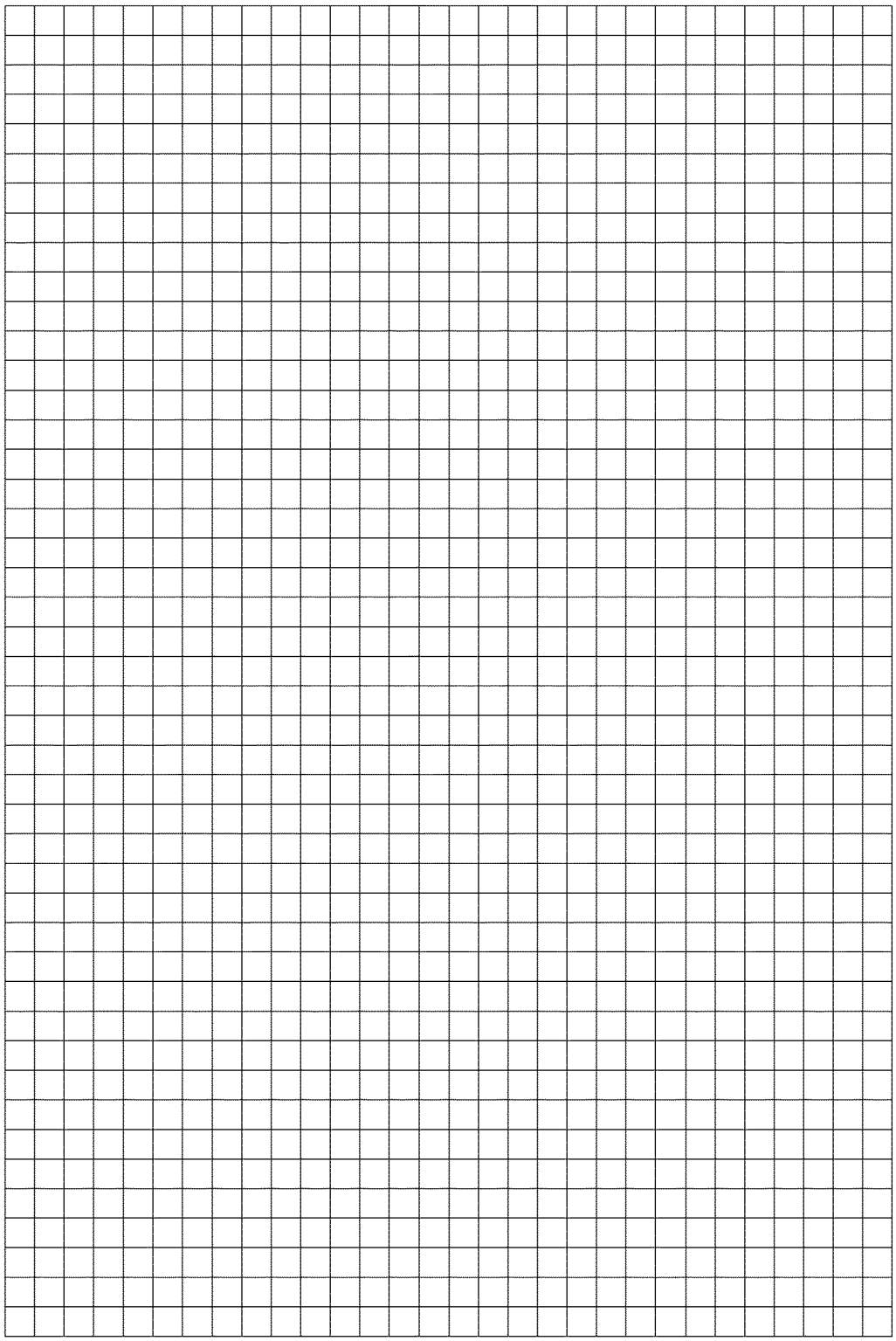
Figure 13F:
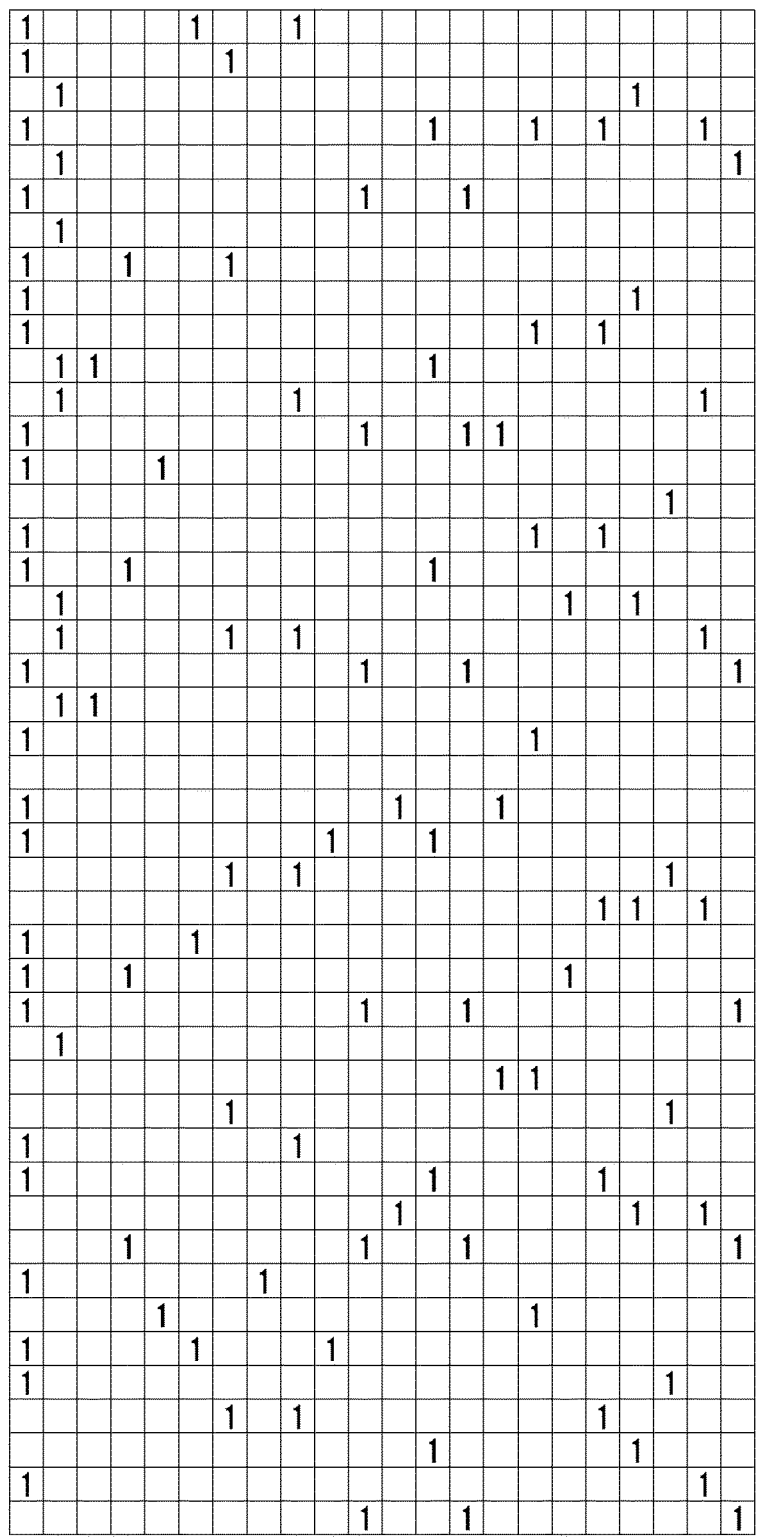
Figure 13G:
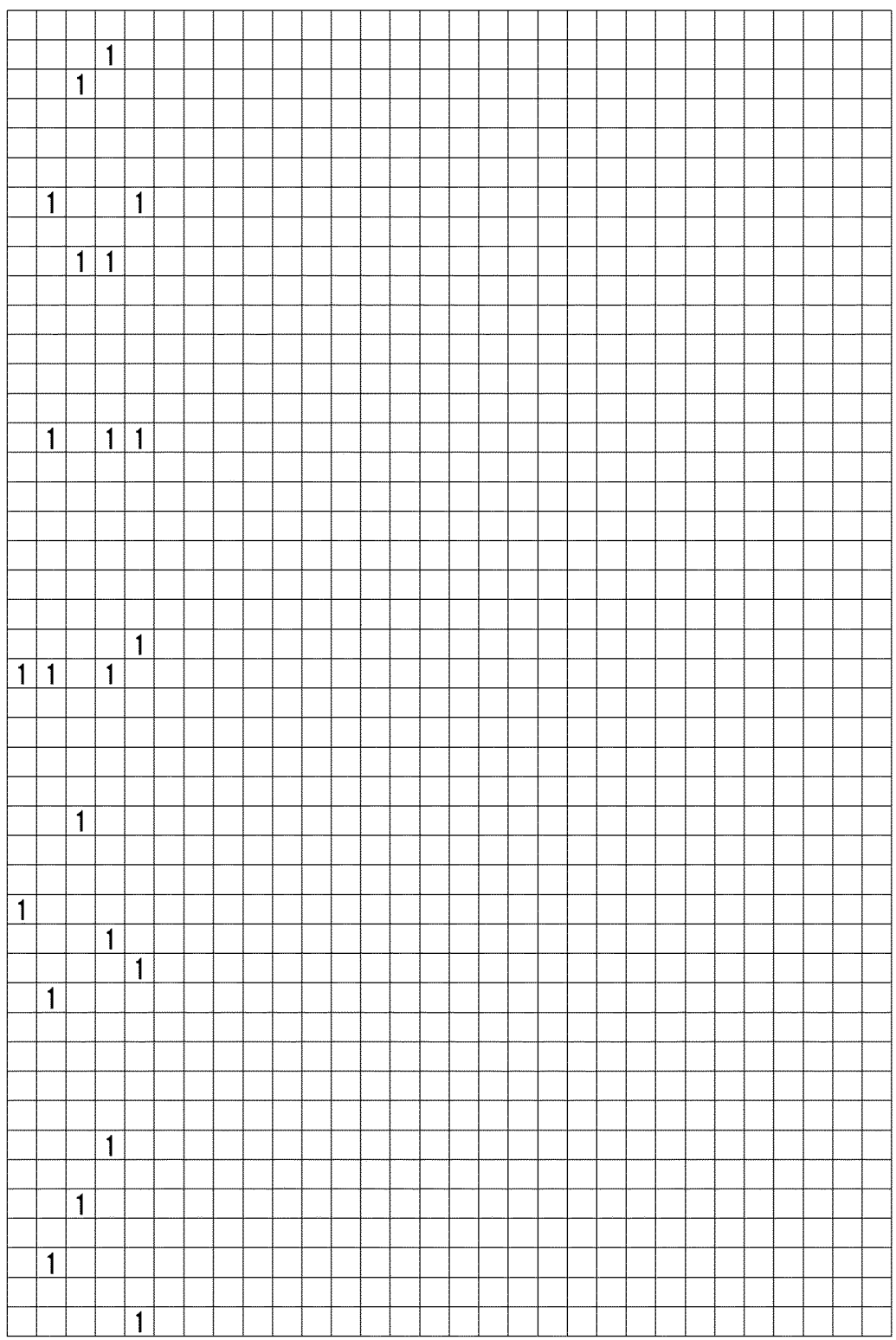
Figure 13H:
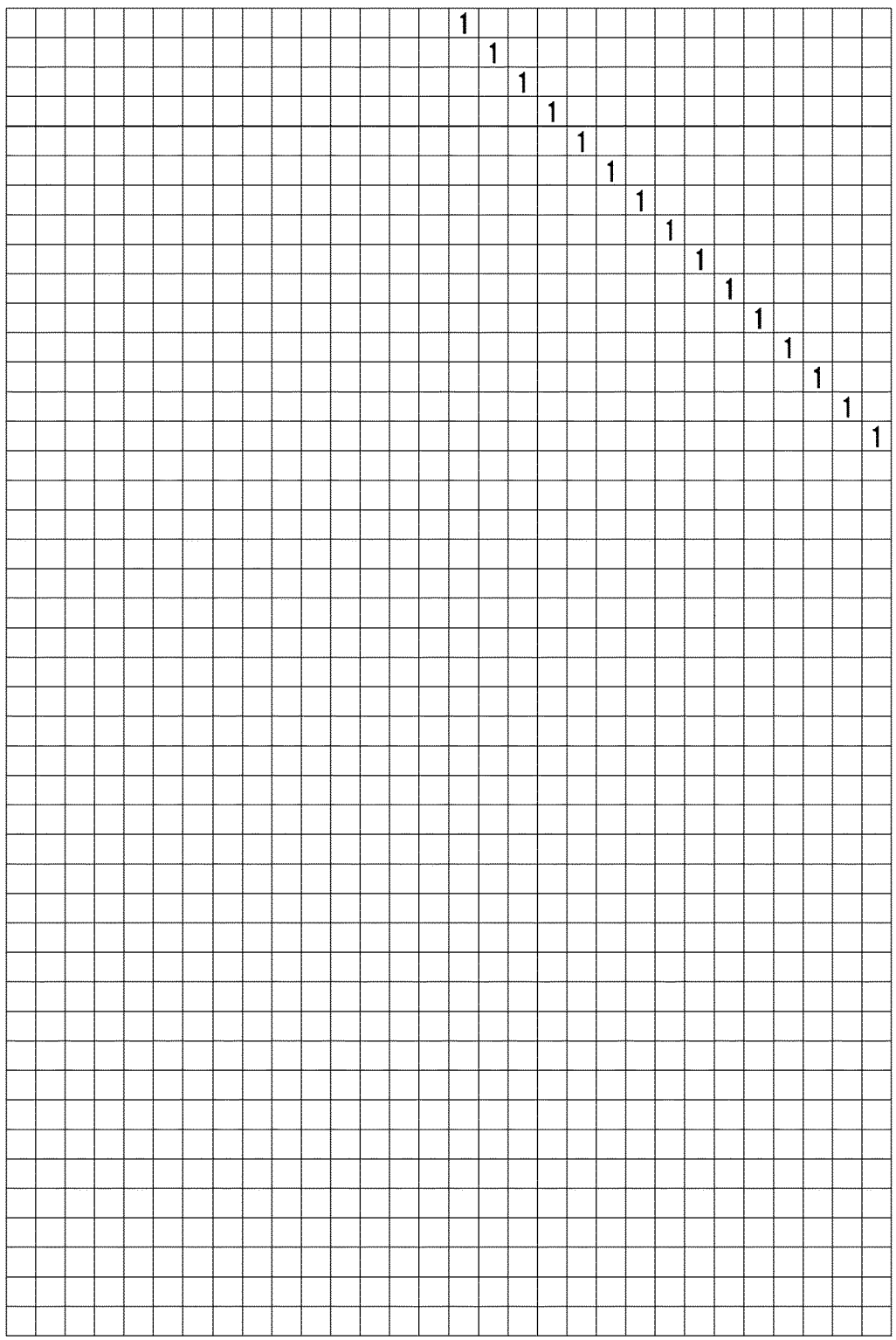
Figure 13I:
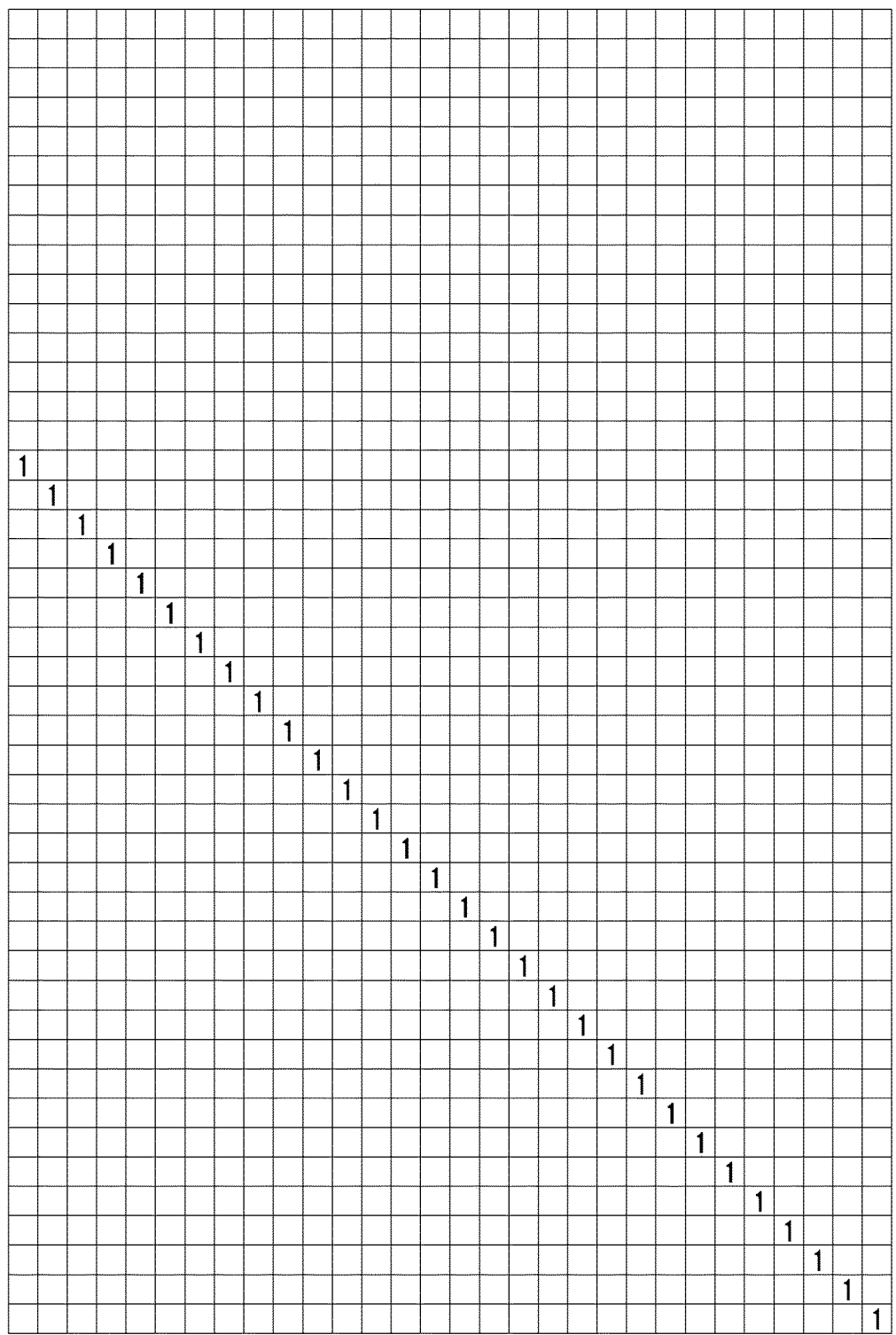

Referring to FIGS. 13A to 13I, the base matrix of FIG. 13A has a size of 90×112, and in a partial matrix corresponding to 5 upper rows and 27 front columns, there is no column having the degree of 1. This means that even if any exponential matrix is defined based on the partial matrix, there is no column or column block having the degree of 1 in the parity check matrix corresponding to the exponential matrix. Further, FIGS. 13B to 13I are enlarged diagrams illustrating respective parts of the base matrix of FIG. 13A. FIG. 13A corresponds to a matrix in which matrices corresponding to drawing reference numerals described on the respective parts are combined. Accordingly, one parity check matrix can be configured through combination of the parts of FIGS. 13B to 13I (in the drawing, it is assumed that the base matrix is divided into 2*4 partitions 13b, 13c, . . . , 13i).

The base matrix illustrated in FIG. 13A is further featured so that the $28^{th}$ to $112^{th}$ columns have the degree of 1. For example, the base matrix having a size of 85×112 and composed of $6^{th}$ to $90^{th}$ rows of the base matrix of FIG. 13A corresponds to a single parity check code.

In the base matrix of FIG. 13A, 22 first columns correspond to information bits for performing encoding. According to circumstances, the information bits are also called code blocks.

As for the position of entry 1 in each row, excluding columns having the degree of 1 from the base matrix of FIG. 13A, a condition on which a difference between the number of 1 oddly positioned and the number of 1 evenly positioned is equal to or smaller than 2 with respect to all rows is satisfied. For example, if odd and even sets are defined with respect to S1 and S2 as in the mathematical expression 7 and entries 1 of each row is classified to match the sets, it can be known that the strongly balancing characteristic defined in the mathematical expression 15 is satisfied. Further, it can be known that the perfect balancing characteristic defined in the mathematical expression 12 is satisfied with respect to a partial matrix composed of 5 upper rows and 27 front columns, which does not include columns having the degree of 1 in the base matrix of FIG. 13A. As described above, the base matrix may be designed through combination of different balancing characteristics with respect to respective partial matrices of the base matrix.

A transmitter generates and transmits a codeword through the parity check matrix having the base matrix having the balancing and partial windowing-orthogonal characteristics as shown in FIG. 13A. In this case, as needed, the codeword may be transmitted by applying puncturing a part of information bits. A receiver performs decoding based on a received signal for the transmitted codeword. In case of performing decoding using one block parallel processor, decoding is performed in order with respect to one circulant permutation matrix or circulant matrix. In case of performing decoding using two block parallel processor, decoding may be simultaneously performed using two block parallel processors with respect to the circulant permutation matrix or circulant matrix correspond to the group.

Figure 14A:
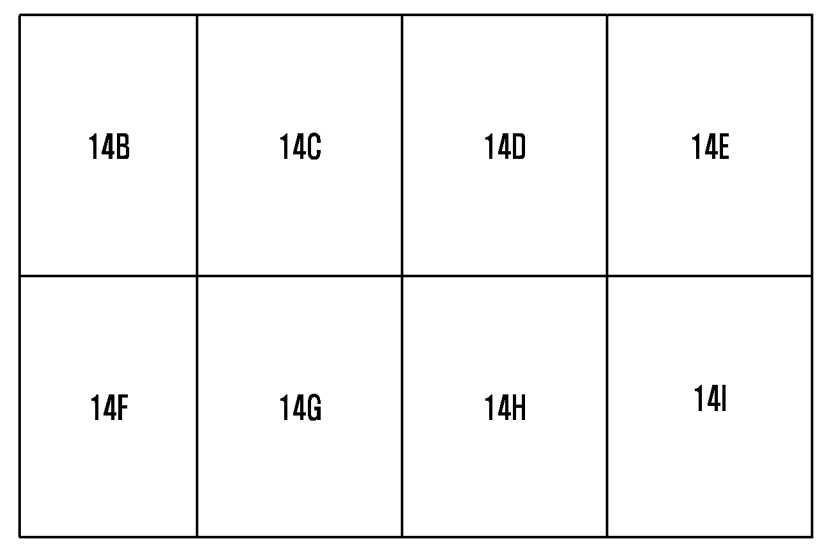

FIG. 14A is a diagram of an exponential matrix having a base matrix of FIG. 13A satisfying balancing and partial windowing-orthogonal characteristics proposed according to an embodiment of the disclosure. Accordingly, a parity check matrix corresponding to the exponential matrix of FIG. 14A also satisfies strongly 2-balancing with respect to respective column blocks, and also satisfies 2 partial windowing-orthogonal characteristics with respect to the respective row blocks.

The exponential matrix of FIG. 14A has a size of 90×112, and in a partial matrix corresponding to 5 upper rows and 27 front columns, there is no column having the degree of 1. Further, in the exponential matrix of FIG. 14, empty blocks corresponds to a zero matrix having a size of L×L.

Figure 14C:
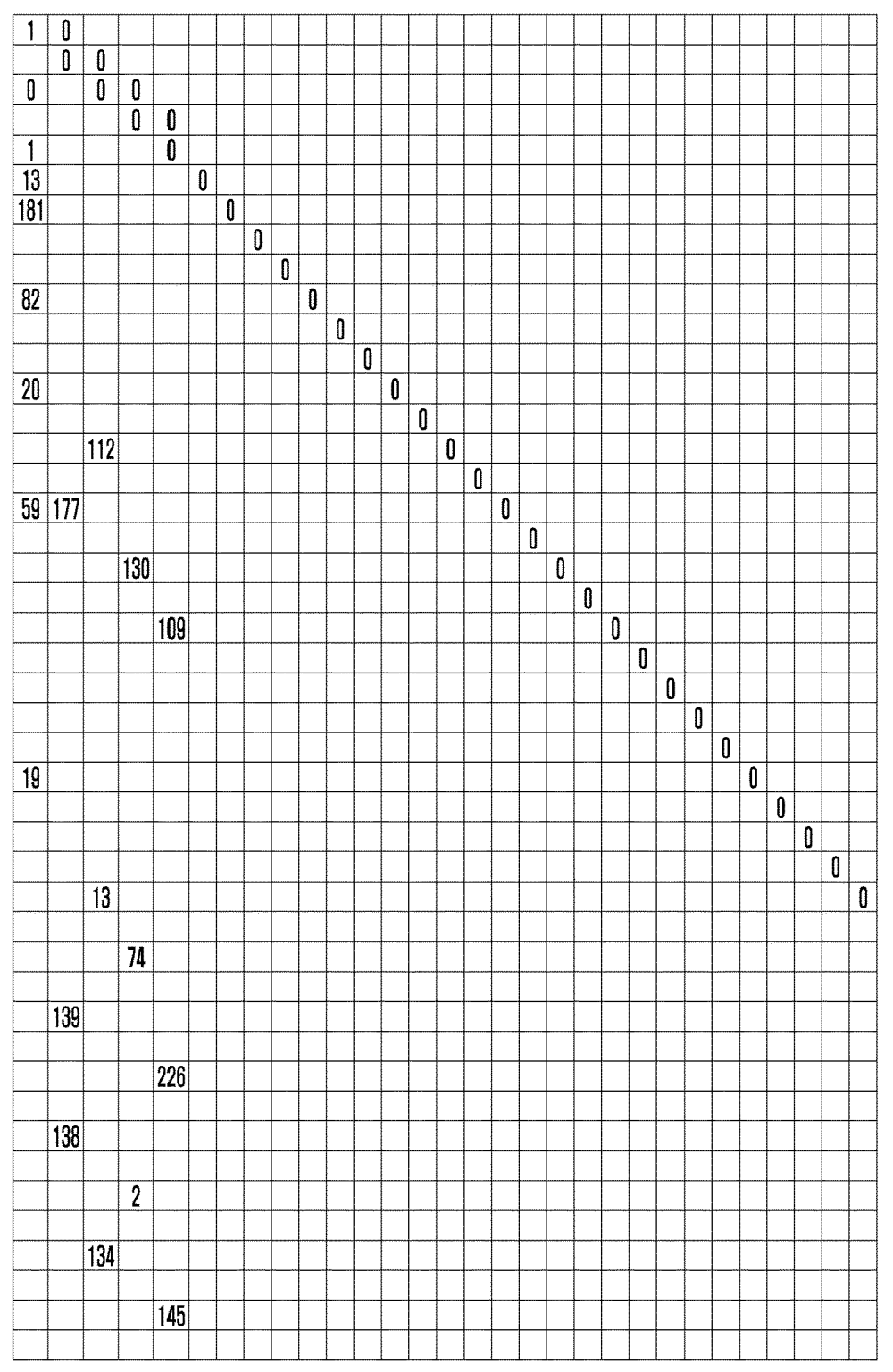
Figure 14D:
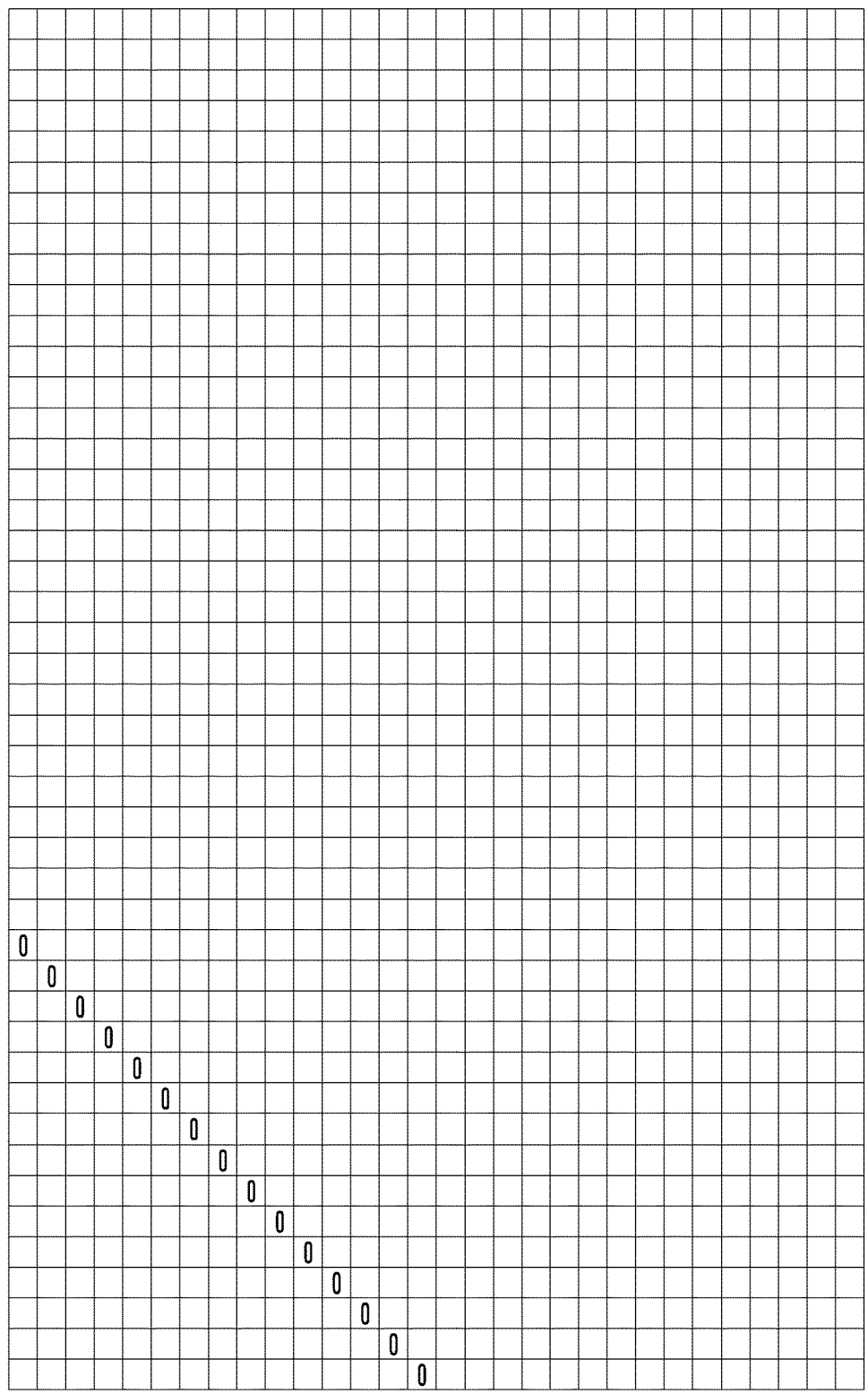
Figure 14E:
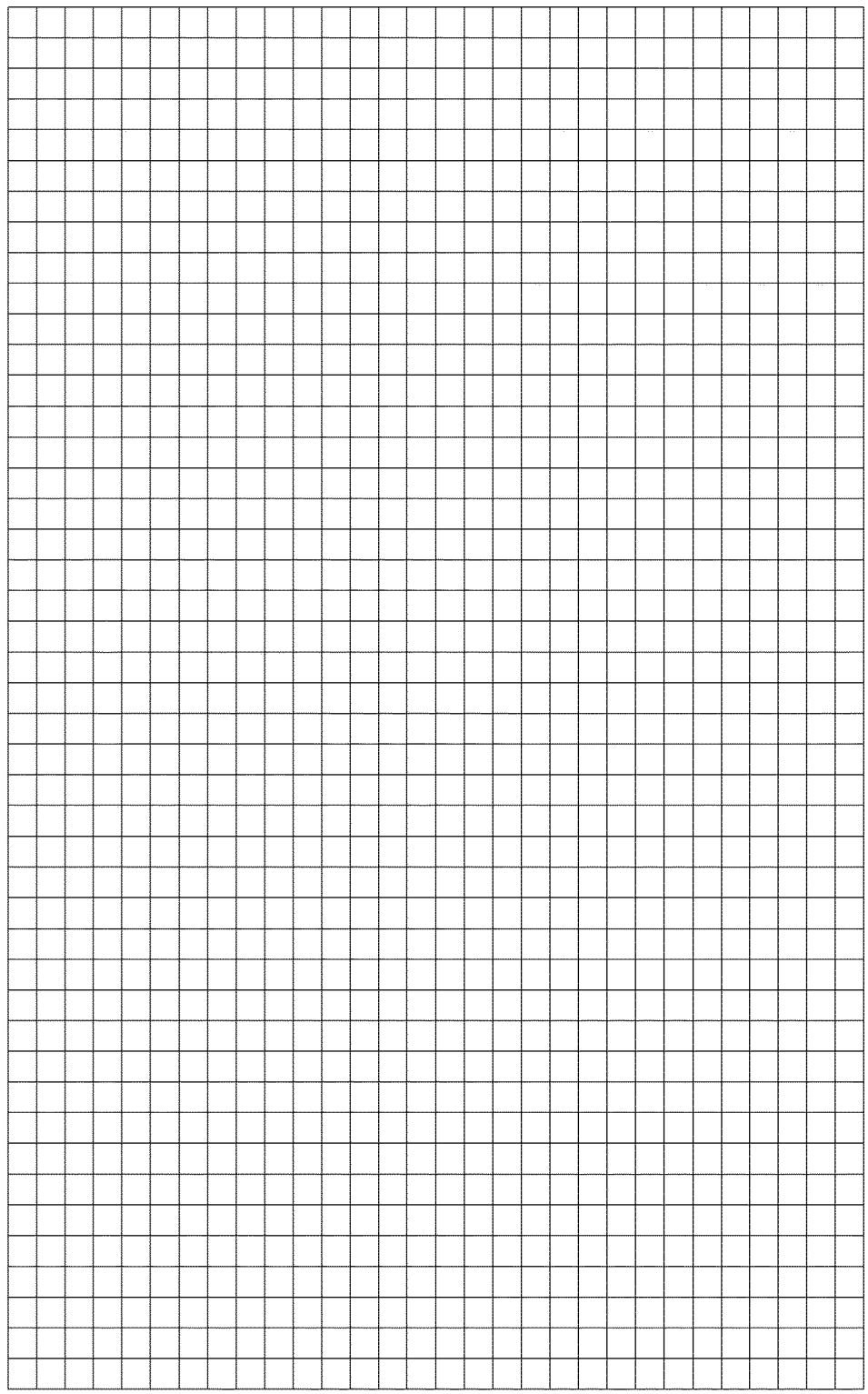
Figure 14F:
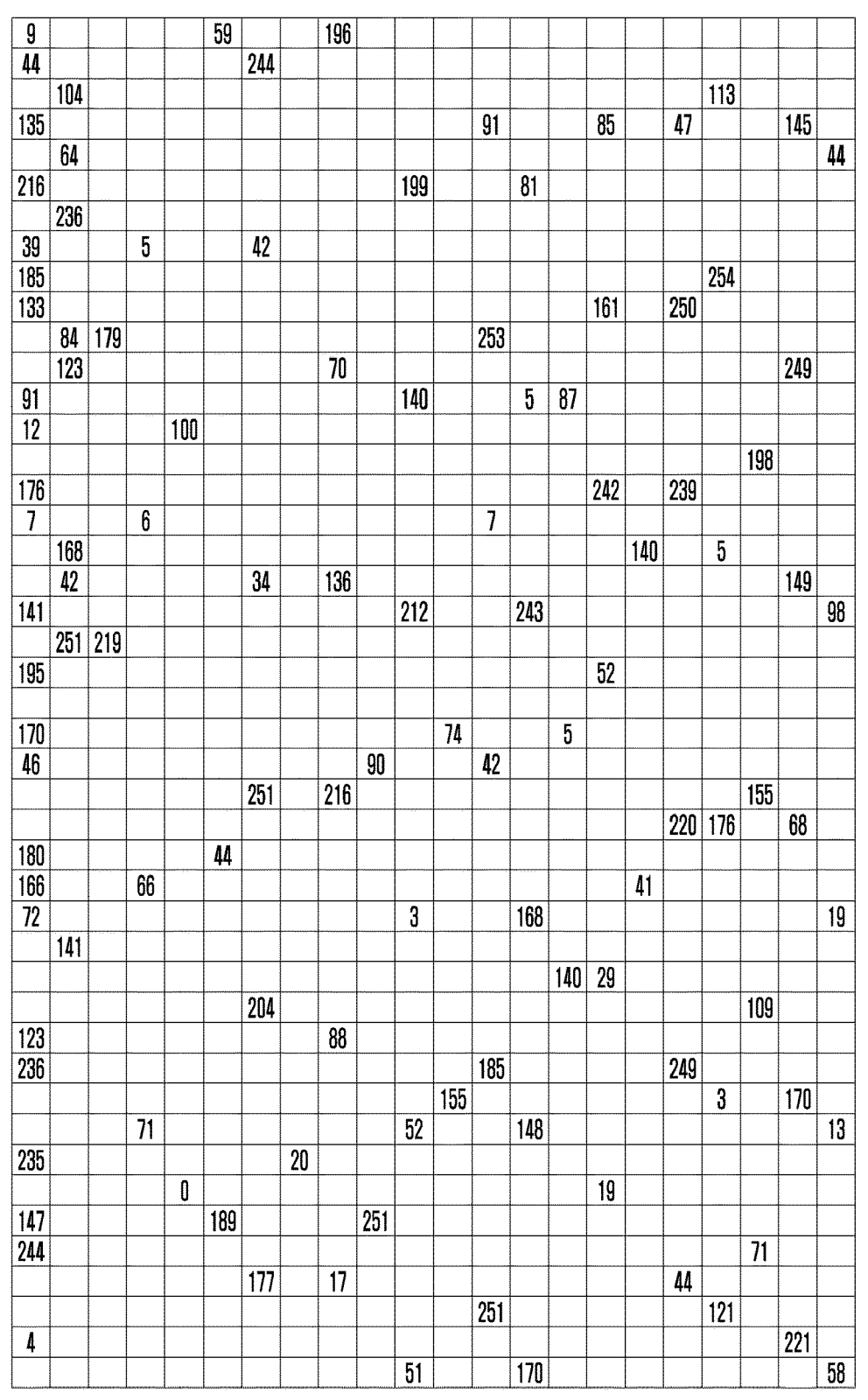
Figure 14G:
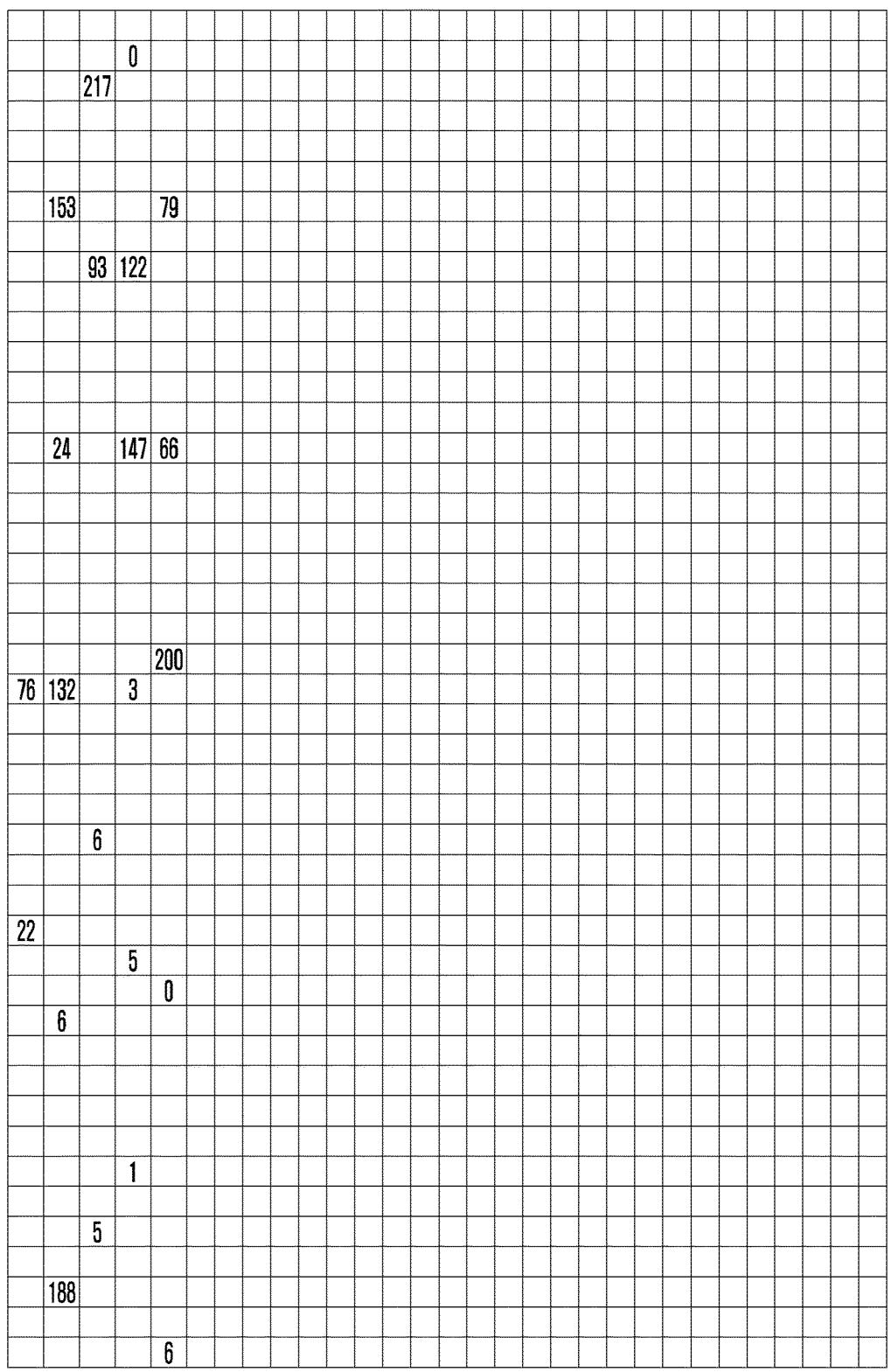
Figure 14H:
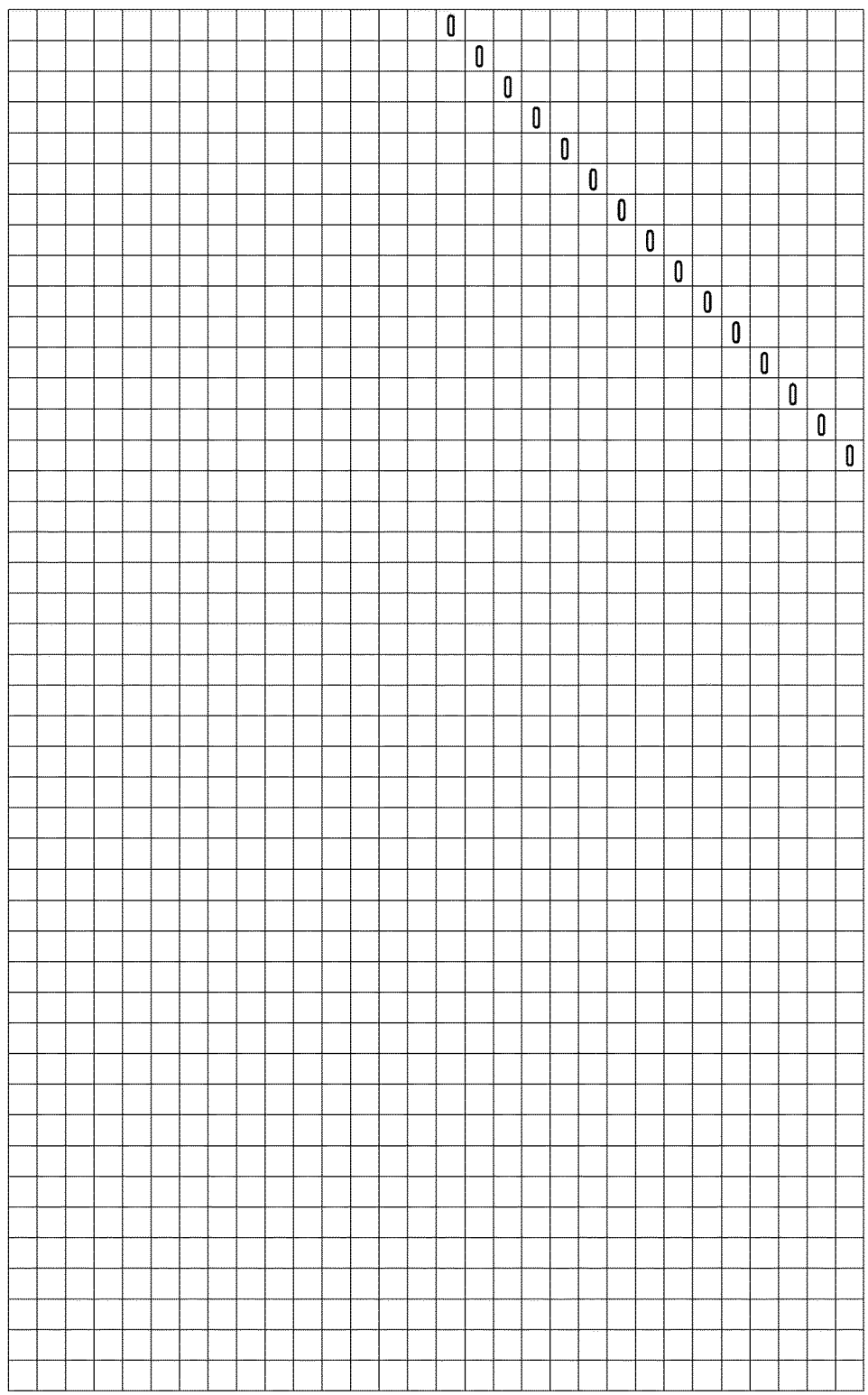
Figure 14I:
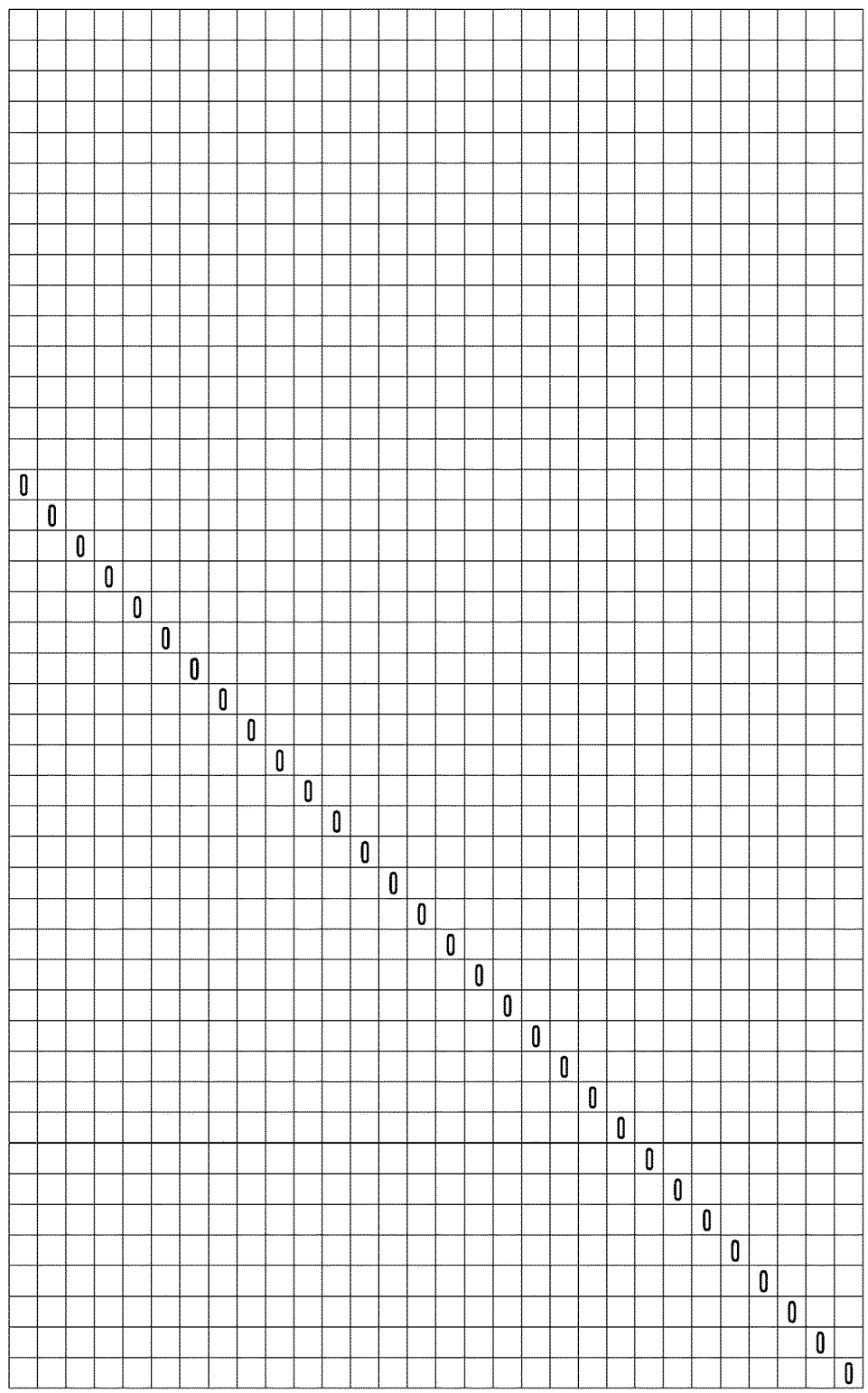

Further, FIGS. 14B to 14I are enlarged diagrams illustrating respective parts of the exponential matrix of FIG. 14A according to various embodiments of the disclosure. FIG. 14A corresponds to a matrix in which matrices corresponding to drawing reference numerals described on the respective parts are combined. Accordingly, one exponential matrix can be configured through combination of the parts of FIGS. 14B to 14I. In FIG. 14A, it is assumed that the base matrix is divided into 2*4 partitions 14b, 14c, . . . , 14i.

The exponential matrix illustrated in FIG. 14A is further featured so that the $28^{th}$ to $112^{th}$ columns have the degree of 1 in all. For example, the exponential matrix having a size of 85×112 and composed of $6^{th}$ to $90^{th}$ rows of the exponential matrix of FIG. 14A corresponds to a large number of single parity check codes.

Since each entry of the exponential matrix of FIG. 14A corresponds to an index of the circulant permutation matrix, the operation of the block parallel processors is performed in accordance with the size L*L of the circulant permutation matrix. If two block parallel processors are used, decoding may be performed with respect to respective circulant permutation matrices corresponding to the defined sets S1 and S2.

The exponential matrix of FIG. 14A may be used for LDPC encoding and decoding by changing values of entries with respect to various L values.

For example, if it is assumed that the exponential matrix of FIG. 14A is $E=(e_{i,j})$, and an exponential matrix converted in accordance with an L value is $E_L=(e_{i,j}^{(L)})$, the following conversion formula may be generally applied.

$$e_{i,j}^{(L)} = \begin{cases} e_{i,j} & e_{i,j} < 0 \\ f(e_{i,j}, L) & e_{i,j} \geq 0 \end{cases} \quad \text{Mathematical expression 17}$$

or $$e_{i,j}^{(L)} = \begin{cases} e_{i,j} & e_{i,j} \leq 0 \\ f(e_{i,j}, L) & e_{i,j} > 0 \end{cases}$$

In the mathematical expression 17, f(x,L) may be defined in various forms, and for example, definitions as in mathematical expression 18 below may be used.

$$f(x, L) = \mod(x, 2^{\lfloor \log_2 L \rfloor}) \quad \text{Mathematical expression 18}$$

or $$f(x, L) = \left\lfloor \frac{x}{2^{D - \lfloor \log_2 L \rfloor}} \right\rfloor$$

or $$f(x, L) = \left\lfloor \frac{L}{D} x \right\rfloor$$

In the mathematical expression 18, mod(a,b) means a modulo-b operation for a, and D means a constant that is a predefined positive integer.

Depending on the system, the base matrix and the exponential matrix shown in FIGS. 13A and 14A may be used as they are, or only parts thereof may be used. For example, matrices composed of 46 upper rows and 68 front columns of the base matrix and the exponential matrix of FIGS. 13A and 14A may be used for LDPC encoding and decoding in the system as new base matrix and exponential matrix. In this case, if information word bits corresponding to x information word blocks are punctured, up to the coding rate 22/(68−x) can be supported without iterative transmission of the codework bits.

Further, the LDPC encoding and decoding may be applied using a new base matrix that can be obtained by connecting the partial matrix composed of 6 upper rows of the base matrix of FIG. 13A and another base matrix corresponding to the single parity check code having a size of 40×68 with each other. In the same manner, the LDPC encoding and decoding may be applied using a new base matrix obtained by connecting a different partial matrix composed of 6 upper rows of the base matrix of FIG. 13A and the same $7^{th}$ to $46^{th}$ rows of the base matrix of FIG. 13A with each other.

In general, the LDPC code may adjust the coding rate by applying puncturing of the codeword bits in accordance with the coding rate. In case of puncturing the parity bits corresponding to the column having the degree of 1, the LDPC code based on the base matrix or the exponential matrix as shown in FIGS. 13A and 14A can perform decoding without using the corresponding part in the parity check matrix, and thus decoding complexity can be reduced. However, in case of considering the coding performance, the performance of the LDPC code can be improved through adjustment of the puncturing order of the parity bits (or transmission order of the generated LDPC codewords).

For example, if information word bits corresponding to two front columns of the exponential matrix corresponding to FIGS. 13A and 14A are punctured, and the parity bits having the degree of 1 are all punctured, the LDPC codeword can be transmitted in case where the coding rate is 22/25. However, if information word bits corresponding to two front columns of the base matrix and the exponential matrix corresponding to FIGS. 13A and 14A are punctured, and the parity bits corresponding to the $26^{th}$ column having the degree of 2 are punctured without puncturing the parities corresponding to the $28^{th}$ column having the degree of 1 of the exponential matrices, the LDPC codeword can be transmitted with the coding rate of 22/25 in the same manner. However, the latter has a better performance, and the performance can be further improved by applying proper rate matching after generating the LDPC codeword using the base matrix and the exponential matrix corresponding to FIGS. 13A and 14A. Based on the rate matching, the order of columns in the exponential matrix may be properly realigned to be applied to the LDPC encoding.

As a detailed embodiment of the disclosure, if the LDPC encoding and decoding is applied based on the base matrix and the exponential matrix corresponding to FIGS. 13A and 14A, the following transmission order may be defined. The following patterns are derived based on a case where the LDPC encoding and decoding is applied based on the partial matrix composed of 46 upper rows and 68 front columns in FIGS. 13A and 14A. Further, for convenience, it is considered that the first column is a zeroth column, and the last column is the $67^{th}$ column.

Pattern 1:
2, 3, 4, . . . , 20, 21, 22, 23-A, 26, 24, 27, 23-B, 25, 28, 29, . . . , 67, 0, 1

Pattern 2:
2, 3, 4, . . . , 20, 21, 22, 23-A, 26, 27, 24, 23-B, 25, 28, 29, . . . , 67, 0, 1

The pattern 1 and pattern 2 mean that transmission is made in the order of codeword bits corresponding to the column corresponding to the pattern order. In other words, the pattern 1 and pattern 2 mean that puncturing is applied to the codeword bits in reverse order. In case of the pattern 1, for example, in case of applying the puncturing to the codeword for rate matching, the puncturing is applied for a necessary length in order, starting from the codeword bits having a size of Z corresponding to the first column (however, the order of 0 and 1 can be changed in the pattern 1 and pattern 2).

In the pattern 1 and pattern 2, 23-A and 23-B mean that the codeword bits corresponding to the $23^{rd}$ column block has been divided into two groups. For example, 23-A may mean the first $\lceil Z/2 \rceil$ bit of the codeword bits corresponding to the $23^{rd}$ column group, and 23-B may mean the last $Z-\lceil Z/2 \rceil$ bit of the codeword bits corresponding to the $23^{rd}$ column group. The division of the bits for 23-A and 23-B is merely various, and they can be divided using various methods (e.g., 23-A is the $\lfloor Z/2 \rfloor$ bit, and 23-B is the $Z-\lfloor Z/2 \rfloor$ bit).

As for the transmission order, it is not necessary to perform transmission in the order of codeword bit units corresponding to the column blocks, and for performance improvement, the transmission order may differ through division of the codeword bits corresponding to the column blocks into two or more groups. In other words, in order to obtain more superior encoding performance, the transmission order of the codeword bits corresponding to at least one column block may be differently configured.

For reference, transmission in the unit of codeword bits corresponding to the column blocks may mean that codeword bits corresponding to another column block are not transmitted while codeword bits for one column block are successively transmitted.

Such a rate matching method may be applied using the above-described patterns, and a method by the system for performing puncturing from a predetermined position may be applied after performing proper interleaving with respect to the codeword bits. For example, in an LTE system, a redundancy version (RV) technique may be used. An example of the RV technique will be briefly described as follows.

First, pattern 1 and pattern 2 are respectively changed to pattern 3 and pattern 4.

Pattern 3:
0, 1, 2, 3, 4, . . . , 20, 21, 22, 23-A, 26, 24, 27, 23-B, 25, 28, 29, . . . , 67

Pattern 4:
0, 1, 2, 3, 4, . . . , 20, 21, 22, 23-A, 26, 27, 24, 23-B, 25, 28, 29, . . . , 67

If the value of RV-0 indicating a transmission start position is configured to 2 with respect to the codeword, it is possible to configure the puncturing to be taken from the codeword bits for the zeroth and first column blocks in accordance with the coding rate. Here, various initial transmission orders can be determined in accordance with the RV-0 value, and by properly configuring an RV-I value, it can be applied to an application technology of the LDPC encoding and decoding, such as HARQ. For example, when transmitting additional parity bits after transmitting all codeword bits for the $2^{nd}$ to $67^{th}$ column blocks, the additional codeword bits may be iteratively transmitted, circularly starting from the zeroth and first column blocks, or the additional codeword bits may be transmitted in various methods in accordance with RV-I values.

Further, the pattern or interleaving method may be differently applied in accordance with the modulation order to improve the performance. For example, if the coding rate is lower than a specific coding rate R_th, a rate matching method corresponding to the first pattern is applied, and if the coding rate becomes higher than R_th, the second pattern that is different from the first pattern may be used (if the coding rate is equal to R_th, the pattern can be selected in accordance with a predetermined method).

The base matrix and the exponential matrix as shown in FIGS. 13A and 14A may be expressed in various forms, and as an example, they can be expressed using sequences as expressed in mathematical expressions 19 and 20 below (for convenience, they are derived based on a case where the LDPC encoding and decoding is applied based on a partial matrix composed of 46 upper rows and 68 front columns in FIGS. 13A and 14A).

0 2 3 4 5 6 7 9 12 15 19 20 22 23

0 1 4 6 10 11 13 16 17 18 19 20 21 23 24

0 1 4 7 8 10 11 12 13 14 15 16 19 21 22 24 25

1 2 3 5 6 8 9 10 12 13 14 15 17 18 20 21 25 26

0 1 2 3 5 7 8 9 11 14 16 17 18 22 26

0 1 22 27

0 1 4 11 21 22 28

1 7 13 14 16 18 19 29

0 1 2 3 5 9 10 30

0 1 4 11 12 15 22 31

0 1 7 8 16 20 21 32

0 1 2 5 17 19 33

0 4 6 9 11 22 34

1 7 14 16 21 35

0 1 2 3 19 24 36

0 4 5 9 11 37

0 1 7 14 16 22 23 38

1 2 18 19 39

0 4 5 11 25 40

0 1 8 9 21 41

0 1 7 14 26 42

1 3 16 19 43

0 1 2 5 15 44

0 4 9 11 13 45

1 7 10 14 46

0 12 19 22 47

0 1 16 20 48

0 6 11 17 49

0 2 7 9 50

0 1 14 19 24 51

0 1 10 13 52

1 4 25 53

0 5 16 17 54

0 1 7 23 55

0 1 8 18 56

0 1 11 19 26 57

0 1 9 15 58

0 5 16 23 59

1 7 12 60

0 1 6 25 61

0 3 14 19 62

0 11 24 63

0 1 20 21 64

0 9 16 26 65

1 10 13 66

0 5 8 67 Mathematical expression 19

194 25 92 160 98 244 9 248 178 107 40 245 1 0

0 192 118 229 142 157 164 29 235 83 11 129 240 0 0

39 140 178 22 76 33 124 230 73 179 57 126 161 45 0 0 0

185 186 118 171 240 203 251 148 205 162 233 187 255 10 146 104 0 0

149 222 1 69 177 16 117 222 147 247 214 115 134 1 0

106 29 13 0

195 219 101 126 122 181 0

61 185 146 248 148 40 235 0

233 133 220 174 15 126 173 0

82 208 57 148 211 149 82 0

42 19 216 75 79 47 41 0

5 74 4 54 76 64 0

42 203 53 28 103 20 0

8 3 137 35 78 0

235 251 120 121 119 112 0

86 199 4 89 183 0

50 254 126 250 188 59 177 0

232 123 74 172 0

70 187 249 145 130 0

185 20 200 172 28 0

60 125 236 255 109 0

154 95 29 15 0

135 198 228 156 199 0

14 162 171 76 13 0

96 54 44 112 0

84 98 164 19 0

24 80 249 74 0

57 245 163 90 0

68 77 209 203 0

55 43 205 141 13 0

153 127 230 250 0

236 82 74 0

140 129 25 168 0

87 29 123 139 0

67 170 77 161 0

228 233 123 217 226 0

95 155 233 158 0

80 233 121 138 0

198 240 227 0

175 104 233 2 0

28 19 113 218 0

75 124 134 0

69 72 53 125 0

18 61 92 145 0

183 218 231 0

9 59 196 0                Mathematical expression 20

The mathematical expression 19 indicates a position of entry 1 for each row in a partial matrix having a size of 46×68 in the base matrix of FIG. 13A. For example, in the mathematical expression 19, the third value 5 of the third sequence means that entry 1 exists in the third row and the fifth column of the base matrix (in the above-described example, it is considered that the start order of the sequence and entry starts from 0).

The mathematical expression 20 indicates respective entry values for each row in a partial matrix having a size of 46×68 in the base matrix of FIG. 14A. For example, in the mathematical expression 20, the third value 171 of the third sequence means that the third entry value in the third row in the exponential matrix is 171, and based on FIG. 13A and mathematical expression 19, the third value means that an index of the circulant permutation matrix corresponding to the third row block and the fifth column block in the parity check matrix is 171.

If parts of the base matrix and the exponential matrix have a specific rule, the base matrix and the exponential matrix can be expressed more simply. For example, if the $27^{th}$ to last column blocks have a diagonal structure, such as the base matrix and the exponential matrix of FIGS. 13A and 14A, it is assumed that entry positions and index values are omitted, but the corresponding rule is known.

As an example, mathematical expression 21 below shows an example in which the positions of entries 1 are omitted in the $27^{th}$ to last column blocks.

0 2 3 4 5 6 7 9 12 15 19 20 22 23

0 1 4 6 10 11 13 16 17 18 19 20 21 23 24

0 1 4 7 8 10 11 12 13 14 15 16 19 21 22 24 25

1 2 3 5 6 8 9 10 12 13 14 15 17 18 20 21 25 26

0 1 2 3 5 7 8 9 11 14 16 17 18 22 26

0 1 22

0 1 4 11 21 22

1 7 13 14 16 18 19

0 1 2 3 5 9 10

0 1 4 11 12 15 22

0 1 7 8 16 20 21

0 1 2 5 17 19

0 4 6 9 11 22

1 7 14 16 21

0 1 2 3 19 24

0 4 5 9 11

0 1 7 14 16 22 23

1 2 18 19

0 4 5 11 25

0 1 8 9 21

0 1 7 14 26

1 3 16 19

0 1 2 5 15

0 4 9 11 13

1 7 10 14

0 12 19 22

0 1 16 20

0 6 11 17

0 2 7 9

0 1 14 19 24

0 1 10 13

1 4 25

0 5 16 17

0 1 7 23

0 1 8 18

0 1 11 19 26

0 1 9 15

0 5 16 23

1 7 12

0 1 6 25

0 3 14 19

0 11 24

0 1 20 21

0 9 16 26

1 10 13

0 5 8     Mathematical expression 21

As described above, the base matrix and the exponential matrix of FIGS. 13A and 14A can be expressed in various methods.

Figure 15A:
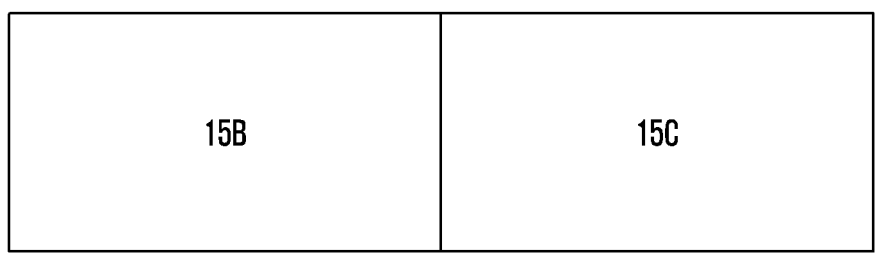
Figure 15B:
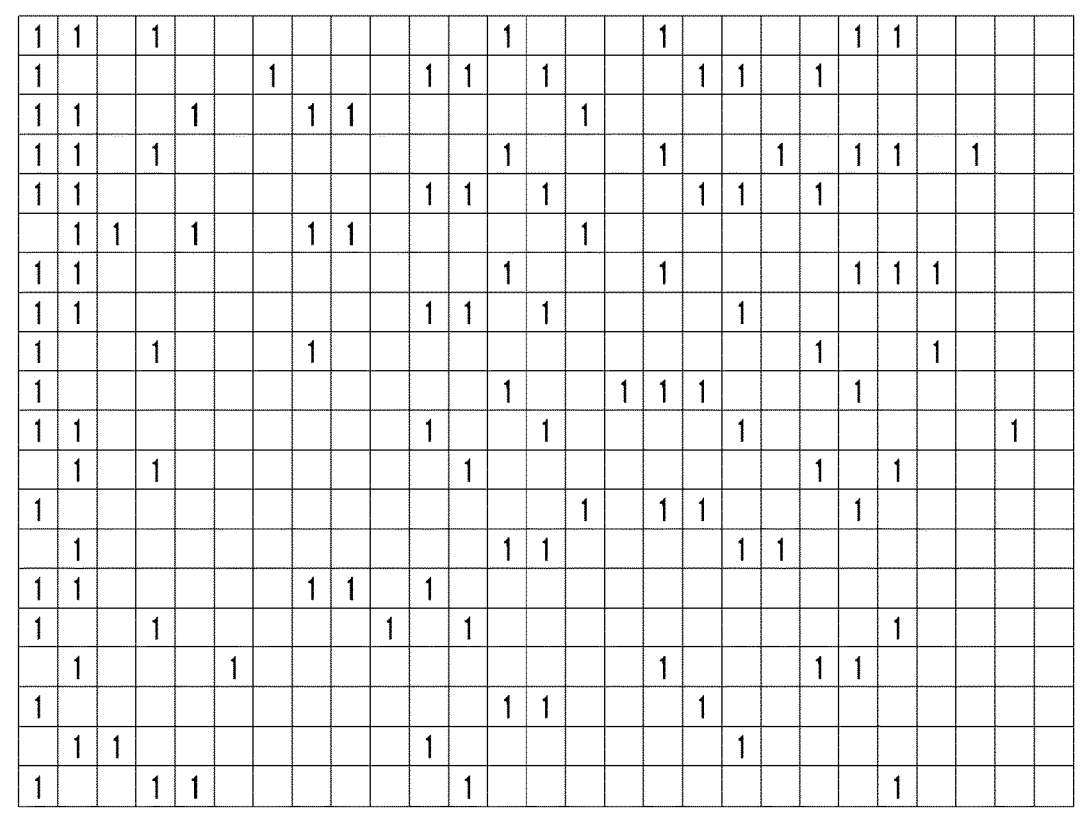
Figure 15C:
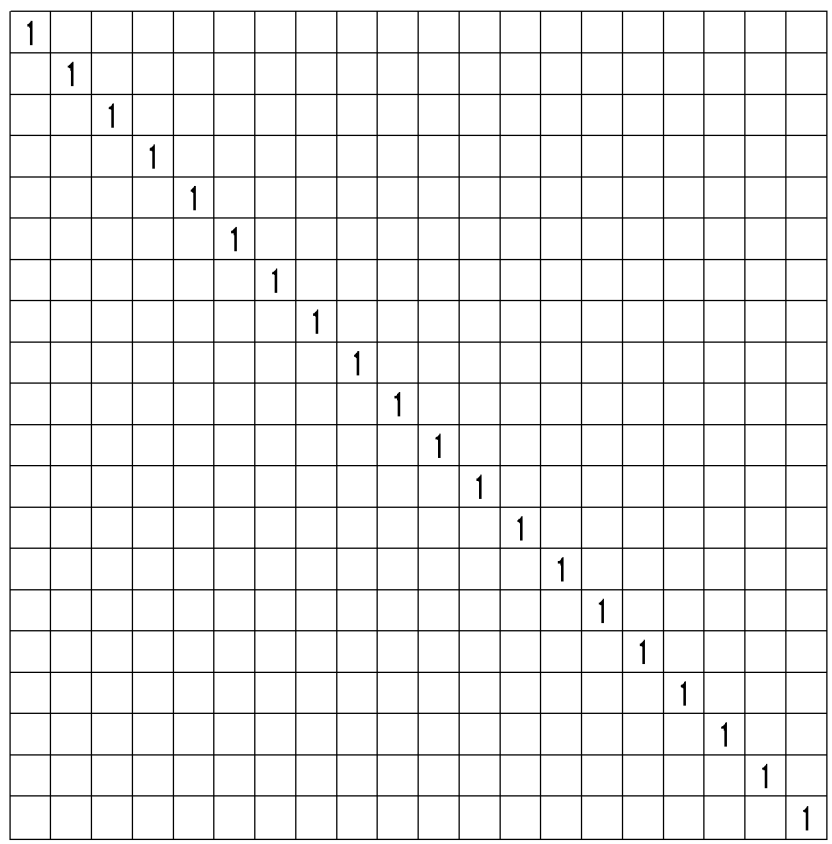

Another embodiment of a base matrix satisfying balancing and partial windowing-orthogonal characteristics proposed in an embodiment of the disclosure is shown in FIGS. 15A to 15C.

FIGS. 15A to 15C are diagrams illustrating a base matrix having a size of 20×47.

Referring to 15A to 15C, in the base matrix of FIGS. 15A to 15C, empty blocks generally mean 0, and indicate parts corresponding to a zero matrix having a size of Z×Z in a parity check matrix according to various embodiments of the disclosure.

Further, FIGS. 15B to 15C are enlarged diagrams illustrating respective parts of the base matrix of FIG. 15A. FIG. 15A corresponds to a matrix in which matrices corresponding to drawing reference numerals described on the respective parts are combined. Accordingly, one base matrix can be configured through combination of the parts of FIGS. 15B and 15C.

It can be easily identified that the base matrix of FIG. 15A has strongly 2-balancing characteristics and 2 partial windowing-orthogonal structure. Further, the $28^{th}$ to $47^{th}$ columns have the degree of 1 in all. In other words, all columns corresponding to the $28^{th}$ to $47^{th}$ columns of FIG. 15 have the degree of 1 in the parity check matrix that can be generated by applying lifting from the base matrix of FIG. 15A.

Another embodiment of a base matrix for LDPC encoding and decoding supporting various coding rates and code lengths based on the base matrix satisfying balancing and partial windowing-orthogonal characteristics proposed in an embodiment of the disclosure is shown in FIGS. 16A to 16E.

FIGS. 16A to 16E are diagrams illustrating a base matrix having a size of 25×47. In the base matrix of FIGS. 16A to 16E, empty blocks generally mean 0, and indicate parts corresponding to a zero matrix having a size of Z×Z in a parity check matrix.

FIGS. 16A to 16E are diagrams of other elementary matrices according to various embodiments of the disclosure.

Figure 16A:
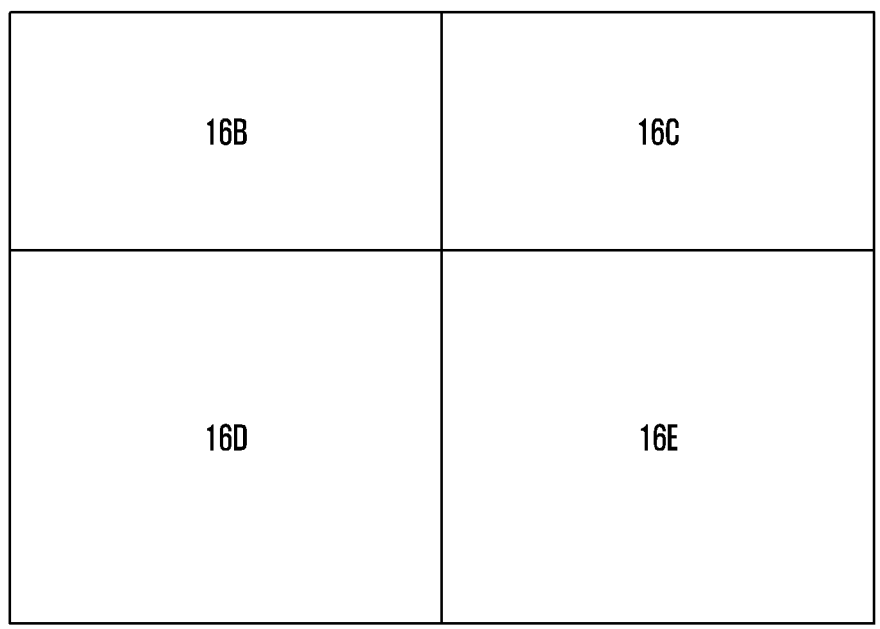

Referring to 16A to 16E, FIGS. 16B to 16E are enlarged diagrams illustrating respective parts of the base matrix of FIG. 16A. FIG. 16A corresponds to a matrix in which matrices corresponding to drawing reference numerals described on the respective parts are combined. Accordingly, one base matrix can be configured through combination of the parts of FIGS. 16B to 16E. For reference, FIG. 15B is equal to FIG. 16D, and FIG. 15C is equal to FIG. 16E.

The base matrix illustrated in FIG. 16A can be expressed in various forms, and as an example, it may be expressed using a sequence as in mathematical expression 22 below. The mathematical expression 22 indicates a position of entry 1 for each row in the base matrix of FIG. 16A. For example, in the mathematical expression 22, the second value 4 of the second sequence means that entry 1 exists in the second row and the fourth column of the base matrix (in the above-described example, it is considered that the start order of entries in the sequence and the matrix starts from 0).

0 1 2 3 5 6 9 10 11 12 13 15 16 18 19 20 21 22 23

0 2 3 4 5 7 8 9 11 12 14 15 16 17 19 21 22 23 24

0 1 2 4 5 6 7 8 9 10 13 14 15 17 18 19 20 24 25

0 1 3 4 6 7 8 10 11 12 13 14 16 17 18 20 21 22 25

0 1 26

0 1 3 12 16 21 22 27

0 6 10 11 13 17 18 20 28

0 1 4 7 8 14 29

0 1 3 12 16 19 21 22 24 30

0 1 10 11 13 17 18 20 31

1 2 4 7 8 14 32

0 1 12 16 21 22 23 33

0 1 10 11 13 18 34

0 3 7 20 23 35

0 12 15 16 17 21 36

0 1 10 13 18 25 37

1 3 11 20 22 38

0 14 16 17 21 39

1 12 13 18 19 40

0 1 7 8 10 41

0 3 9 11 22 42

1 5 16 20 21 43

0 12 13 17 44

1 2 10 18 45

0 3 4 11 22 46         Mathematical expression 22

If a specific rule can be found with respect to parts of the base matrix, the base matrix can be expressed more simply. For example, if the $27^{th}$ to last columns have a diagonal structure, such as the base matrix of FIG. 16A, it is assumed that a transceiver knows the corresponding rule, and the entry positions or entry values can be omitted. As an example, mathematical expression 23 below shows an example in which the positions of entries 1 are omitted in the $27^{th}$ to last column blocks in the mathematical expression 22.

0 1 2 3 5 6 9 10 11 12 13 15 16 18 19 20 21 22 23

0 2 3 4 5 7 8 9 11 12 14 15 16 17 19 21 22 23 24

0 1 2 4 5 6 7 8 9 10 13 14 15 17 18 19 20 24 25

0 1 3 4 6 7 8 10 11 12 13 14 16 17 18 20 21 22 25

0 1

0 1 3 12 16 21 22

0 6 10 11 13 17 18 20

0 1 4 7 8 14

0 1 3 12 16 19 21 22 24

0 1 10 11 13 17 18 20

1 2 4 7 8 14

0 1 12 16 21 22 23

0 1 10 11 13 18

0 3 7 20 23

0 12 15 16 17 21

0 1 10 13 18 25

1 3 11 20 22

0 14 16 17 21

1 12 13 18 19

0 1 7 8 10

0 3 9 11 22

1 5 16 20 21

0 12 13 17

1 2 10 18

0 3 4 11 22         Mathematical expression 23

Mathematical expression 24 indicates a position of entry 1 for each column in the base matrix of FIG. 16A. For example, in the mathematical expression 24, the third value 5 of the third sequence means that entry 1 exists in the third row and the fifth column of the base matrix (in the above-described example, it is considered that the start order of entries in the sequence and the matrix starts from 0).

0 1 2 3 4 5 6 7 8 9 11 12 13 14 15 17 19 20 22 24

0 2 3 4 5 7 8 9 10 11 12 15 16 18 19 21 23

0 1 2 10 23

0 1 3 5 8 13 16 20 24

1 2 3 7 10 24

0 1 2 21

0 2 3 6

1 2 3 7 10 13 19

1 2 3 7 10 19

0 1 2 20

0 2 3 6 9 12 15 19 23

0 1 3 6 9 12 16 20 24

0 1 3 5 8 11 14 18 22

0 2 3 6 9 12 15 18 22

1 2 3 7 10 17

0 1 2 14

0 1 3 5 8 11 14 17 21

1 2 3 6 9 14 17 22

0 2 3 6 9 12 15 18 23

0 1 2 8 18

0 2 3 6 9 13 16 21

0 1 3 5 8 11 14 17 21

0 1 3 5 8 11 16 20 24

0 1 11 13

1 2 8

2 3 15

4

5

6

7

8

9

10

11

12

13

14

15

16

17

18

19

20

21

22

23

24            Mathematical expression 24

If a specific rule can be found with respect to parts of the base matrix, the base matrix can be expressed more simply. For example, if the $27^{th}$ to last columns have a diagonal structure, such as the base matrix of FIG. 16A, it is assumed that a transceiver knows the corresponding rule, and the entry positions or entry values can be omitted. As an example, mathematical expression 25 below shows an example in which the positions of entries 1 are omitted in the $27^{th}$ to last column blocks in the mathematical expression 24.

0 1 2 3 4 5 6 7 8 9 11 12 13 14 15 17 19 20 22 24

0 2 3 4 5 7 8 9 10 11 12 15 16 18 19 21 23

0 1 2 10 23

0 1 3 5 8 13 16 20 24

1 2 3 7 10 24

0 1 2 21

0 2 3 6

1 2 3 7 10 13 19

1 2 3 7 10 19

0 1 2 20

0 2 3 6 9 12 15 19 23

0 1 3 6 9 12 16 20 24

0 1 3 5 8 11 14 18 22

0 2 3 6 9 12 15 18 22

1 2 3 7 10 17

0 1 2 14

0 1 3 5 8 11 14 17 21

1 2 3 6 9 14 17 22

0 2 3 6 9 12 15 18 23

0 1 2 8 18

0 2 3 6 9 13 16 21

0 1 3 5 8 11 14 17 21

0 1 3 5 8 11 16 20 24

0 1 11 13

1 2 8

2 3 15            Mathematical expression 25

As described above, the base matrix and the exponential matrix can be expressed in various methods. If permutation of columns or rows is applied with respect to the base matrix, it is possible to equally express the base matrix and the exponential matrix by properly changing positions of sequences or numerals in the sequences in the mathematical expressions 19 to 25.

Figure 16C:
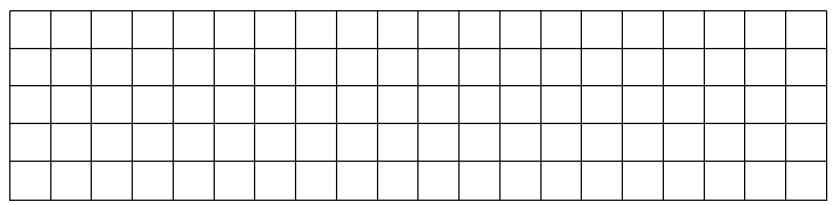
Figure 16D:
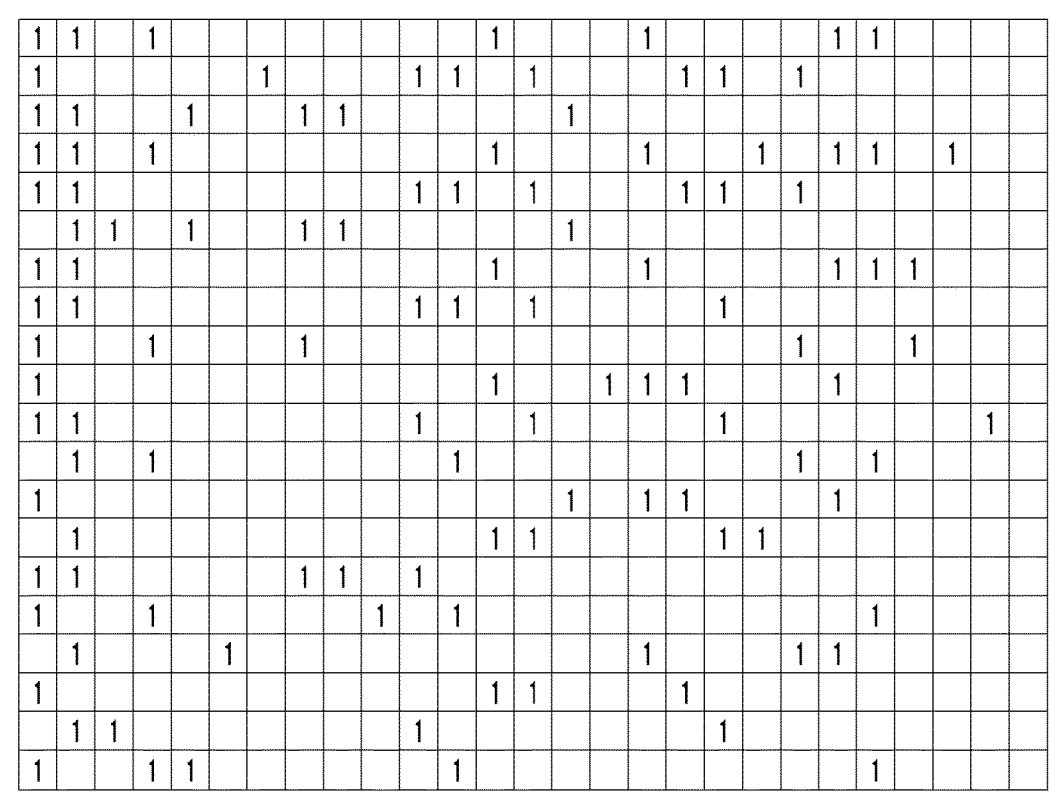

In the base matrix of FIG. 16A, the partial matrix composed of the parts in FIGS. 16B and 16C may not satisfy the balancing characteristics or partial windowing-orthogonal characteristics proposed in an embodiment of the disclosure. However, by connecting the partial matrix composed of the parts in FIGS. 16B and 16C and the partial matrix composed of the parts in FIGS. 16D and 16E with each other, it becomes possible to support an apparatus and a method for LDPC encoding and decoding supporting various coding rates and code lengths with more superior performance.

For reference, by properly shortening and puncturing parts of information word bits with respect to an LDPC code that can be generated based on the base matrix of FIG. 16A, it becomes possible to support the LDPC encoding and decoding with various coding rates and various lengths. For example, if it is assumed that information word bits corresponding to two initial columns of the base matrix of FIG. 16A are always punctured and only bits excluding parity bits corresponding to FIG. 16B are punctured, it is apparent that various coding rates from the coding rate 22/25 to 22/45 can be supported from the base matrix of FIG. 16A.

The LDPC code can adjust the coding rate by applying puncturing of the codeword bits in accordance with the coding rate. In case of puncturing the parity bits corresponding to the column having the degree of 1, the LDPC code based on the base matrix or the exponential matrix proposed in an embodiment of the disclosure can perform decoding without using the corresponding part in the parity check matrix, and thus decoding complexity can be reduced. However, in case of considering the coding performance, the performance of the LDPC code can be improved through adjustment of the puncturing order of the parity bits or the transmission order of the generated LDPC codewords.

In general, the performance can be further improved by applying proper rate matching after generating the LDPC codeword using the base matrix or the exponential matrix proposed in an embodiment of the disclosure. Based on the rate matching, the order of columns in the base matrix or the exponential matrix may be properly realigned to be applied to the LDPC encoding and decoding.

The LDPC encoding process may include determining a size of input bits (or code blocks) for applying the LDPC encoding, determining a block size Z for applying the LDPC encoding in accordance with the size, determining a proper LDPC exponential matrix or a sequence in accordance with the block size, and performing LDPC encoding based on the block size Z, the determined exponential matrix or LDPC sequence. In this case, the LDPC exponential matrix or sequence may be applied to the LDPC encoding without any conversion, and according to circumstances, the LDPC encoding may be performed by properly converting the LDPC exponential matrix or sequence in accordance with the block size Z.

In the same manner, the LDPC decoding process may include determining a size of input bits (or code blocks) for the transmitted LDPC codeword, determining a block size Z for applying the LDPC decoding in accordance with the size, determining a proper LDPC exponential matrix or a sequence in accordance with the block size, and performing LDPC decoding based on the block size Z, the determined exponential matrix or LDPC sequence. In this case, the LDPC exponential matrix or sequence may be applied to the LDPC decoding without any conversion, and according to circumstances, the LDPC decoding may be performed by properly converting the LDPC exponential matrix or sequence in accordance with the block size Z.

Here, the base matrix for the LDPC exponential matrix or sequence may be featured to be the base matrix of FIG. 15A, 16A, or 17A to be described hereinafter.

Another embodiment of a base matrix for LDPC encoding and decoding supporting various coding rates and code lengths based on the base matrix satisfying balancing and partial windowing-orthogonal characteristics proposed in an embodiment of the disclosure is shown in FIGS. 17A to 17J.

FIGS. 17A to 17J are diagrams of other elementary matrices according to various embodiments of the disclosure.

Referring to FIGS. 17A to 17J, FIG. 17A is a diagram illustrating a base matrix having a size of 46×68. In the base matrix of FIGS. 17A to 17J, empty blocks generally mean 0, and indicate parts corresponding to a zero matrix having a size of Z×Z in a parity check matrix.

Figure 16E:
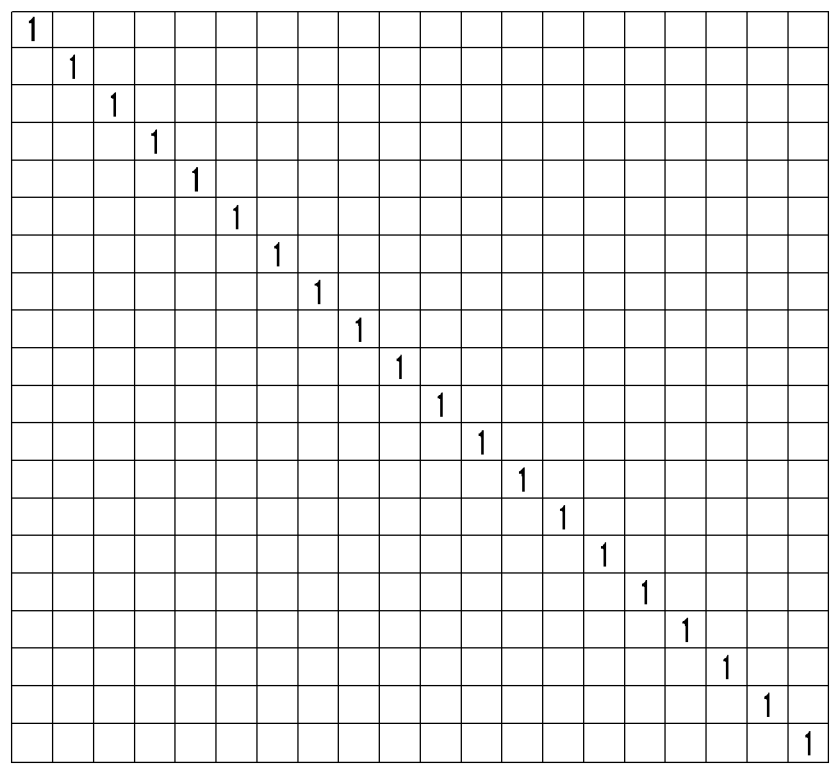
Figure 17A:
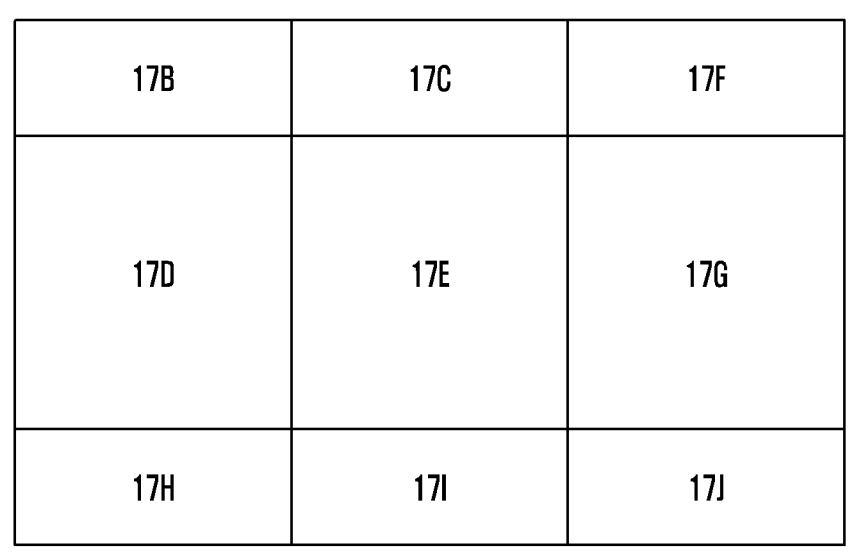
Figure 17C:
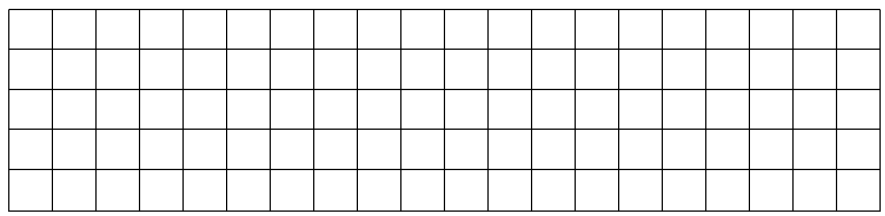
Figure 17D:
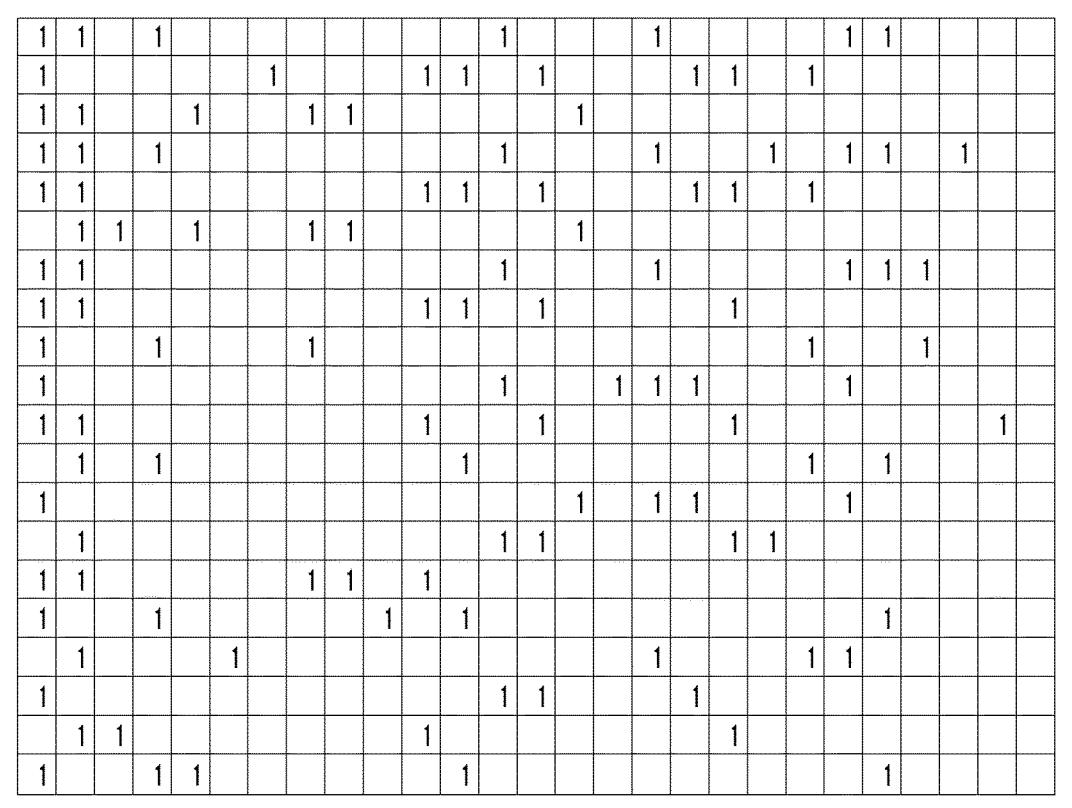
Figure 17E:
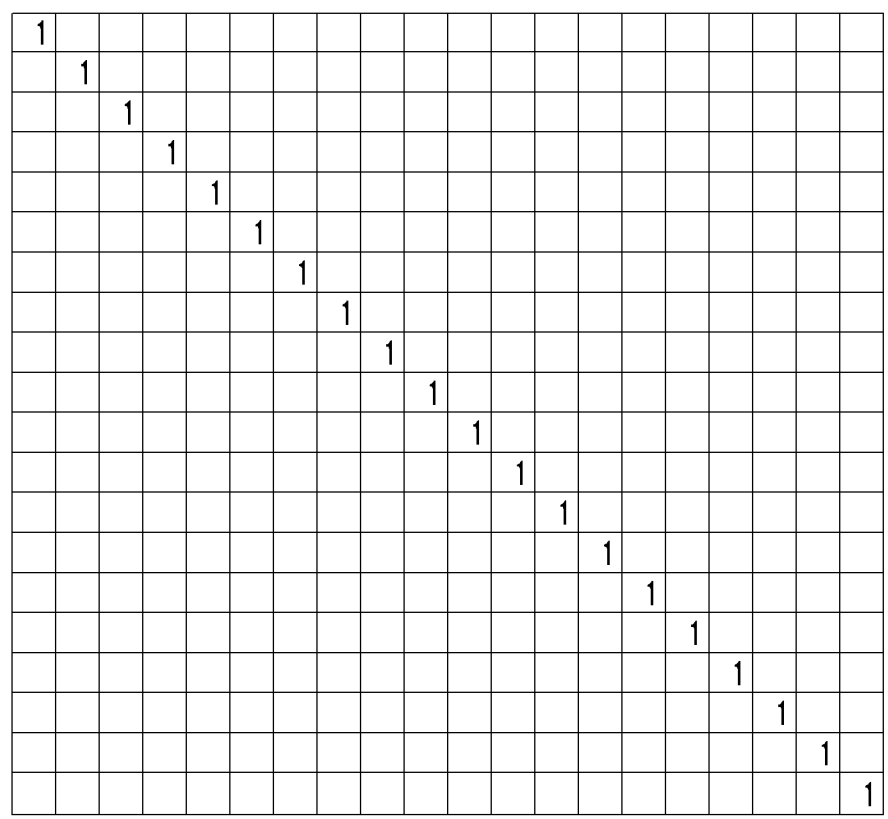

Further, FIGS. 17B to 17J are enlarged diagrams illustrating respective parts of the base matrix of FIG. 17A. FIG. 17A corresponds to a matrix in which matrices corresponding to drawing reference numerals described on the respective parts are combined. Accordingly, one base matrix can be configured through combination of the parts of FIGS. 17B to 17J. For reference, FIGS. 16B and 17B are equal to each other, FIGS. 16C and 17D are equal to each other, FIGS. 15B, 16D, and 17D are equal to each other, and FIGS. 15C, 16E, and 17E are equal to each other.

In general, if parts in FIGS. 17F, 17G, and 17I are configured as zero matrices and parts in FIG. 17J are configured as identity matrices or matrices having a diagonal structure, the whole base matrix structure has an extended form without being greatly different from that of FIGS. 16A to 16E, and thus code connection is facilitated.

Further, if each row of FIG. 17H has the orthogonal characteristics, it is easy to implement a decoder supporting high decoding throughput.

As a result, the base matrix of FIGS. 17A to 17J can support more various coding rates as compared with the base matrix of FIG. 16A using the base matrix of FIG. 17H in which each row has the orthogonal characteristics while maintaining the extended form against the base matrix of FIGS. 16A to 16E.

Although FIGS. 16A and 17A illustrate only a case where the base matrix of FIG. 15A is used as it is, it is general to realign the order of columns of the base matrix of FIG. 15A, to realign the order of rows, or to realign the order of columns and rows. Further, by connecting the realigned base matrix to that of FIGS. 16B and 16C, a new base matrix in the form as shown in FIG. 16A may be used for the LDPC encoding and decoding method and apparatus. For example, by applying the realigned base matrix to that of FIGS. 16D and 16E, a new base matrix in the similar form to that of FIG. 16A can be generated.

In the same manner, by connecting the realigned base matrix to that of FIGS. 17B and 17C, a new base matrix in the form as shown in FIG. 17A may be used for the LDPC encoding and decoding method and apparatus. For example, by applying the realigned base matrix to that of FIGS. 17D and 17E, a new base matrix in the similar form to that of FIG. 17A can be generated.

Although FIG. 17A illustrates only a case where the base matrix of FIG. 16A is used as it is, it is general to realign the order of columns of the base matrix of FIG. 16A, to realign the order of rows, or to realign the order of columns and rows. Further, by applying the realigned base matrix to that of FIGS. 17B, 17C, 17D, and 17E, a new base matrix in a form similar to that of FIG. 17A may be applied to the LDPC encoding and decoding method and apparatus. As described above, by applying the base matrix of FIG. 16A to that of FIG. 17A, an example of a base matrix is presented through the LDPC sequence expressed in the mathematical expression 26.

The mathematical expression 26 indicates a position of entry 1 for each row in the base matrix, and as shown in FIG. 17A, it may be expressed in the form of the LDPC base matrix. As the base matrix corresponding to mathematical expression 26, parts in FIGS. 17F, 17G, and 17I are configured as zero matrices, and parts in FIG. 17J are configured as identity matrices. FIG. 17H shows an example of a base matrix in which each row has the orthogonal characteristics. Further, the base matrix expressed in the mathematical expression 26 can be expressed in various forms through a method similar to that expressed in the mathematical expressions 23 to 25.

0 1 2 3 5 6 9 10 11 12 13 15 16 18 19 20 21 22 23

0 2 3 4 5 7 8 9 11 12 14 15 16 17 19 21 22 23 24

0 1 2 4 5 6 7 8 9 10 13 14 15 17 18 19 20 24 25

0 1 3 4 6 7 8 10 11 12 13 14 16 17 18 20 21 22 25

0 1 26

0 1 3 12 16 21 22 27

0 6 10 11 13 17 18 20 28

0 1 4 7 8 14 29

0 1 3 12 16 19 21 22 24 30

0 1 10 11 13 17 18 20 31

1 2 4 7 8 14 32

0 1 12 16 21 22 23 33

0 1 10 11 13 18 34

0 3 7 20 23 35

0 12 15 16 17 21 36

0 1 10 13 18 25 37

1 3 11 20 22 38

0 14 16 17 21 39

$$\begin{aligned}
&1\ 12\ 13\ 18\ 19\ 40\\
&0\ 1\ 7\ 8\ 10\ 41\\
&0\ 3\ 9\ 11\ 22\ 42\\
&16\ 20\ 21\ 43\\
&0\ 12\ 13\ 17\ 44\\
&1\ 2\ 10\ 18\ 45\\
&0\ 3\ 4\ 11\ 22\ 46\\
&1\ 6\ 7\ 14\ 47\\
&0\ 2\ 4\ 15\ 48\\
&1\ 6\ 8\ 49\\
&0\ 4\ 19\ 21\ 50\\
&1\ 14\ 18\ 25\ 51\\
&0\ 10\ 13\ 24\ 52\\
&1\ 7\ 22\ 25\ 53\\
&0\ 12\ 14\ 24\ 54\\
&1\ 2\ 11\ 21\ 55\\
&0\ 7\ 15\ 17\ 56\\
&1\ 6\ 12\ 22\ 57\\
&0\ 14\ 15\ 18\ 58\\
&1\ 13\ 23\ 59\\
&0\ 9\ 10\ 12\ 60\\
&1\ 3\ 7\ 19\ 61\\
&0\ 8\ 17\ 62\\
&1\ 3\ 9\ 18\ 63\\
&0\ 4\ 24\ 64\\
&1\ 16\ 18\ 25\ 65\\
&0\ 7\ 9\ 22\ 66\\
&1\ 6\ 10\ 67
\end{aligned}\qquad\text{Mathematical expression 26}$$

In general, in case of supporting a variable information word length or variable code rate using shortening or zero padding of the LDPC code, the performance of the LDPC code can be improved in accordance with the shortening order. If the shortening order is predetermined, the encoding performance can be improved by properly realigning the order of a part or the whole of the given base matrix.

An example of the realigned base matrix as described above is illustrated in FIGS. 18A to 18E. In the base matrix of FIGS. 18A to 18E, empty blocks generally mean 0, and indicate parts corresponding to a zero matrix having a size of Z×Z in a parity check matrix.

FIGS. 18A, 18B, 18C, 18D, and 18E are diagrams of other elementary matrices according to various embodiments of the disclosure.

Figure 18A:
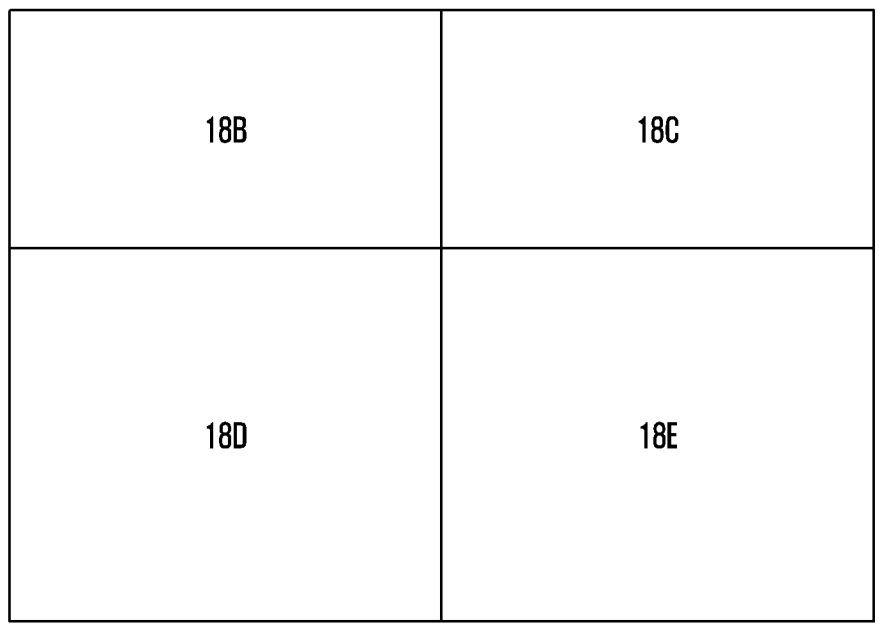

Referring to FIG. 18A, it can be easily known that the base matrix of FIG. 18A has a structure in which the order of the $7^{th}$ column and the $21^{st}$ column of FIG. 15A (if it is considered that the initial column is zeroth column, $6^{th}$ column and $20^{th}$ column) is changed and realigned and then connected to the parts of FIGS. 16B and 16C.

The base matrix of FIG. 18A is merely an example of a base matrix that can be obtained by realigning the columns of FIG. 15A, and a new base matrix may be defined in accordance with the performance improvement effect or various purposes. Further, by substituting FIG. 18B for FIG. 17B, FIG. 18C for FIG. 17C, FIG. 18D for FIG. 17D, and FIG. 18E for FIG. 17E, respectively, a new base matrix having a similar form to that of FIG. 17A can be generated.

The base matrix illustrated in FIG. 18A can be expressed in various forms, and as an example, they can be expressed using sequences as expressed in mathematical expression 27. The mathematical expression 27 indicates a position of entry 1 for each row in the base matrix of FIG. 18A.

$$\begin{aligned}
&0\ 1\ 2\ 3\ 5\ 6\ 9\ 10\ 11\ 12\ 13\ 15\ 16\ 18\ 19\ 20\ 21\ 22\ 23\\
&0\ 2\ 3\ 4\ 5\ 7\ 8\ 9\ 11\ 12\ 14\ 15\ 16\ 17\ 19\ 21\ 22\ 23\ 24\\
&0\ 1\ 2\ 4\ 5\ 6\ 7\ 8\ 9\ 10\ 13\ 14\ 15\ 17\ 18\ 19\ 20\ 24\ 25\\
&0\ 1\ 3\ 4\ 6\ 7\ 8\ 10\ 11\ 12\ 13\ 14\ 16\ 17\ 18\ 20\ 21\ 22\ 25\\
&0\ 1\ 26\\
&0\ 1\ 3\ 12\ 16\ 21\ 22\ 27\\
&0\ 6\ 10\ 11\ 13\ 17\ 18\ 20\ 28\\
&0\ 1\ 4\ 7\ 8\ 14\ 29\\
&0\ 1\ 3\ 12\ 16\ 19\ 21\ 22\ 24\ 30\\
&0\ 1\ 6\ 10\ 11\ 13\ 17\ 18\ 31\\
&1\ 2\ 4\ 7\ 8\ 14\ 32\\
&0\ 1\ 12\ 16\ 21\ 22\ 23\ 33\\
&0\ 1\ 10\ 11\ 13\ 18\ 34\\
&0\ 3\ 6\ 7\ 23\ 35\\
&0\ 12\ 15\ 16\ 17\ 21\ 36\\
&0\ 1\ 10\ 13\ 18\ 25\ 37\\
&1\ 3\ 6\ 11\ 22\ 38\\
&0\ 14\ 16\ 17\ 21\ 39\\
&1\ 12\ 13\ 18\ 19\ 40\\
&0\ 1\ 7\ 8\ 10\ 41\\
&0\ 3\ 9\ 11\ 22\ 42\\
&1\ 5\ 6\ 16\ 21\ 43\\
&0\ 12\ 13\ 17\ 44\\
&1\ 2\ 10\ 18\ 45\\
&0\ 3\ 4\ 11\ 22\ 46
\end{aligned}\qquad\text{Mathematical expression 27}$$

If a specific rule can be found with respect to parts of the base matrix, the base matrix can be expressed more simply. For example, if the $27^{th}$ to last columns have a diagonal structure, such as the base matrix of FIG. 18A, it is assumed that a transceiver knows the corresponding rule, and the entry positions or entry values can be omitted. As an example, mathematical expression 28 below shows an example in which the positions of entries 1 are omitted in the $27^{th}$ to last column blocks in the mathematical expression 27.

0 1 2 3 5 6 9 10 11 12 13 15 16 18 19 20 21 22 23

0 2 3 4 5 7 8 9 11 12 14 15 16 17 19 21 22 23 24

0 1 2 4 5 6 7 8 9 10 13 14 15 17 18 19 20 24 25

0 1 3 4 6 7 8 10 11 12 13 14 16 17 18 20 21 22 25

0 1

0 1 3 12 16 21 22

0 6 10 11 13 17 18 20

0 1 4 7 8 14

0 1 3 12 16 19 21 22 24

0 1 6 10 11 13 17 18

1 2 4 7 8 14

0 1 12 16 21 22 23

0 1 10 11 13 18

0 3 6 7 23

0 12 15 16 17 21

0 1 10 13 18 25

1 3 6 11 22

0 14 16 17 21

1 12 13 18 19

0 1 7 8 10

0 3 9 11 22

1 5 6 16 21

0 12 13 17

1 2 10 18

0 3 4 11 22    Mathematical expression 28

As described above, the base matrix and the exponential matrix can be expressed in various methods. If permutation of columns or rows of a partial matrix is applied to the base matrix or a part of the base matrix, a new base matrix can be defined by properly changing the sequence or positions of numerals in the sequence expressed in the mathematical expressions 19 to 28.

As another embodiment of the disclosure, a method for applying a plurality of exponential matrices or LDPC sequences based on the base matrix of FIG. 18A is proposed. In other words, the base matrix is as illustrated in FIG. 18A, an exponential matrix or a sequence of the LDPC code is obtained on the base matrix, and a variable length LDPC encoding and decoding is performed by applying lifting to match the block size included in each block size group from the exponential matrix or sequence. In other words, base matrices of a parity check matrix corresponding to the exponential matrix or sequence of a plurality of different LDPC codes are equal to each other. According to this method, entries or numerals constituting the exponential matrix of the LDPC code or LDPC sequence may have different values, but positions of the corresponding entries or numerals accurately coincide with each other. As described above, the exponential matrices or sequences of the LDPC code mean indexes of circulant permutation matrices, that is, a kind of circulant permutation values for the bits, and by configuring the positions of the entries or numerals to be equal to each other, the positions of the bits corresponding to the corresponding circulant permutation matrix can be easily grasped.

First, the block size Z to be supported is divided into a plurality of block size groups (or sets) as expressed in mathematical expression 20 below. It is to be noted that the block size Z is a value corresponding to the size Z×Z of the circulant permutation matrix or circulant matrix in the parity check matrix of the LDPC code.

$Z1=\{3,6,12,24,48,96,192,384\}$ $Z2=\{11,22,44,88,176,352\}$ $Z3=\{5,10,20,40,80,160,320\}$ $Z4=\{9,18,36,72,144,288\}$ $Z5=\{2,4,8,16,32,64,128,256\}$ $Z6=\{15,30,60,120,240\}$ $Z7=\{7,14,28,56,112,224\}$ $Z8=\{13,26,52,104,208\}$    Mathematical expression 29

The mathematical expression 29 is merely various, and all block size Z values included in the block size group of the mathematical expression 29 may be used, or block size values included in a proper partial matrix as expressed in mathematical expression 30 below. Further, proper values may be added to the block size group (set) expressed in the mathematical expression 29 or 30 to be used.

$Z1'=\{12,24,48,96,192,384\}$ $Z2'=\{11,22,44,88,176,352\}$ $Z3'=\{10,20,40,80,160,320\}$ $Z4'=\{9,18,36,72,144,288\}$ $Z5'=\{8,16,32,64,128,256\}$ $Z6'=\{15,30,60,120,240\}$ $Z7'=\{14,28,56,112,224\}$ $Z8'=\{13,26,52,104,208\}$    Mathematical expression 30

The block size groups expressed in the mathematical expression 29 or 30 are featured so that they have different particle sizes and the ratios of neighbor block sizes are all equal integers. In other words, the sizes of the blocks included in one group are in a divisor or multiple relationship with each other. If it is assumed that the exponential matrices corresponding to the p-th p (p=1, 2, ..., 8) group are $E_P=(e_{i,j}^{(p)})$, and the exponential matrices corresponding to Z values included in the p-th group is $E_P(Z)=(e_{i,j}(Z))$, a sequence conversion method expressed in the mathematical expression 17 is applied using $f_P(x,Z)=x(\mod Z)$. For example, if the block size Z is determined as Z=28, respective entries $e_{i,j}(28)$ of the exponential matrix $E_7(28)=(e_{i,j}(28))$ for $Z=28$ can be obtained as in mathematical expression 31 below with respect to the exponential matrix $E_7=(e_{i,j}^{(7)})$ corresponding to the $7^{th}$ block size group in which $z=28$ is included.

$$e_{i,j}(28) = \begin{cases} e_{i,j}^{(7)} & e_{i,j}^{(7)} \leq 0 \\ e_{i,j}^{(7)}(\text{mod}28) & e_{i,j}^{(7)} > 0 \end{cases} \quad \text{Mathematical expression 31}$$

or $$e_{i,j}(28) = \begin{cases} e_{i,j}^{(7)} & e_{i,j}^{(7)} < 0 \\ e_{i,j}^{(7)}(\text{mod}28) & e_{i,j}^{(7)} \geq 0 \end{cases}$$

The conversion as expressed in the mathematical expression 31 may be simply expressed as in mathematical expression 32 below.

$$E_p(Z)=E_p(\text{mod } Z), Z \in Z_p \quad \text{Mathematical expression 32}$$

The base matrix of the LDPC code and the exponential matrix (or LDPC sequence) designed based on the mathematical expressions 29 to 32 are shown in FIGS. 19 to 26. For reference, although explanation has been made on the assumption that lifting or conversion of the exponential matrix expressed in the mathematical expression 17, 31, or 32 is applied to the whole exponential matrix corresponding to the parity check matrix, it can be applied to a part of the exponential matrix. For example, it is general that the partial matrix corresponding to the parity bits of the parity check matrix has a special structure for efficient encoding. In this case, the encoding method or complexity may be changed due to the lifting. Accordingly, in order to maintain the same encoding method or complexity, with respect to a part of the exponential matrix for the partial matrix corresponding to the parity in the parity check matrix, the lifting may not be applied, or a different lifting from the lifting method applied to the exponential matrix for the partial matrix corresponding to information word bits may be applied. In other words, the lifting method applied to the sequence corresponding to the information word bits in the exponential matrix and the lifting method applied to the sequence corresponding to the parity bits may be differently configured, and according to circumstances, the lifting is not applied to a part or the whole of the sequence corresponding to the parity bit, and thus a fixed value may be used without sequence conversion.

Figure 19A:
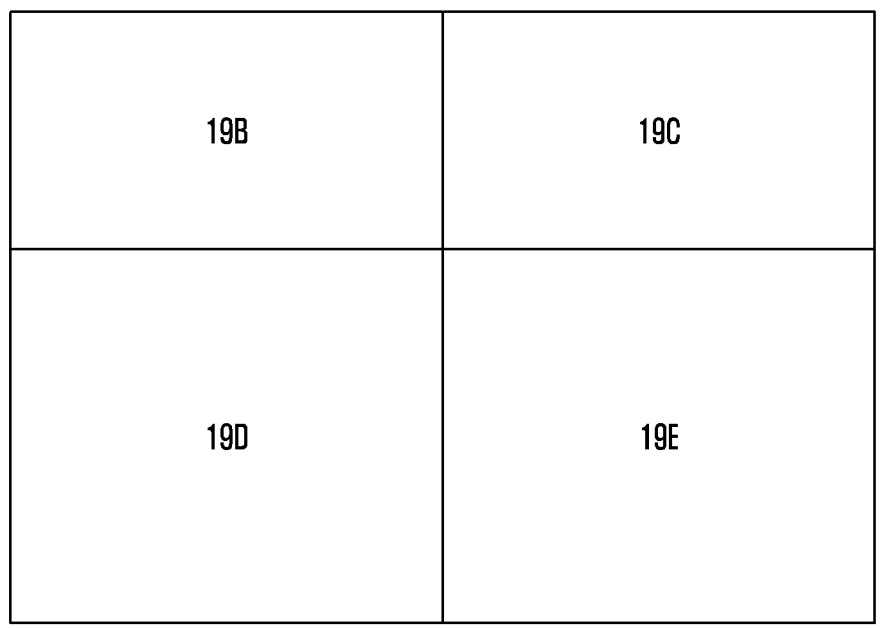
Figure 19C:
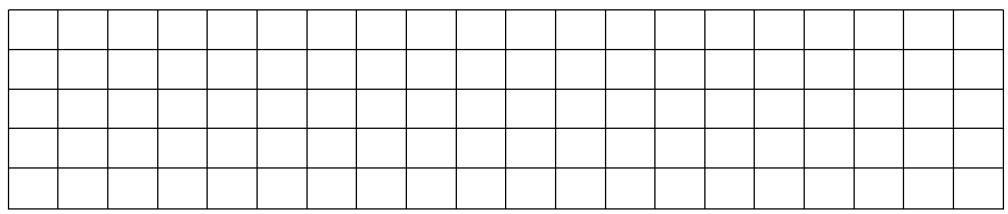
Figure 19E:
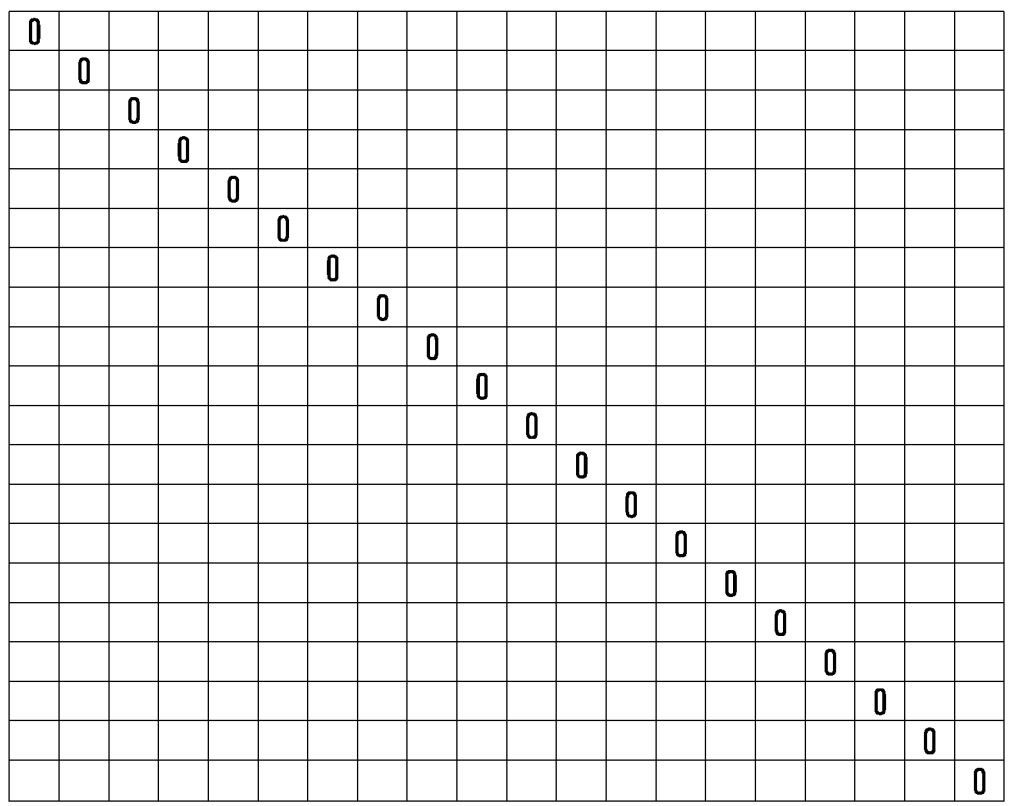
Figure 20A:
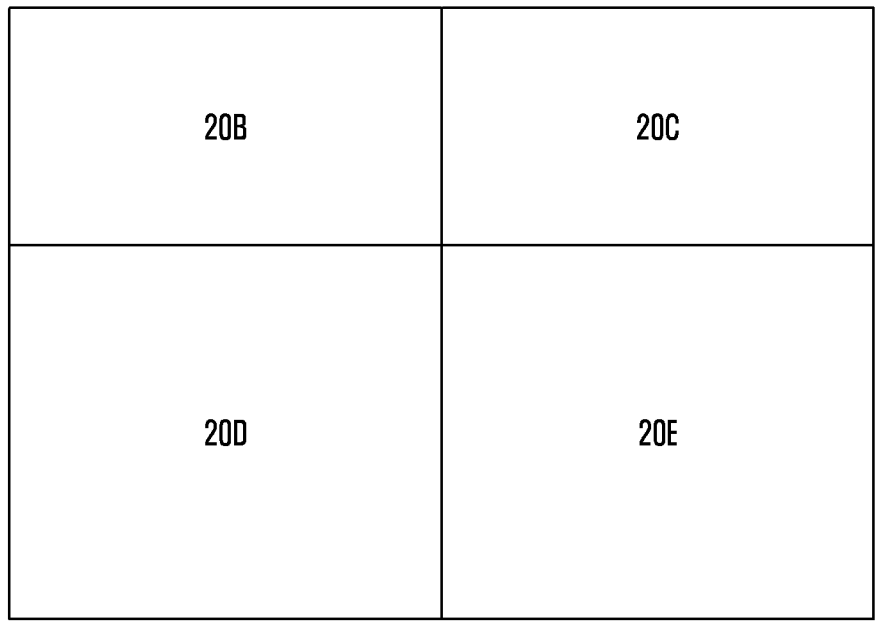
Figure 20C:
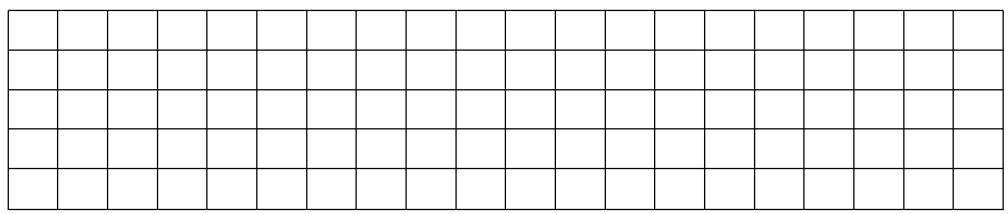
Figure 20E:
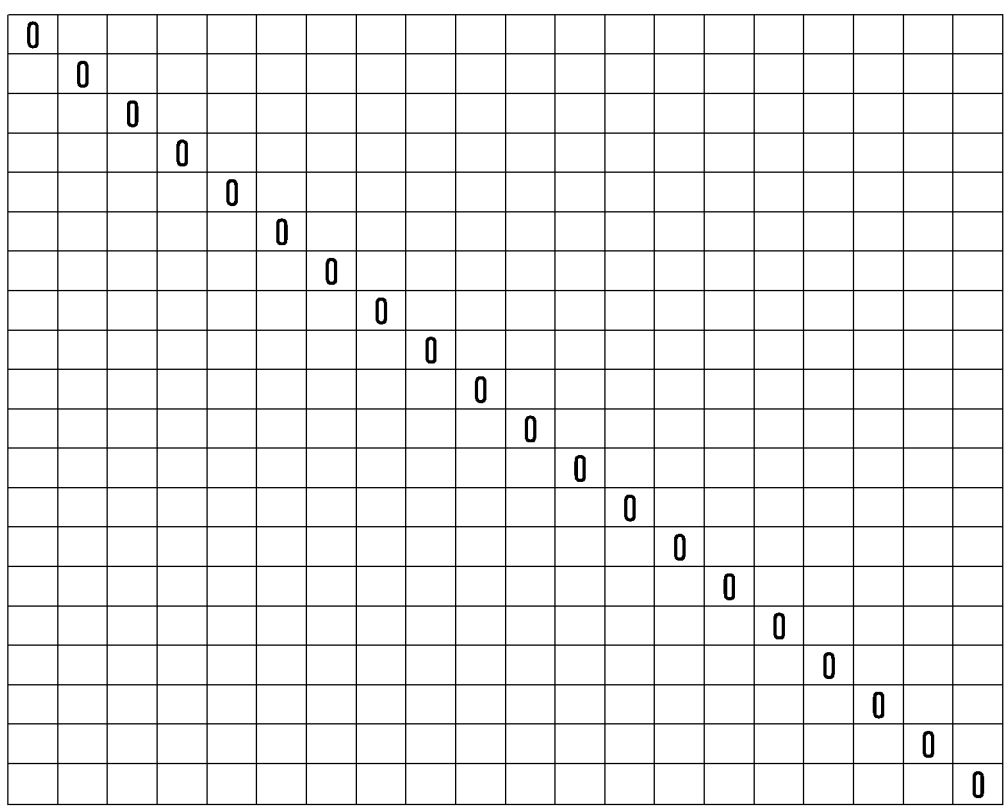

Embodiments of exponential matrices corresponding to the parity check matrix of the QC LDPC code designed based on the mathematical expressions 29 to 32 are successively illustrated in FIGS. 19A and 20A (it is to be noted that in the exponential matrix of FIGS. 19A and 20A, empty blocks are parts corresponding to zero matrices having the size of Z×Z. According to circumstances, in the exponential matrix of FIGS. 19A and 20A, empty blocks can be expressed as specified values, such as −1 and the like). The exponential matrices of the LDPC code illustrated in FIGS. 19A and 20A are featured to have the same base matrix as that of FIG. 18A.

FIGS. 19A and 20A illustrate LDPC exponential matrices having a size of 25×47, and respectively correspond to first and second block size groups expressed in the mathematical expressions 29 and 30. Further, in a partial matrix composed of 4 upper rows and 26 front columns in each exponential matrix, there is no column having the degree of 1. In other words, in the parity check matrix that can be generated by applying the lifting from the partial matrix, there is no column or column block having the degree of 1.

FIGS. 19A to 19E are diagrams of other exponential matrices according to various embodiments of the disclosure.

Referring to FIGS. 19A to 19E, FIGS. 19B to 19E are enlarged diagrams illustrating respective parts of the exponential matrix of FIG. 19A. FIG. 19A corresponds to a matrix in the drawing corresponding to drawing reference numerals described on the respective parts. Accordingly, one base matrix can be configured through combination of the parts of FIGS. 19B to 19E.

FIGS. 20A to 20E are diagrams of other exponential matrices according to various embodiments of the disclosure.

Referring to FIGS. 20A to 20E, FIG. 20A is an enlarged diagram illustrating respective parts after dividing the respective exponential matrices.

The exponential matrix illustrated in FIGS. 19A and 20A is further featured so that the $28^{th}$ to $47^{th}$ columns have the degree of 1 in all. For example, the base matrix or the exponential matrix having a size of 21×47 and composed of $5^{th}$ to $25^{th}$ rows of the exponential matrices corresponds to a large number of single parity check codes.

The exponential matrices illustrated in FIGS. 19A and 20A correspond to the LDPC code designed based on the block size group defined in the mathematical expression 29 or 30. However, in accordance with the system requirements, it is not necessary to support all block sizes included in the block size group, and according to circumstances, other values may be added in addition to the block size illustrated in FIGS. 19 and 20. For example, the exponential matrices illustrated in FIGS. 19 and 20 can support not only the block size corresponding to the block size group (set) defined in the mathematical expression 29 or 30 but also the block size corresponding to the subset of the respective groups (sets), and according to circumstances, other values can be supported.

Further, depending on the system, the exponential matrices illustrated in FIGS. 10A and 20A may be used as they are, or only a part thereof may be used. For example, the partial matrix having a size of 5×27 composed of 5 upper rows and 27 front columns of the respective exponential matrices of FIGS. 19A and 20A is excluded, and the LDPC exponential matrix having a size of 5×27 that is different from the partial matrix and the partial matrix having a size of 20×47 composed of the $6^{th}$ to last rows of the respective exponential matrices of FIGS. 19A and 20A are connected with each other to be used in the LDPC encoding and decoding apparatus and method based on a new base matrix.

Figure 18C:
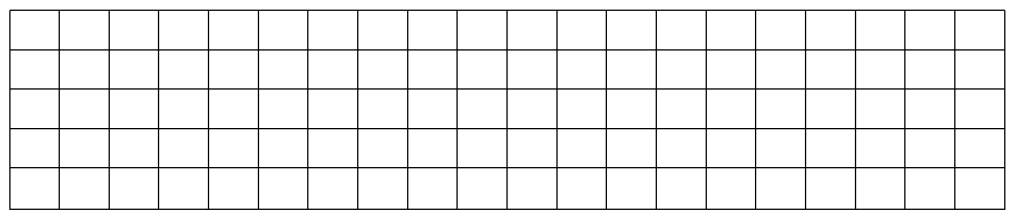
Figure 18D:
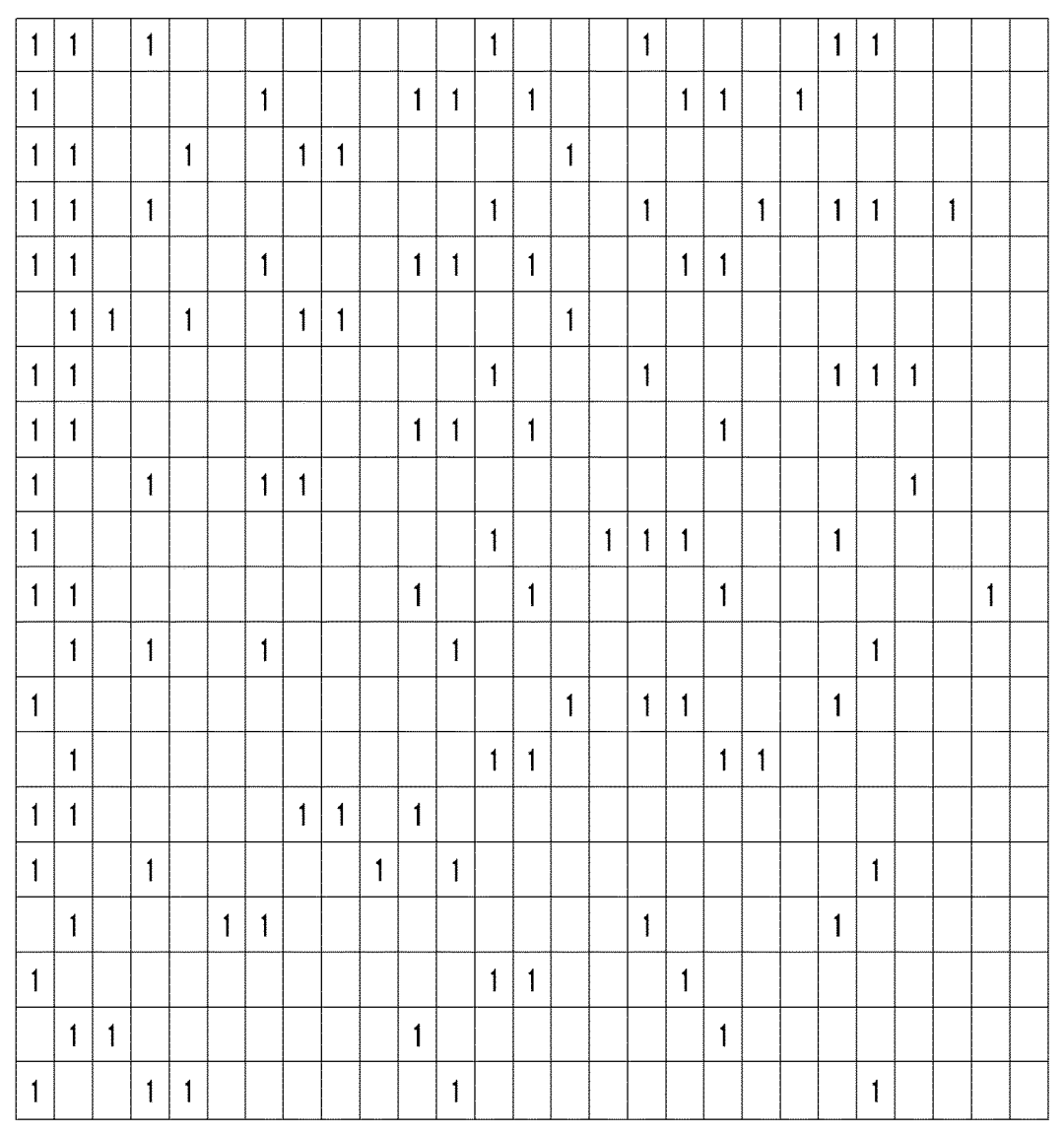
Figure 18E:
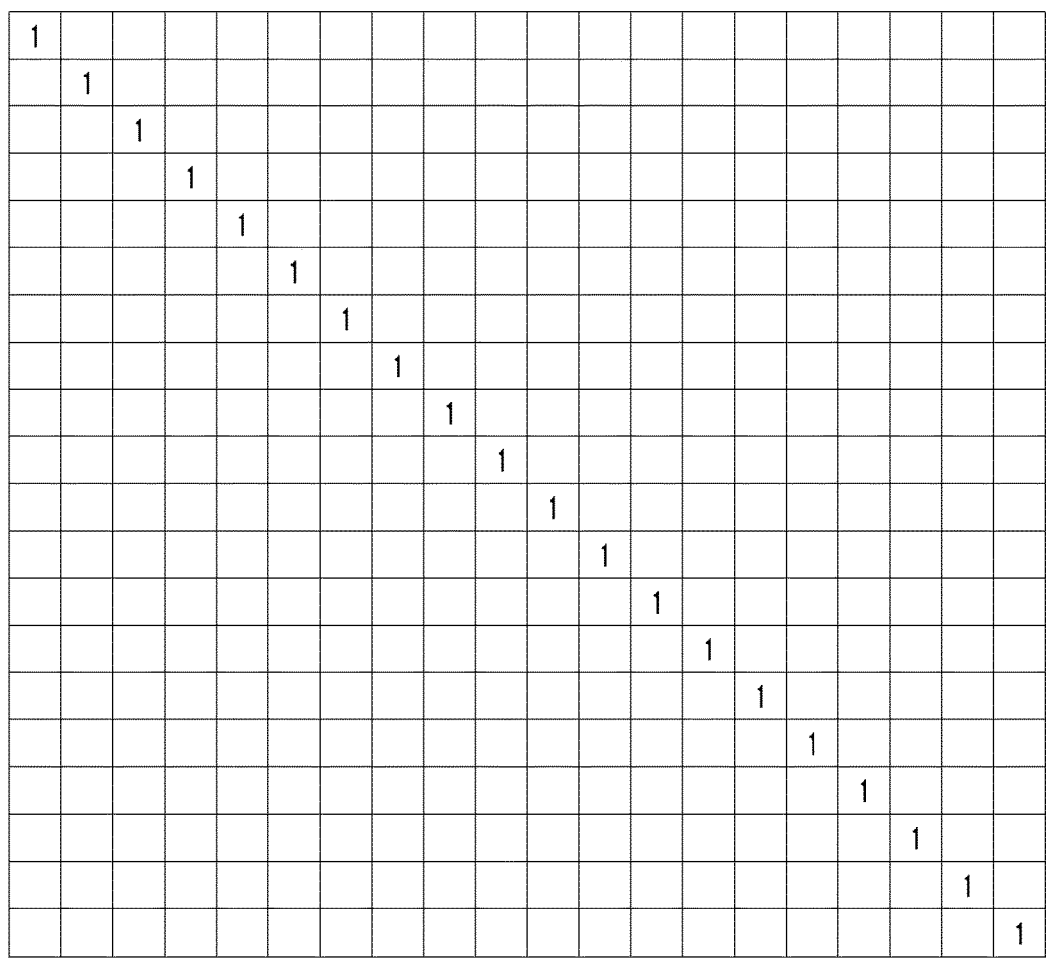

Since the LDPC exponential matrices of FIGS. 19A and 20A have the same base matrix of FIG. 18A, they may be applied to and used in a new base matrix in a similar form to that of FIG. 17A that can be obtained by substituting FIG. 18B for FIG. 17B, FIG. 18C for FIG. 17C, FIG. 18D for FIG. 17D, and FIG. 18E for FIG. 17E, respectively. For example, by making the exponential matrices of FIGS. 19A and 20A correspond to the partial matrices corresponding to FIGS. 17B, 17C, 17D, and 17E and making proper exponential matrices correspond to FIGS. 17F, 17G, 17H, 17I, and 17J, new LDPC index matrices are defined to be used in the LDPC encoding and decoding apparatus and method. In this case, all LDPC index matrices have the base matrix of FIG. 17A, and the partial matrices corresponding to FIGS. 17B, 17C, 17D, and 17E in the base matrix become equal to those of FIG. 18A.

In general, the LDPC encoding and decoding may be performed by applying the partial matrix configured by properly selecting rows and columns from the base matrices of FIGS. 15A, 16A, 17A, and 18A as new base matrices. In the same manner, the partial matrices configured by properly selecting rows and columns from the exponential matrices of FIGS. 19A and 20A may be applied as base matrices to the LDPC encoding and decoding apparatus and method.

FIGS. 21A to 21J are diagrams of other elementary matrices according to various embodiments of the disclosure.

Figure 21A:
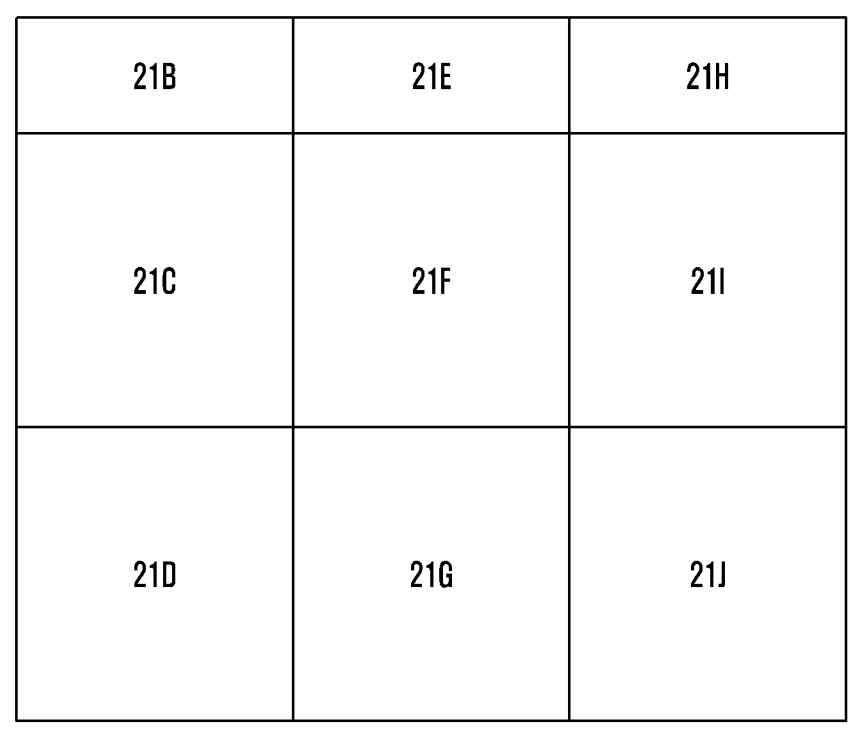
Figure 21D:
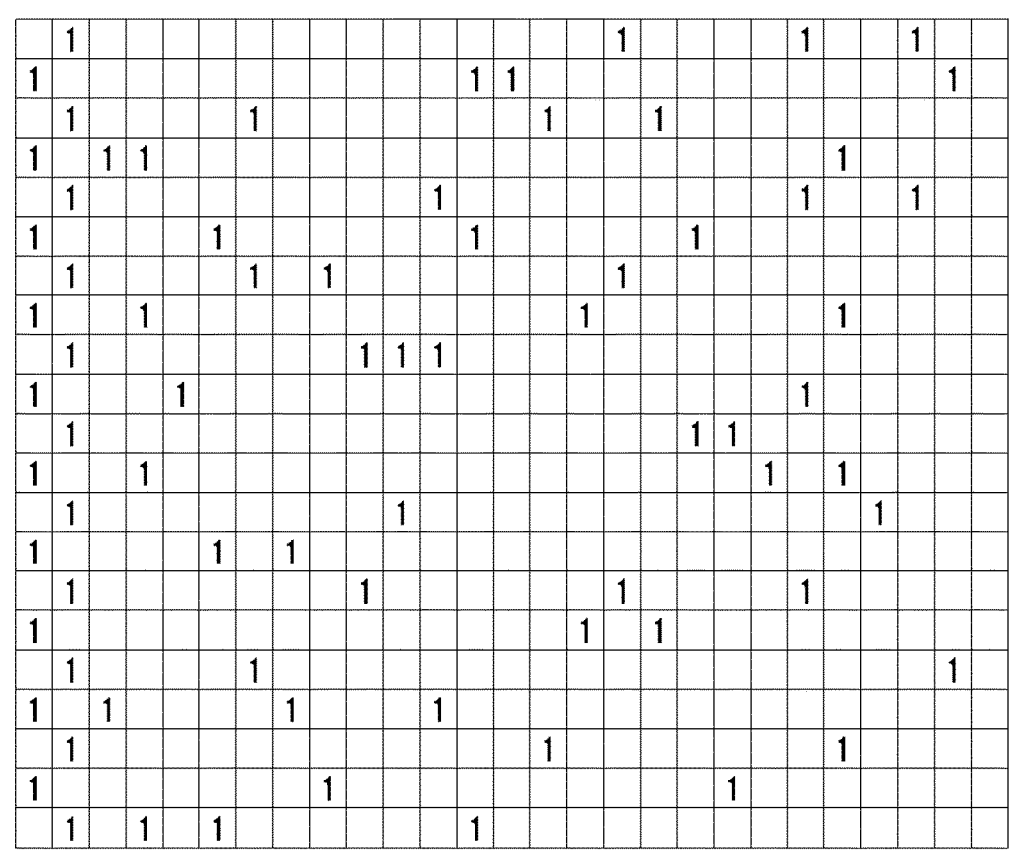
Figure 21E:
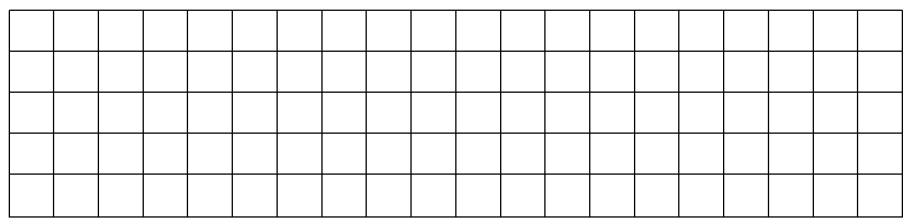
Figure 21F:
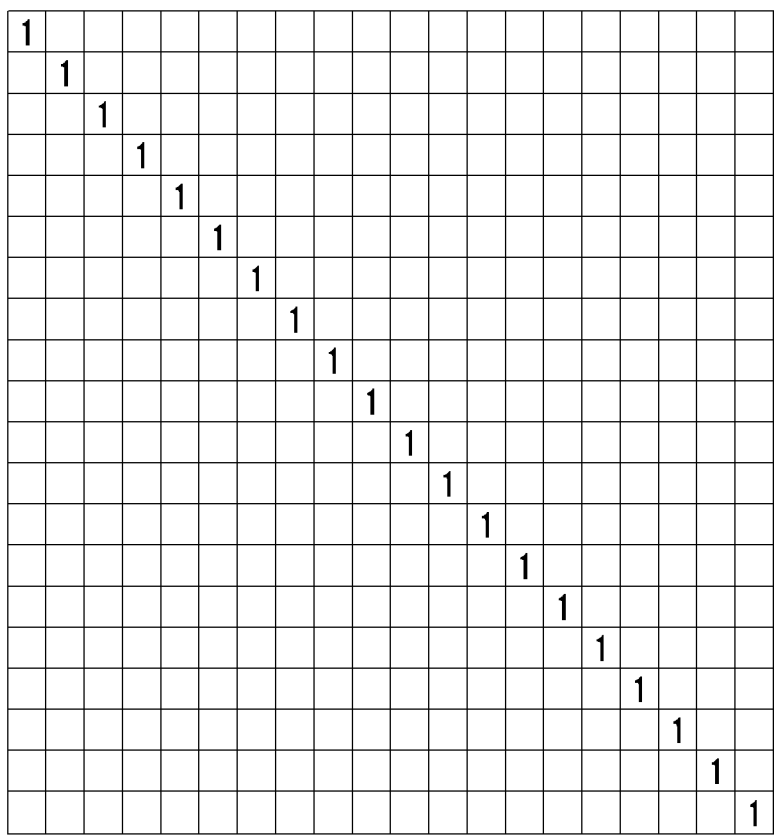
Figure 21G:
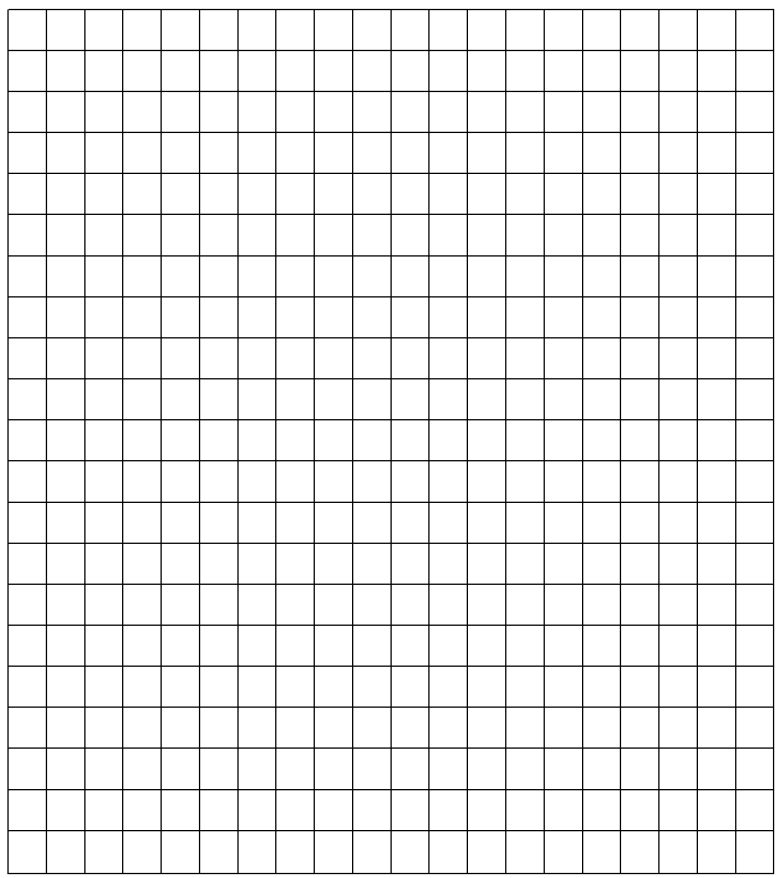
Figure 21H:
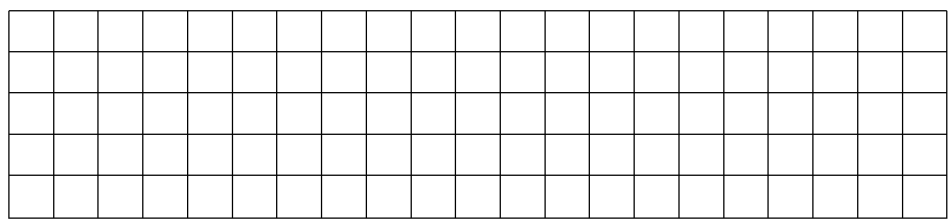
Figure 21I:
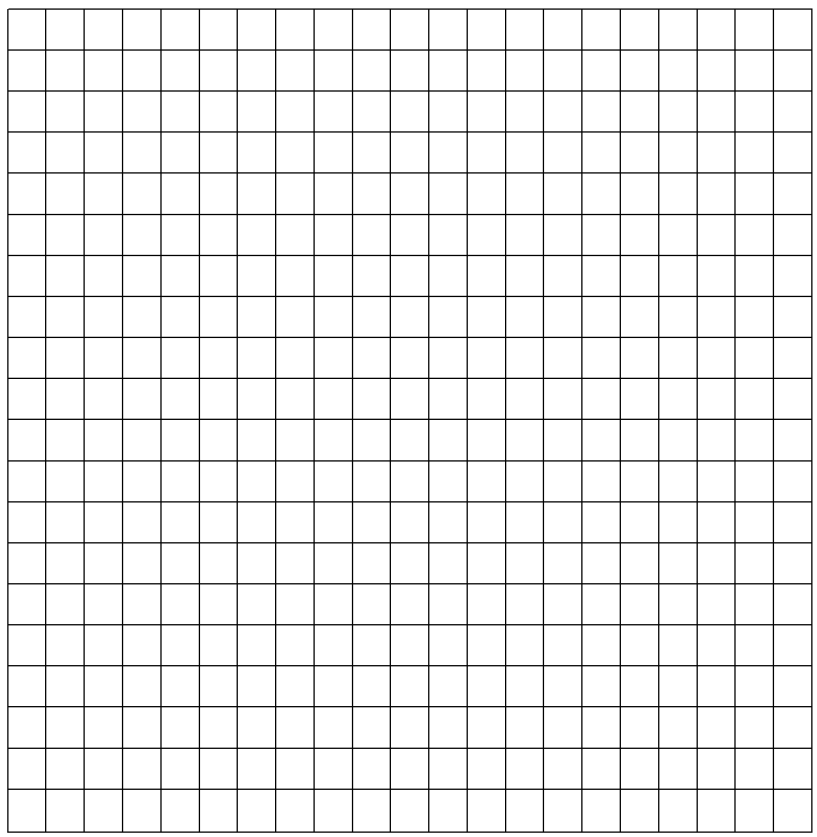
Figure 21J:
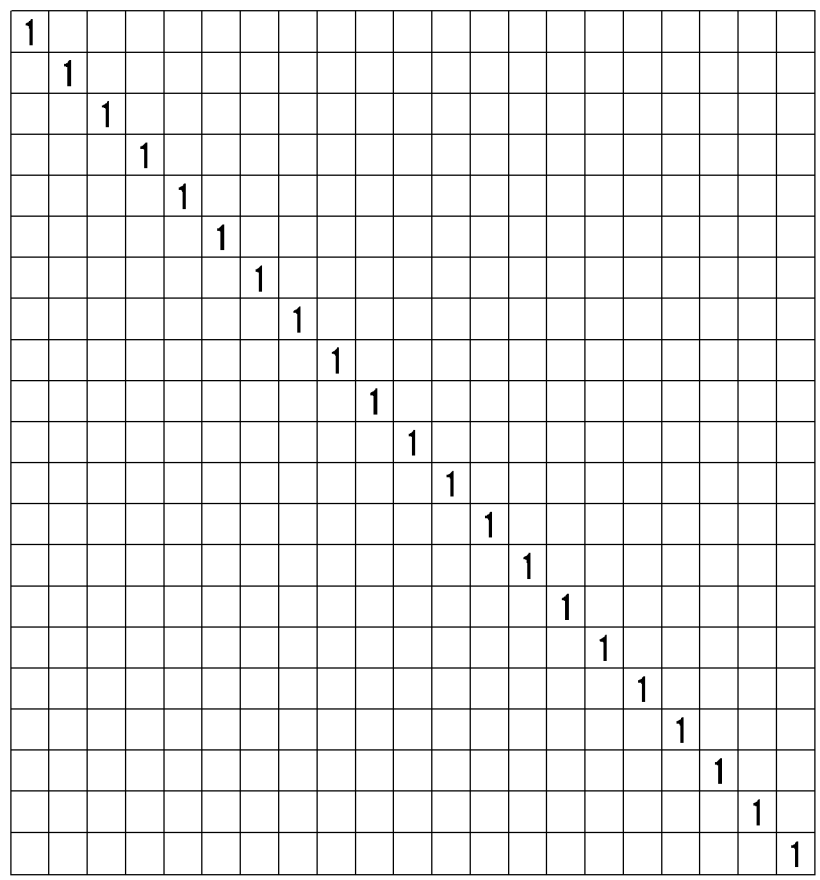
Figure 22A:
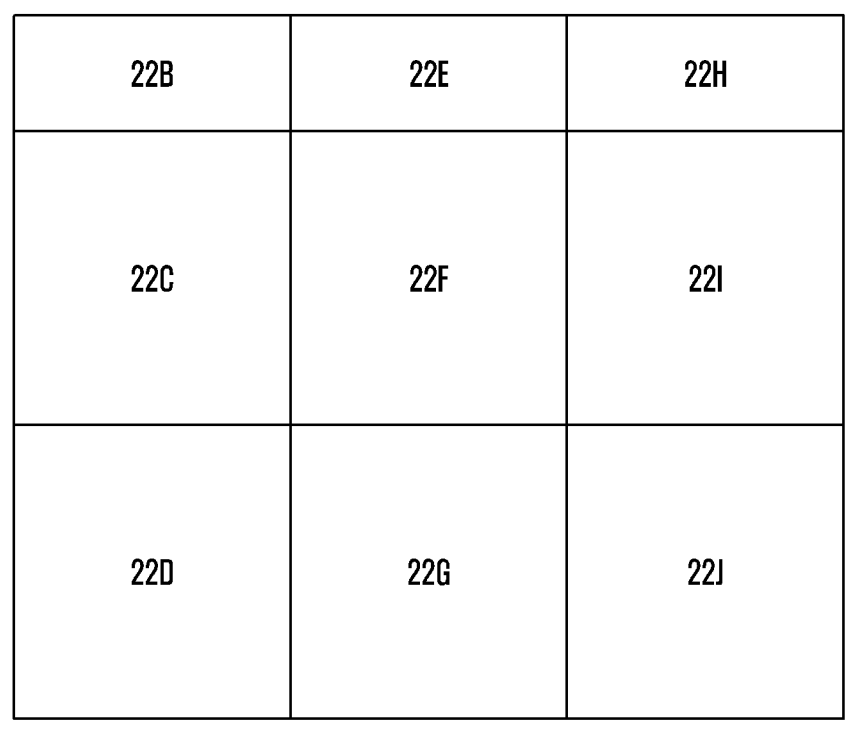
Figure 23A:
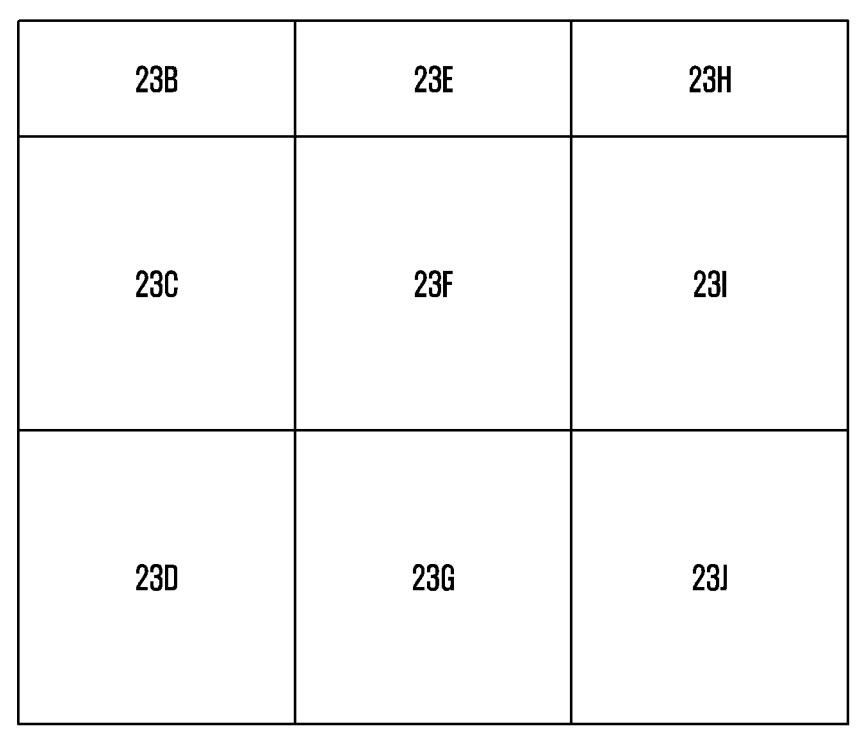

Referring to FIGS. 21A to 21J, another embodiment of the base matrix and the exponential matrix (or LDPC sequence) of the LDPC code designed based on the mathematical expressions 29 to 32 is illustrated in FIGS. 21A, 22A, and 23A. This embodiment proposes a method for applying a plurality of exponential matrices or LDPC sequences based on the base matrix of FIG. 21A is proposed. In other words, the base matrix is as illustrated in FIG. 21A, an exponential matrix or a sequence of the LDPC code is obtained on the base matrix, and a variable length LDPC encoding and decoding is performed by applying lifting to match the block size included in each block size group from the exponential matrix or sequence. In other words, base matrices of the parity check matrix corresponding to the exponential matrix or sequence of a plurality of different LDPC codes are equal to each other. According to this method, entries or numerals constituting the exponential matrix of the LDPC code or LDPC sequence may have different values, but positions of the corresponding entries or numerals accurately coincide with each other. As described above, the exponential matrices or sequences of the LDPC code mean indexes of circulant permutation matrices, that is, a kind of circulant permutation values for the bits, and by configuring the positions of the entries or numerals to be equal to each other, the positions of the bits corresponding to the corresponding circulant permutation matrix can be easily grasped.

FIGS. 22A to 22J are diagrams of other exponential matrices according to various embodiments of the disclosure.

Figure 22D:
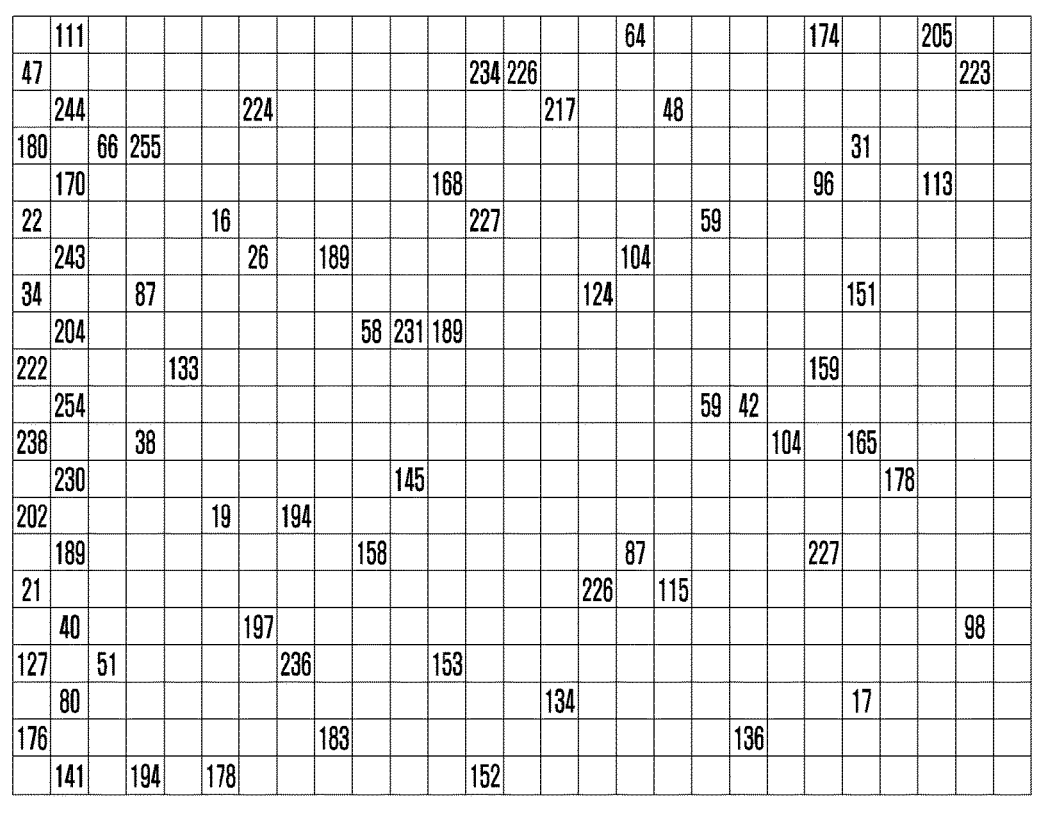

Referring to FIGS. 22A to 22J, embodiments of exponential matrices corresponding to the parity check matrix of the QC LDPC code designed based on the mathematical expressions 29 to 32 are successively illustrated in FIGS. 22A and 23A (it is to be noted that in the exponential matrix of FIGS. 22A and 23A, empty blocks are parts corresponding to zero matrices having the size of Z×Z. According to circumstances, in the exponential matrix of FIGS. 22A and 23A, empty blocks can be expressed as specified values, such as −1 and the like). The exponential matrices of the LDPC code illustrated in FIGS. 22A and 23A are featured to have the same base matrix as that of FIG. 21A.

FIGS. 22A and 23A illustrate LDPC exponential matrices having a size of 46×68, and respectively correspond to fifth and sixth block size groups expressed in the mathematical expressions 29 and 30. Further, FIGS. 22B to 22J are enlarged diagrams illustrating respective parts of the exponential matrix of FIG. 22A. FIG. 22A corresponds to a matrix in the drawing corresponding to drawing reference numerals described on the respective parts. Accordingly, one base matrix can be configured through combination of the parts in FIGS. 22B to 22J.

FIGS. 23A to 23J are diagrams of other exponential matrices according to various embodiments of the disclosure.

Figure 23D:
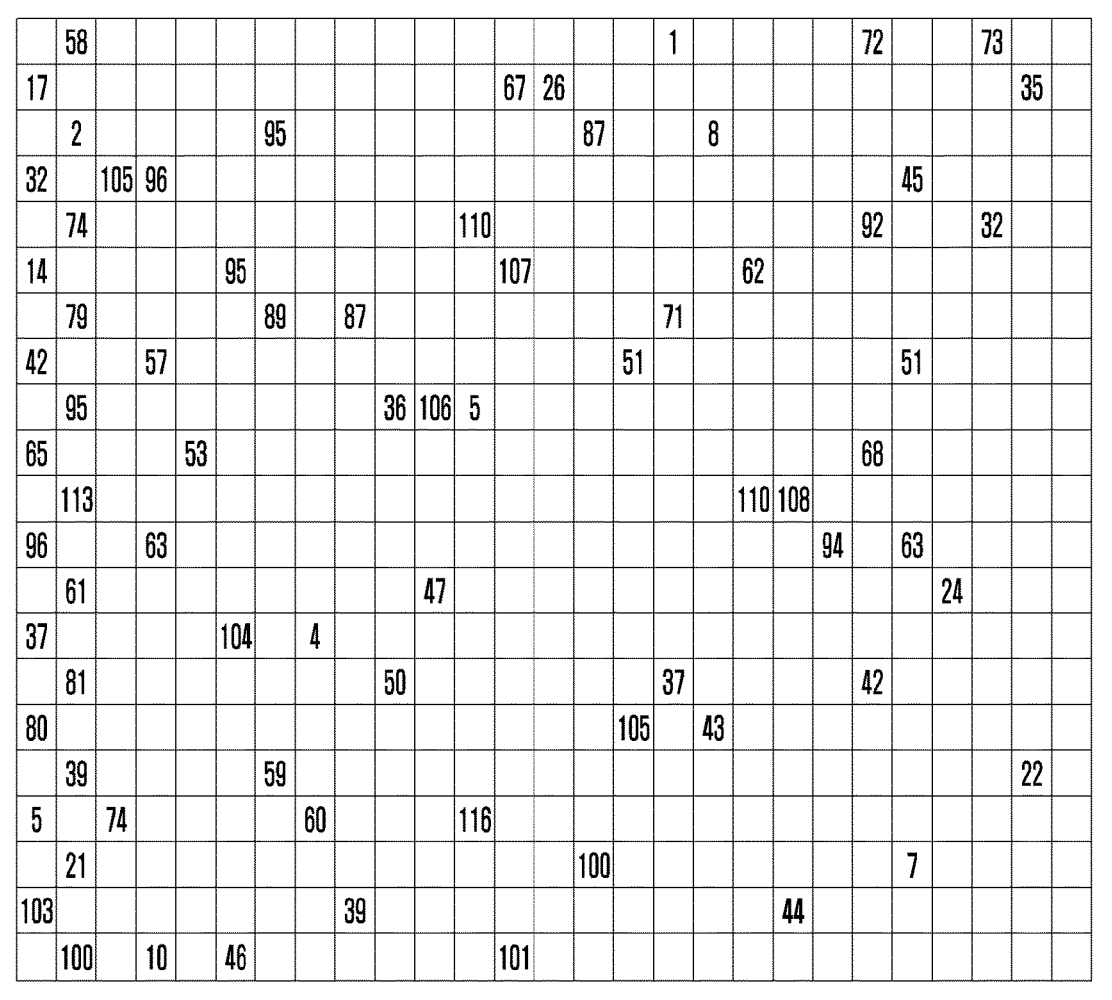

Referring to FIGS. 23A to 23J, FIG. 23A is an enlarged diagram illustrating respective parts after dividing the respective exponential matrices. For reference, FIG. 23E is equal to FIG. 22E, FIG. 23H is equal to FIG. 22H, and FIG. 23F is equal to FIG. 22F. Further, FIG. 23I is equal to FIG. 22I, FIG. 23G is equal to FIG. 22, and FIG. 23J is equal to FIG. 22J.

The exponential matrices illustrated in FIGS. 22A and 23A correspond to the LDPC code designed based on the block size groups defined in the mathematical expression 29 or 30. However, in accordance with the system requirements, it is not necessary to support all block sizes included in the block size group, and according to circumstances, other values may be added in addition to the block size expressed in the mathematical expression 29 or 30.

For example, the exponential matrices illustrated in FIGS. 22A and 23A can support not only the block size corresponding to the block size group (set) defined in the mathematical expression 29 or 30 but also the block size corresponding to the subset of the respective groups (sets), and according to circumstances, other values can be supported.

Further, depending on the system, the exponential matrices illustrated in FIGS. 22A and 23A may be used as they are, or only a part thereof may be used. For example, by making the base matrix of FIGS. 22A and 23A or the remaining partial matrix excluding 21 lower rows and 21 rear columns correspond to FIGS. 17B, 17C, 17D, and 17E and making another matrix or LDPC sequence correspond to FIGS. 17F, 17G, 17H, 17I, and 17J, the LDPC encoding and decoding apparatus and method may be used through the base matrix in a similar form to that of FIG. 17 or the exponential matrix.

In general, the LDPC encoding and decoding may be performed by applying the partial matrix configured by properly selecting rows and columns from the base matrix of FIG. 21A as a new base matrix or exponential matrix. In the same manner, the partial matrices configured by properly selecting row blocks and column blocks from the exponential matrices of FIGS. 22A and 23A may be applied as new exponential matrix to the LDPC encoding and decoding apparatus and method.

For reference, the base matrix for the LDPC encoding and decoding expressed as a sequence in the mathematical expression 26 may be expressed as in the mathematical expression 33 or 34.

The mathematical expression 33 means an LDPC sequence that can be used if it is assumed that the positions of entries or their index values are omitted but the corresponding rule is known in case where the $27^{th}$ to last column blocks, such as the base matrix, have a diagonal structure. As an example, the mathematical expression 33 shows an example in which the location of entry 1 is omitted in the $27^{th}$ to last column blocks.

0 1 2 3 5 6 9 10 11 12 13 15 16 18 19 20 21 22 23

0 2 3 4 5 7 8 9 11 12 14 15 16 17 19 21 22 23 24

0 1 2 4 5 6 7 8 9 10 13 14 15 17 18 19 20 24 25

0 1 3 4 6 7 8 10 11 12 13 14 16 17 18 20 21 22 25

0 1

0 1 3 12 16 21 22

0 6 10 11 13 17 18 20

0 1 4 7 8 14

0 1 3 12 16 19 21 22 24

0 1 10 11 13 17 18 20

1 2 4 7 8 14

0 1 12 16 21 22 23

0 1 10 11 13 18

0 3 7 20 23

0 12 15 16 17 21

0 1 10 13 18 25

1 3 11 20 22

0 14 16 17 21

1 12 13 18 19

0 1 7 8 10

0 3 9 11 22

1 5 16 20 21

0 12 13 17

1 2 10 18

0 3 4 11 22

1 6 7 14

0 2 4 15

1 6 8

0 4 19 21

1 14 18 25

0 10 13 24

1 7 22 25

0 12 14 24

1 2 11 21

0 7 15 17

1 6 12 22

0 14 15 18

1 13 23

0 9 10 12

1 3 7 19

0 8 17

1 3 9 18

0 4 24

1 16 18 25

0 7 9 22

1 6 10

Mathematical expression 33

Mathematical expression 34 indicates a position of entry 1 for the base matrix expressed in the mathematical expression 26. For convenience, the mathematical expression 34 is an example in which a position of entry 1 is omitted in the $27^{th}$ to last column blocks, and from the $28^{th}$ column, one sequence may be added and expressed in the order of 4, 5, 6, . . . .

0 1 2 3 4 5 6 7 8 9 11 12 13 14 15 17 19 20 22 24 26 28 30 32 34 36 38 40 42 44

0 2 3 4 5 7 8 9 10 11 12 15 16 18 19 21 23 25 27 29 31 33 35 37 39 41 43 45

0 1 2 10 23 26 33

0 1 3 5 8 13 16 20 24 39 41

1 2 3 7 10 24 26 28 42

0 1 2 21

0 2 3 6 25 27 35 45

1 2 3 7 10 13 19 25 31 34 39 44

1 2 3 7 10 19 27 40

0 1 2 20 38 41 44

0 2 3 6 9 12 15 19 23 30 38 45

0 1 3 6 9 12 16 20 24 33

0 1 3 5 8 11 14 18 22 32 35 38

0 2 3 6 9 12 15 18 22 30 37

1 2 3 7 10 17 25 29 32 36

0 1 2 14 26 34 36

0 1 3 5 8 11 14 17 21 43

1 2 3 6 9 14 17 22 34 40

0 2 3 6 9 12 15 18 23 29 36 41 43

0 1 2 8 18 28 39

0 2 3 6 9 13 16 21

0 1 3 5 8 11 14 17 21 28 33

0 1 3 5 8 11 16 20 24 31 35 44

0 1 11 13 37

1 2 8 30 32 42

2 3 15 29 31 43

Mathematical expression 34

FIGS. 24A to 24J are diagrams of other elementary matrices according to various embodiments of the disclosure.

Figure 24A:
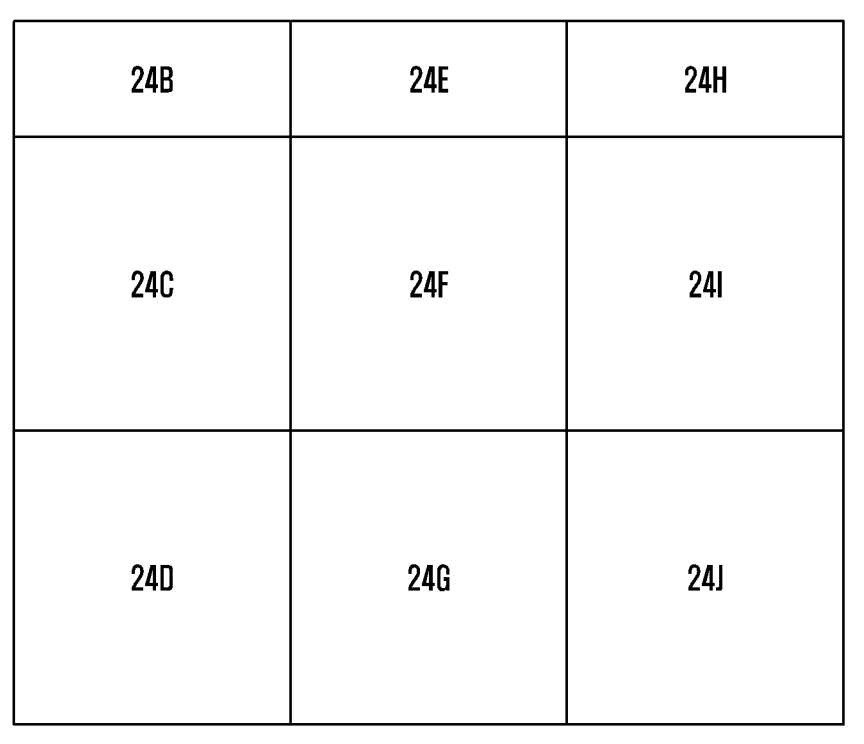

Referring to FIGS. 24A to 24J, the base matrix for the LDPC encoding and decoding expressed as a sequence in the mathematical expression 26 may be illustrated as in FIG. 24A. The matrix of FIG. 24 illustrates the base matrix having a size of 46×68. Further, FIGS. 24B to 24J are enlarged diagrams illustrating respective parts of the exponential matrix of FIG. 24. FIG. 24A corresponds to a matrix in the drawing corresponding to drawing reference numerals described on the respective parts are combined. Accordingly, one base matrix can be configured through combination of the parts in FIGS. 24B to 24J. For reference, FIGS. 24E, 24H, 24F, 24I, 24G, and 24J are equal to FIGS. 21E, 21H, 21F, 21I, 21G, and 21J, and thus they are omitted in FIG. 24A.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An apparatus for channel encoding in a communication or broadcasting system, the apparatus comprising:
a transceiver; and
at least one processor coupled with the transceiver and configured to:
identify a block size, and
perform an encoding procedure based on a first matrix corresponding to the block size,
wherein the first matrix is identified based on a base matrix, and
wherein a column index indicating a position of corresponds to a non-zero element in each row of the base matrix, and the base matrix has following values as column indices,
{0 1 2 3 5 6 9 10 11 12 13 15 16 18 19 20 21 22 23}
{0 2 3 4 5 7 8 9 11 12 14 15 16 17 19 21 22 23 24}
{0 1 2 4 5 6 7 8 9 10 13 14 15 17 18 19 20 24 25}
{0 1 3 4 6 7 8 10 11 12 13 14 16 17 18 20 21 22 25}
{0 1 26}
{0 1 3 12 16 21 22 27}
{0 6 10 11 13 17 18 20 28}
{0 1 4 7 8 14 29}
{0 1 3 12 16 19 21 22 24 30}
{0 1 10 11 13 17 18 20 31}
{1 2 4 7 8 14 32}
{0 1 12 16 21 22 23 33}
{0 1 10 11 13 18 34}
{0 3 7 20 23 35}
{0 12 15 16 17 21 36}
{0 1 10 13 18 25 37}
{1 3 11 20 22 38}
{0 14 16 17 21 39}
{1 12 13 18 19 40}
{0 1 7 8 10 41}
{0 3 9 11 22 42}
{1 5 16 20 21 43}
{0 12 13 17 44}
{1 2 10 18 45}
{0 3 4 11 22 46}.

2. The apparatus of claim 1, wherein the block size is selected from based on following block size groups below:
Z1={3, 6, 12, 24, 48, 96, 192, 384},
Z2={11, 22, 44, 88, 176, 352},
Z3={5, 10, 20, 40, 80, 160, 320},
Z4={9, 18, 36, 72, 144, 288},
Z5={2, 4, 8, 16, 32, 64, 128, 256},
Z6={15, 30, 60, 120, 240},
Z7={7, 14, 28, 56, 112, 224}, and
Z8={13, 26, 52, 104, 208}.

3. The apparatus of claim 1, wherein the first matrix is identified based on a value of 1 in the base matrix being replaced by a second matrix.

4. The apparatus of claim 3, wherein the second matrix is identified by circularly shifting an identity matrix based on a value identified by applying a modulo operation of the block size to an element of a predetermined matrix.

5. An apparatus for channel decoding in a communication or broadcasting system, the apparatus comprising:
a transceiver; and
at least one processor coupled with the transceiver and configured to:
identify a block size, and
perform a decoding procedure based on a first matrix corresponding to the block size,
wherein the first matrix is identified based on a base matrix and a plurality of second matrices, and
wherein a column index of corresponds to a non-zero element in each row of the information base matrix, and the base matrix has following values as column indices,
{0 1 2 3 5 6 9 10 11 12 13 15 16 18 19 20 21 22 23}
{0 2 3 4 5 7 8 9 11 12 14 15 16 17 19 21 22 23 24}
{0 1 2 4 5 6 7 8 9 10 13 14 15 17 18 19 20 24 25}
{0 1 3 4 6 7 8 10 11 12 13 14 16 17 18 20 21 22 25}
{10 1 26}
{0 1 3 12 16 21 22 27}
{0 6 10 11 13 17 18 20 28}
{0 1 4 7 8 14 29}
{0 1 3 12 16 19 21 22 24 30}
{0 1 10 11 13 17 18 20 31}
{1 2 4 7 8 14 32}
{0 1 12 16 21 22 23 33}
{0 1 10 11 13 18 34}
{0 3 7 20 23 35}
{0 12 15 16 17 21 36}
{0 1 10 13 18 25 37}
{1 3 11 20 22 38}
{0 14 16 17 21 39}
{1 12 13 18 19 40}
{0 1 7 8 10 41}
{0 3 9 11 22 42}
{1 5 16 20 21 43}
{0 12 13 17 44}
{1 2 10 18 45}
{0 3 4 11 22 46}.

6. The apparatus of claim 5, wherein the block size is selected based on following block size groups:
Z1={3, 6, 12, 24, 48, 96, 192, 384},
Z2={11, 22, 44, 88, 176, 352},
Z3={5, 10, 20, 40, 80, 160, 320},
Z4={9, 18, 36, 72, 144, 288},
Z5={2, 4, 8, 16, 32, 64, 128, 256},
Z6={15, 30, 60, 120, 240},
Z7={7, 14, 28, 56, 112, 224}, and
Z8={13, 26, 52, 104, 208}.

7. The apparatus of claim 5, wherein the first matrix is identified based on a value of 1 in the base matrix being replaced by a second matrix.

8. The apparatus of claim 7, wherein the second matrix is identified by circularly shifting an identity matrix based on a value identified by applying a modulo operation of the block size to an element of a predetermined matrix.

* * * * *